(12) United States Patent
Nakamura et al.

(10) Patent No.: US 9,209,276 B2
(45) Date of Patent: Dec. 8, 2015

(54) TRENCH GATE TYPE SEMICONDUCTOR DEVICE AND METHOD OF PRODUCING THE SAME

(71) Applicant: FUJI ELECTRIC CO., LTD., Kawasaki-shi (JP)

(72) Inventors: Shun-ichi Nakamura, Matsumoto (JP); Yasuyuki Kawada, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/165,120

(22) Filed: Jan. 27, 2014

(65) Prior Publication Data
US 2014/0141585 A1 May 22, 2014

Related U.S. Application Data

(62) Division of application No. 12/397,031, filed on Mar. 3, 2009, now abandoned.

(30) Foreign Application Priority Data

Mar. 3, 2008 (JP) .................. 2008-051521
May 15, 2008 (JP) .................. 2008-127907

(51) Int. Cl.
*H01L 29/66* (2006.01)
*H01L 29/78* (2006.01)
(Continued)

(52) U.S. Cl.
CPC ........ *H01L 29/66666* (2013.01); *H01L 21/265* (2013.01); *H01L 21/28008* (2013.01);
(Continued)

(58) Field of Classification Search
CPC ................. H01L 29/66666; H01L 21/308
See application file for complete search history.

(56) References Cited

U.S. PATENT DOCUMENTS

| 5,614,749 A | 3/1997 | Ueno |
| 6,034,409 A | 3/2000 | Sakai et al. |

(Continued)

FOREIGN PATENT DOCUMENTS

| JP | 3-184334 A | 8/1991 |
| JP | 4-196542 A | 7/1992 |

(Continued)

OTHER PUBLICATIONS

Notification of Reasons for Refusal for corresponding JP 2009-049152, mail date Oct. 29, 2013.

(Continued)

*Primary Examiner* — Matthew Reames
(74) *Attorney, Agent, or Firm* — Rossi, Kimms & McDowell LLP

(57) ABSTRACT

A method of producing a trench gate type MOSFET is provided in which each intersection trench is formed as a two-stage trench structure. A gate trench is backfilled with a mask material and the mask material is then patterned to form a mask used for forming each intersection trench. The intersection trench intersecting the gate trench is provided so as to be deeper than the gate trench. A Schottky electrode is provided in the bottom of each intersection trench 10p. In this manner, there is provided a trench gate type semiconductor device and a method of producing the same, in which: the cell pitch can be reduced even when a wide band gap semiconductor is used as a main semiconductor substrate; good ohmic contacts can be obtained; and an excessive electric field is prevented from being applied to an insulating film in the bottom of each trench.

17 Claims, 47 Drawing Sheets

(51) Int. Cl.

| | | |
|---|---|---|
| *H01L 21/265* | (2006.01) | |
| *H01L 21/28* | (2006.01) | |
| *H01L 21/308* | (2006.01) | |
| H01L 29/06 | (2006.01) | |
| H01L 29/08 | (2006.01) | |
| H01L 29/16 | (2006.01) | |
| H01L 29/417 | (2006.01) | |
| H01L 29/423 | (2006.01) | |
| H01L 29/47 | (2006.01) | |

(52) U.S. Cl.
CPC ........ *H01L21/308* (2013.01); *H01L 29/66068* (2013.01); *H01L 29/7806* (2013.01); *H01L 29/7813* (2013.01); *H01L 29/0623* (2013.01); *H01L 29/0696* (2013.01); *H01L 29/086* (2013.01); *H01L 29/0878* (2013.01); *H01L 29/1608* (2013.01); *H01L 29/41766* (2013.01); *H01L 29/4236* (2013.01); *H01L 29/42368* (2013.01); *H01L 29/47* (2013.01)

(56) References Cited

U.S. PATENT DOCUMENTS

| | | |
|---|---|---|
| 6,373,076 B1 | 4/2002 | Alok et al. |
| 6,518,129 B2 | 2/2003 | Hueting et al. |
| 2001/0021567 A1 | 9/2001 | Takahashi |
| 2002/0140026 A1 | 10/2002 | Ishikawa et al. |
| 2003/0062569 A1 | 4/2003 | Letavic |
| 2005/0161732 A1 | 7/2005 | Mizukami et al. |
| 2005/0218472 A1 | 10/2005 | Okada et al. |
| 2007/0057262 A1 | 3/2007 | Nakamura et al. |
| 2007/0187695 A1 | 8/2007 | Nakamura et al. |

FOREIGN PATENT DOCUMENTS

| | | |
|---|---|---|
| JP | 4-206838 A | 7/1992 |
| JP | 4-209541 A | 7/1992 |
| JP | 5-259269 A | 10/1993 |
| JP | 8-204179 A | 8/1996 |
| JP | 09-266309 A | 10/1997 |
| JP | 10256573 A | 9/1998 |
| JP | 11-74339 A | 3/1999 |
| JP | 11-297989 A | 10/1999 |
| JP | 2000-082810 A | 3/2000 |
| JP | 2001-257259 A | 9/2001 |
| JP | 2002299621 A | 10/2002 |
| JP | 2002314081 A | 10/2002 |
| JP | 2003516631 A | 5/2003 |
| JP | 2005-505138 A | 2/2005 |
| JP | 2005108926 A | 4/2005 |
| JP | 2005236267 A | 9/2005 |
| JP | 2005285913 A | 10/2005 |
| JP | 2006352028 A | 12/2006 |
| JP | 2007-27491 A | 2/2007 |
| JP | 2007080971 A | 3/2007 |
| JP | 2007-194283 A | 8/2007 |
| WO | 03030267 A2 | 4/2003 |
| WO | 2007/010732 A1 | 1/2007 |

OTHER PUBLICATIONS

Japanese Office Action cited in Japanese counterpart appln. No. JP2014000346, dated Dec. 16, 2014. English translation provided.
Japanese Office Action issued in Japanese counterpart application no. JP2014-172749, dated Sep. 8, 2015. English translation provided.

(a)  (b)

TRENCH GATE TYPE SEMICONDUCTOR DEVICE AND METHOD OF PRODUCING THE SAME

BACKGROUND

The present invention relates to a semiconductor device having a trench gate structure and a method of producing the same. More specifically, the invention relates to a trench gate type semiconductor device using silicon carbide semiconductor (hereinafter abbreviated to SiC) or Group III nitride semiconductor such as AlGaN semiconductor and a method of producing the same.

When a high withstand voltage power device is produced from silicon carbide semiconductor (hereinafter referred to as SiC) or Group III nitride semiconductor (hereinafter referred to as AlGaN or the like), there is a possibility that on-state-resistance will be remarkably reduced. On-state-resistance of 5 mΩcm$^2$ or lower is obtained by a MISFET of a 1-1.2 kV withstand voltage class using SiC. The on-state-resistance is not higher than that of an IGBT made of a silicon semiconductor (hereinafter referred to as Si) of the same withstand voltage class. There is a possibility that the majority of IGBTs made of Si as inverter parts will be replaced if cost development and performance improvement will advance in the future.

The reason why on-state-resistance can be remarkably reduced by use of SiC or AlGaN or the like is as follows. Because SiC or AlGaN or the like has a higher dielectric breakdown electric field than Si, a thinner voltage withstanding layer can be produced to obtain the same withstand voltage and resistance can be reduced by two digits or more compared with Si when the doping concentration of the voltage withstanding layer is heightened. However, use of SiC or AlGaN or the like has a bad influence on channel mobility and (gate) threshold voltage because the doping quantity or impurity concentration of a body region in a MISFET or IGBT using SiC or AlGaN or the like is high compared with Si. If the doping quantity or impurity concentration of the body region is too high, the threshold voltage becomes unnecessarily high and channel mobility is reduced remarkably, undesirably. In this respect, there is a restriction that the impurity concentration of the body region cannot be made so higher than that in the case of Si. As a result, the difference in impurity concentration between the body region and the voltage withstanding layer is small, so that the body region has characteristic that a depletion region is apt to extend.

As described above, in a MOS type semiconductor device using SiC or AlGaN or the like, the resistance of the voltage withstanding layer is reduced. As a result, the resistance of any other portion than the voltage withstanding layer, that is, channel resistance or so-called JFET resistance in a so-called DMOS type structure becomes relatively large, so that the channel resistance or JFET resistance forms a considerable resistance component. A MOS type semiconductor device having a so-called trench gate structure as a structure for eliminating the JFET resistance is known.

On the other hand, a channel length reducing method is known as a method for reducing the channel resistance. When the trench gate structure is used, it is however necessary to reduce the thickness of the body region in order to reduce the channel length. If the thickness of the body region is reduced, a punch-through state that the body region is entirely depleted is apt to be caused by the voltage applied across the device in the off-state so that the punch-through state has a bad influence on high withstand voltage characteristic inferred from the high dielectric breakdown electric field of SiC or AlGaN or the like.

Another method for reducing the channel resistance is to increase channel density per unit area. Generally, in a power device, an active region where a main current flows is formed as a set of unit cells disposed in the active region. Because a channel is always included in each unit cell, channel density per unit area can be increased when one unit cell is reduced, that is, when the cycle width (cell pitch) of the unit cells is reduced. The trench gate structure is a structure which is easy to increase channel density compared with a conventional planer gate structure.

Generally, a photolithography process is essential to production of a semiconductor device. When photolithography steps are performed in a producing process, there is required a process of mask-aligning a current-step photo pattern with a previous-step photo pattern. Generally, reduction in mask alignment accuracy becomes considerable compared with resolution as the number of mask alignment processes increases. For example, some commercially available g-line stepper produces a mask alignment error of 0.4-0.8 μm per cycle at the maximum for a resolution limit of 1 μm. The maximum of the mask alignment error varies in the aforementioned range because it is practically necessary to accept a mask alignment error up to about 0.8 μm in consideration of production efficiency though the limit of the stepper is 0.4 μm. If the number of photolithography steps is one (with no mask alignment process), the cell pitch can be reduced, for example, to 2 μm at the minimum. However, if the number of photolithography steps is two (with one mask alignment process), the cell pitch needs, for example, 3.6-5.2 μm at the minimum. Accordingly, the minimum cell pitch cannot but increase as the number of mask alignment processes increases.

On the other hand, a high-resolution (high-performance) stepper designed for Si, GaAs, etc. or a device like the stepper (hereinafter referred to as stepper or the like) has a built-in mask alignment mechanism for reducing the mask alignment error ordinarily. However, such a high-performance stepper or the like often exhibits a small focal depth because a short-wavelength light source is used. On the other hand, large and uneven warps are apt to occur in a wafer because a special bulk growth method is used for SiC or because AlGaN or the like is mainly formed on a sapphire, SiC or Si substrate by epitaxial growth. Accordingly, when the high-performance stepper or the like exhibits a small focal depth as described above, there often occurs a situation that it is impossible to perform exposure with focusing on the whole surface appropriately in one shot. As a result, a stepper having a large focal depth, that is, capable of performing mask alignment regardless of more or less warps has to be used in the meantime until the warps of the wafer will be improved with the advance of another technique in the future. Accordingly, because the aforementioned high-resolution stepper or the like cannot be used for reducing the cell pitch in SiC or AlGaN or the like, it is desired that a producing process small in the number of mask alignment processes is used for suppressing reduction of accuracy caused by accumulation of alignment errors.

When a method of doping a semiconductor such as an Si semiconductor with an impurity by a thermal diffusion method can be used as a general mass-production method, there has been already practically used a method of substantially reducing the number of mask alignment processes by self-aligning a unit cell structure, for example, as represented by an Si trench gate type MOSFET according to the related art and a method of producing the same shown in FIG. 32.

As a specific example of the cell pitch and trench width in use of the Si semiconductor which will be compared with SiC or AlGaN or the like, the trench width in use of the g-line stepper is, for example, 1 μm (equal to the resolution limit) but the cell pitch is, for example, 4 μm because of the restriction in the producing process. The restriction in the producing process will be described in detail in the following description of a Si trench gate type MOSFET and a method of producing the same.

FIG. 33 is a sectional view of important part of a semiconductor wafer. As shown in FIG. 33, a Si wafer is prepared in such a manner that n-type epitaxially grown layers 3 and 5 with a predetermined doping quantity and a predetermined thickness is formed on one principal surface (referred to as front surface) of an n-type Si semiconductor substrate 1. Hereinafter, the term "semiconductor substrate", "Si substrate" or "SiC substrate" or especially the term "substrate" followed by the reference numeral 1 such as "substrate 1" or "SiC substrate 1" indicates a bulk substrate not input to any process yet without limitation in passing through the process, whereas the term "wafer", "semiconductor wafer", "Si wafer" or "SiC wafer" indicates a laminated substrate after passing through a process of depositing functional layers or regions on the bulk substrate. Then, a p-type body region 5 is formed by thermal diffusion of boron from a surface of the epitaxially grown layer into an active region portion where a main current flows. The epitaxially grown layer including the body region 5 formed in its surface further includes a portion (other than the body region 5) which remains under the body region and which is formed as a voltage withstanding layer 3. Then, an oxide film with a predetermined thickness is formed on the whole surface of the wafer and patterned appropriately to form mask oxide films 101. On this occasion, the width of each mask oxide film 101 and the distance between adjacent ones of the mask oxide films 101 can be desirably reduced to the resolution limit of the stepper used. For example, each of the width and distance is 1 μm. Incidentally, in this example, the width of each mask oxide film 101 is set at a slightly large value, for example, of 3 μm for the sake of convenience of thermal diffusion which will be performed. The sum 4 μm of the distance 1 μm and the width 3 μm of each mask oxide film is the cell pitch of unit cells which will be produced in the following description. Then, phosphorus is ion-implanted from the wafer surface with the mask oxide films 101 formed at intervals of the distance is performed and heat-treatment is performed to form source regions 6 (see FIG. 34). On this occasion, ion-implanted phosphorus is thermally diffused, so that the source regions 6 creep under the mask oxide films 101 as shown in FIG. 34. The width of each creeping portion is, for example, 1 μm. Although the allowable depth of ion implantation of phosphorus by use of a general ion implantation device is no more than about 0.8 μm, thermal diffusion permits the depth of each source region 6 (the depth of each pn junction) to increase, for example, to about 2 μm.

Then, the Si wafer is anisotropically etched from the front surface by use of the same mask oxide films 101, so that trenches 10 so deep as to reach the voltage withstanding layer 3 are formed as shown in FIG. 35 which is a sectional view of important part of the Si wafer. Then, as shown in FIG. 36 which is a sectional view of important part of the Si wafer, a gate insulating film 11 is formed on an inner wall surface of each trench 10. After a film of highly doped polycrystalline silicon (with a high doping quantity or a high impurity concentration) is then formed on the whole front surface of the wafer to protect gate pad portions (not shown), the film is etched back to embed a gate electrode 12 in the inside of each trench 10 up to a predetermined height. As a result, the gate electrode 12 in the inside of each trench 10 faces the corresponding source region 6, the corresponding body region 5 and the voltage withstanding layer 3 through the gate insulating film 11.

An appropriately doped $SiO_2$ film is formed on the whole front surface of the wafer and etched back appropriately in the same manner as described above to thereby embed an interlayer insulating film 21 on the gate electrode 12 in the inside of each trench 10. As shown in FIG. 36, an upper end of each gate electrode 12 has to be located between lower and upper ends of the corresponding source region 6. Because each interlayer insulating film 21 is formed by a deposition method, the withstand voltage of the interlayer insulating film 21 is lower than that of a thermal oxide film. Accordingly, the interlayer insulating film 21 has to be thick in a certain degree in order to obtain a required gate withstand voltage. A production margin (dimensional margin) at etching back is also required. This production margin is given by the thickness of each source region 6 in the same manner as in each gate electrode 12. Under such circumstances, a thickness of about 2 μm as described above is therefore required as the thickness of each source region 6.

Finally, after unnecessary deposits or the like are removed from the front and rear surfaces of the wafer respectively, predetermined source electrodes 23, drain electrodes 22 and gate pad electrodes (not shown) are formed on the front and rear surfaces of the wafer respectively. Thus, the Si trench gate type MOSFET shown in FIG. 32 is completed.

Importance in the above description of the conventional Si trench gate type MOSFET and the method of producing the same with reference to FIGS. 32 to 36 lies in that the number of photolithography processes required for forming unit cell portions is only one for patterning the mask oxide films 101. In the step of etching back the polysilicon layer or the $SiO_2$ film, a photolithography process is required for forming the gate pads or the like. However, since the unit cell portions are self-aligned without necessity of any alignment pattern, the cell pitch value can be decided regardless of pattern alignment error. As described above, since self-alignment of the unit cell portions means reduction in the number of photolithography processes required for forming the unit cell portions, it also means suppression of pattern alignment error. In this manner, since Si can be doped with an impurity by combination of an ion implantation method and a thermal diffusion method, the unit cell portions can be self-aligned so that a producing method can be provided without necessity of consideration of pattern alignment error and the cell pitch can be reduced easily.

However, in a wide band gap semiconductor such as SiC or AlGaN, the diffusion coefficient of an impurity serving as a donor or acceptor is so remarkably small that the thermal diffusion method is unrealistic. Since it is generally difficult to use the thermal diffusion method in the production line, it is impossible to self-align unit cells by the same producing method as in Si. That is, in SiC or AlGaN or the like, it is necessary to form a predetermined impurity profile not by the thermal diffusion method but by the ion implantation method for selective or local impurity doping. However, in the ion implantation method, since the impurity is little diffused in a transverse direction, one and the same mask (i.e. without pattern alignment) used in the Si wafer as shown in FIGS. 34 and 35 cannot be used for self-aligning the source regions 6 and the trenches 10. Moreover, when a general ion implantation device is used for performing ion implantation, the depth of ion implantation into each source region is 1 μm at most. For this reason, the production margin at etching back the gate electrodes 12 and the interlayer insulating films 21 is often insufficient. Accordingly, in the related art, for example, an SiC trench gate type MOSFET cannot but depend on the following unit cell structure and the method of producing the same.

FIG. 37 is a sectional view showing an important part of each unit cell portion in the SiC trench gate type MOSFET according to the related art. Since the main structure is the same as that of the Si trench gate type MOSFET shown in FIG. 32, the same constituent parts are referred to by the same reference numerals for the sake of omission of duplicate description. In FIG. 37, a characteristic point different from FIG. 32 lies in that the interlayer insulating films 21 protrude from the trenches 10. Contact holes 20 provided in the interlayer insulating films 21 are filled with a source electrode 23 so that the source electrode 23 is in ohmic contact with the front surface of the SiC wafer. In FIG. 37, highly doped body contact regions 7 of a second conductivity type are provided as regions corresponding to the surface layer of portions where the body regions 5 are exposed from the front surface of the Si wafer in FIG. 32. In FIG. 37, a region corresponding to each source region 6 in FIG. 32 is separated into a source contact region 6a of the first conductivity type and a source extension region 6b of the first conductivity type. The source contact region 6a is highly doped and formed as a surface layer of the source region 6. The source extension region 6b is formed as a lower layer of the source region 6. A surface of the body contact region 7 and a surface of the source contact region 6a are in ohmic contact with the source electrode 23 as a common electrode in the aforementioned manner.

Since FIGS. 37 and 32 are not accurate drawings in terms of dimensions, the trench width and the cell pitch in the SiC trench gate type MOSFET in FIG. 37 seem to be equal to those in FIG. 32. However, when the same g-line stepper is used for practical production, the cell pitch in SiC has to be at least 5 μm which is 25% larger than the cell pitch 4 μm in Si in FIG. 32. In consideration of production efficiency, the pitch of the trenches 10 has to be designed to be widened to 11 μm which is 175% larger than the cell pitch 4 μm in Si in FIG. 32.

The method of producing the SiC trench gate type MOSFET according to the related art shown in FIG. 37 will be described below in due order. FIG. 38 is a sectional view of important part of the SiC wafer. As shown in FIG. 38, an n-type voltage withstanding layer 3 with a predetermined doping concentration and a predetermined thickness and a p-type body layer 5 with a predetermined doping concentration and a predetermined thickness are formed successively on the whole are of one principal surface (referred to as front surface) of an n-type SiC substrate 1 by epitaxial growth.

Then, markers (not shown) for alignment in a photolithography process are formed in the same manner as the process of producing Si or the like. Then, for example, an $SiO_2$ film is deposited and patterned to have predetermined opening portions by the same technique as Si to thereby form a mask (not shown) for performing selective ion implantation for body contact regions with a surface impurity concentration capable of obtaining ohmic contact. This step needs a photolithography process. After the wafer is then heated, for example, to 500° C., aluminum is ion-implanted to a depth of about 0.4 μm from the front surface. The depth of ion implantation is substantially decided by acceleration energy which can be achieved stably by a general 400 keV ion implantation device using monovalent aluminum. Then, heat treatment (referred to as activation annealing) is performed at a predetermined temperature for a predetermined time in an inert gas (which may contain a small amount of $SiH_4$ or the like) to activate the ion-implanted aluminum electrically and recover implantation damage. FIG. 38 is a sectional view showing important part of the wafer in a state where activation annealing of the body contact regions 7 is completed.

Then, ion implantation and activation annealing are performed for source contact regions 6a and source extension regions 6b in the same manner as described above. For the source contact regions 6a, monovalent phosphorus ions capable of obtaining a high doping concentration sufficient to achieve ohmic contact are implanted into a depth of about 0.35 μm from the front surface. For the source extension regions 6b, for example, monovalent or divalent nitrogen ions are implanted into a depth of about 0.8 μm. Incidentally, one and the same mask can be used for the source contact regions 6a and the source extension regions 6b and activation annealing may be performed simultaneously. However, since the positional relation with the body contact regions 7 is decided by alignment in photolithography, a design has to be made appropriately to prevent the body contact regions 7 from being perfectly lost in the source contact regions 6a adjacent to the body contact regions 7 in plan view even when the maximum displacement occurs. When, for example, the aforementioned g-line stepper is used, a width of not smaller than 0.8-1.6 μm is required as the width of each body contact region 7 and it is safe that the width is not smaller than 1-2 μm in consideration of pattern conversion error. FIG. 39 is a sectional view showing important part of the wafer in a state where activation annealing of the source contact regions 6a and the source extension regions 6b is completed. Hereafter, the body layer 5 is provided as a layer under the source extension regions.

Then, as shown in FIG. 40 which is a sectional view of important part of the wafer, trenches 10 are formed in the same manner as in Si by use of an etching mask (not shown), for example, made of an $SiO_2$ film and having appropriate opening portions. A photolithography process is required for providing appropriate opening portions in the etching mask. The width of each trench 10 may be reduced as sufficiently as possible if gate insulating films 11 and gate electrodes 12 can be formed. Each trench 10 has to be disposed in the inside of the corresponding source contact region 6a in plan view except a terminal portion of the trench 10. In addition, an end portion of each contact hole 20 which will be formed later has to be located between the trench 10 and the body contact region 7 in plan view. Accordingly, when, for example, the aforementioned g-line stepper is used, the distance between an end portion of the body contact region 7 and the end portion of the contact hole 20 and the distance between the end portion of the contact hole 20 and an end portion of the trench 10 have to be not smaller than 0.8-1.6 μm and it is safe that the distances are not smaller than 1-2 μm in consideration of pattern conversion error. From the above description, the cell pitch needs to be not smaller than 5-9 μm and it is safe that the cell pitch is not smaller than 6-11 μm in consideration of pattern conversion error. FIG. 40 is a sectional view showing important part of the wafer in a state where formation of the trenches 40 is completed. After formation of the trenches 10, the body layer 5 is separated into body regions 5 by the trenches 10. In this manner, since the method of producing the SiC device according to the related art has no self-aligning process, a large cell pitch of 6-11 μm is required compared with the cell pitch of 4 μm in the method of producing the Si device which can be produced by a self-aligning process.

After a gate insulating film 11 is then formed on an inner wall surface of each trench 10, a highly doped polysilicon layer is deposited and etched back in the same manner as in Si to thereby embed a gate electrode 12 in the trench 10 up to a predetermined height. Then, an interlayer insulating film 21 is deposited on the whole surface of the wafer. However, etching back cannot be performed differently from the case of Si because the total depth of the source contact region 6a and the source extension region 6b is no more than 0.8 μm. Instead, contact holes 20 are formed in the interlayer insulating film 21 on the front surface of the wafer so that front surfaces of the body contact regions 7 and front surfaces of the source contact regions 6a are exposed. On this occasion, photolithography is required. FIG. 41 is a sectional view showing important part of the wafer in a state where formation of the contact holes 20 is completed.

Then, for example, a nickel film and a titanium film are formed successively by sputtering so that the contact holes 20 are brought into ohmic contact with the front surfaces of the body contact regions 7 and the front surfaces of the source contact regions 6a. After the front surface of the wafer is protected by a resist or the like and unnecessary deposits or the like are removed from the rear surface of the wafer, for example, a nickel film and a titanium film are formed successively on the rear surface of the wafer by sputtering. After the resist is removed from the front surface of the wafer, heat treatment is performed to obtain ohmic contact between the drain electrode 22 and SiC and ohmic contact between the source electrode 23 and SiC. Then, an aluminum film or the like is formed appropriately and patterned in the same manner as in Si to thereby form the remaining part of the source electrode 23 and gate pad electrodes not shown. The remaining part of the drain electrode 22 is formed from a film of a predetermined metal in the same manner as in Si. Thus, the Si trench gate type MOSFET according to the related art shown in FIG. 37 is completed.

Moreover, as for a MOS semiconductor device using a wide band gap semiconductor such as SiC or AlGaN, there is pointed out a problem that the insulating film in the bottom of each trench (the bottom of each trench 10 in FIG. 37) is broken down by an excessive electric field applied to the insulating film directly because the dielectric breakdown electric field of the MOS semiconductor device is large. This is based on the fact that it is necessary to conserve not electric field intensity but electric flux density in the bottom of each trench. When the product of the relative dielectric constant and the dielectric breakdown electric field (referred to as relative dielectric constant-dielectric breakdown electric field product but a normal maximum electric field is used as the dielectric breakdown electric field when an amorphous insulator such as $SiO_2$ is used) of the semiconductor is larger than that of the insulating film in the bottom of each trench, the insulating film is broken down earlier. For example, the relative dielectric constant-dielectric breakdown electric field product of $SiO_2$ often used as an insulating film is about 10-12 MV/cm whereas the relative dielectric constant-dielectric breakdown electric field product of SiC reaches 15-25 MV/cm though it depends on polytype and orientation. It is conceivable that the relative dielectric constant-dielectric breakdown electric field product of AlGaN or the like is further larger. Accordingly, when a wide band gap semiconductor such as SiC or AlGaN is used, there arises a problem that breakdown of the insulating film in the bottom of each trench cannot be avoided if the structure shown in FIG. 37 is used.

As a known technique of a method of producing another SiC semiconductor device than the aforementioned SiC trench gate type MOSFET, there has been disclosed the following technique. A hard mask deposited on a p-type polycrystalline silicon layer and a shallow n-type polycrystalline silicon layer is selectively etched. While the remaining part of the hard mask is used as a mask, an n-type impurity is ion-implanted into the p-type polycrystalline silicon layer to thereby form an n-type polycrystalline silicon layer. Then, a film as a material of a side wall is deposited isotropically and etched anisotropically to thereby form a side wall on a side surface of the hard mask. While the hard mask and the side wall are used as a mask, the n-type polycrystalline silicon layer is etched. There is known a method in which the width of the n-type polycrystalline silicon layer is reduced sufficiently by self-alignment in the aforementioned manner. See, for example, JP-A-2007-27491 and corresponding EP 1915773 A1

There is a description concerned with formation of a device separation region by self-alignment in JP-A-4-209541. There is a description concerned with production of a multistage recess groove by self-alignment at a good yield rate as described in JP-A-3-184334 and JP-A-4-206838. There is a description concerned with a recess structure in which a two-stage groove structure is formed by wet etching with use of a first mask in JP-A-4-196542. There is a description concerned with a self-aligned dual-oxide UMOSFET in JP-T-2005-505138 and corresponding US Patent Appln. 2003062569 A1.

There is known a structure in which another trench than a gate trench is provided so as to be deeper than the gate trench and provided with a Schottky contact on its inner surface to protect an insulating film in the bottom of the gate trench from an excessive electric field to thereby prevent lowering of the withstand voltage as described in JP-A-8-204179 and corresponding U.S. Pat. No. 5,614,749 A.

On the other hand, a trench is formed in a wafer in which a field stopping layer, a drift layer, a current spread layer, a body region and a source contact layer are formed successively on a substrate, so that the trench reaches the field stopping layer or the substrate. A gate electrode is provided in an upper half of the trench. An insulator having a normal value of dielectric breakdown electric field equal to or larger than the dielectric breakdown electric field of the semiconductor material of the substrate is embedded in a portion of the trench deeper than the gate electrode. A semiconductor device produced in the aforementioned manner has been disclosed in JP-A-2007-194283 and corresponding US Patent Appln. 2007187695 A1

In the SiC trench gate type MOSFET, a highly doped n-type region and a highly doped p-type region can be produced by selective ion implantation but there is a problem that a long time is required for high dose ion implantation to obtain a high doping concentration. Moreover, when high dose ion implantation required for obtaining a good ohmic contact is performed particularly on the front surface of the p-type region, crystal defects are produced frequently to thereby cause a problem that the withstand voltage yield rate is lowered.

To avoid these problems, it is preferable that a highly doped p-type region can be formed by epitaxial growth but selective epitaxial growth of SiC is required for forming the region partially. However, the selective epitaxial growth of SiC is under study and has not been put to practical use sufficiently to be applied to device production. In the present situation, it is difficult to use the selective epitaxial growth of SiC. Moreover, in AlGaN or the like, it is very difficult to perform p-type high dose ion implantation itself. For example, a method of forming a quantum well by bringing alloys different in composition into contact with each other is known as another method of forming a good ohmic contact with a surface of a p-type region. It is however necessary to use this method based on epitaxial growth. Incidentally, in AlGaN or the like, it is known that selective epitaxial growth can be performed with use of an $SiO_2$ film as a mask.

The present invention was developed in consideration of the aforementioned points, as it would be desirable to provide a trench gate type semiconductor device and a method of producing the same, in which the cell pitch can be made smaller than that in the related art even when a wide band gap semiconductor not established yet as a mass-production method for impurity doping due to a thermal diffusion method is used. It would further be desirable to provide a trench gate type semiconductor device and a method of producing the same, in which good ohmic contacts can be obtained without use of selective epitaxial growth for at least one conductivity type while the first object can be satisfied.

SUMMARY OF THE INVENTION

The present invention provides a trench gate type semiconductor device and a method of producing the same, in which the cell pitch can be made smaller than that in the related art even when a wide band gap semiconductor not established yet as a mass-production method for impurity doping due to a thermal diffusion method is used. The invention further provides a trench gate type semiconductor device and a method of producing the same, in which good ohmic contacts can be obtained without use of selective epitaxial growth for at least one conductivity type while the first object can be satisfied. Such devices and manufacturing methods, in accordance with the invention as set forth, will be described with reference to several preferred embodiments including, in particular, Embodiments 1-7.

The use of certain ones of these embodiments, such as Embodiment 4 and 5 which will be described in greater detail below, causes a width of a trench to become narrower, for example 0.6 μm, and a cell pitch to be reduced, for example 2 μm. As a measure against a potential problem that the insulating film is broken down by an excessive electric field applied to the insulating film, there is a heretofore known a method in which a p-type embedded region is provided in the bottom of each trench. For application of such a p-type embedded region to the structure of the SiC trench gate type MOSFET according to the related art shown in FIG. 37, a p-type embedded region 8 is provided in the bottom of each trench 10, for example, as shown in FIG. 67. When the p-type embedded region 8 is provided simply, the same resistance as the JFET effect is produced by a depletion region which extends from the p-type embedded region 8 to the voltage withstanding layer 3. There was heretofore a main problem that the voltage withstanding layer 3 was narrowed between the p-type embedded region 8 and the body region 5 when the cell pitch was not smaller than 10 μm. Accordingly, when an n-type current spread layer 4 higher in doping concentration than the voltage withstanding layer 3 is provided to keep a current flow path at a distance from the trench as shown in FIG. 67, the JFET resistance can be relaxed though it cannot be eliminated perfectly.

In the example shown in FIG. 67, there is however a problem that the voltage withstanding layer 3 is narrowed between adjacent trenches 10 because the distance between the trenches 10 is, for example, no more than 1.4 μm. For example, when a withstand voltage of 1.2 kV is designed, the doping concentration of the voltage withstanding layer 3 is about $1\times10^{16}$ cm$^{-3}$. Assuming a single-side abrupt junction, the depletion region extends to the voltage withstanding layer 3 side by about 0.57 μm even in a zero biased state (where the voltage drop in the channel-source region in an on-state is 0V). Accordingly, the space surrounded by the trenches 10 is narrowed by about 1.14 μm totally from both sides, so that the remaining space is no more than about 0.26 μm (which is smaller than 1/7 as large as the distance between the trenches 10). The on-state-resistance due to the narrowing is estimated at about 0.6 mΩcm$^2$ per 1 μm in a depth direction. The estimated on-state-resistance is a considerable value compared with the resistance (about 1 mΩcm$^2$) of the voltage withstanding layer 3 per se.

As for SiC, ion implantation is required for forming the p-type embedded region 8 but the threshold voltage is increased and channel mobility is lowered when an acceptor is implanted into a side wall surface of trench 10. It is therefore necessary to protect the side wall of each trench 10 when ion implantation is performed. It is however difficult to protect the side wall because the width of the trench 10 is, for example, no more than 0.6 μm.

As for AlGaN or the like, it is very difficult to form a p-type region in the bottom of each trench 10 by ion implantation. Moreover, it is difficult to perform selective growth because an n-type region has to be exposed at least from the side wall surface of the trench 10. Accordingly, it is very difficult to apply such a form to AlGaN or the like.

As a similar method, there is a method in which another trench than the trench (referred to as gate trench) is provided so as to be deeper than the gate trench and a Schottky contact is provided in the inside of the other trench as disclosed in JP-A-8-204179 and corresponding U.S. Pat. No. 5,614,749 A. There is however a problem that the cell pitch is widened when the Schottky contact is provided for each cell because a method of forming the other trench so as to be self-aligned with the gate trench has not been heretofore known yet. Even if the other trench can be formed by self-alignment, the current flow path is narrowed as described above by the depletion region extending from the Schottky contact. Accordingly, there is a risk that the on-state-resistance will increase as described above when the distance between the gate trench and the other trench is set to be short sufficiently to reduce the cell pitch.

As another measure, there is a method disclosed in JP-A-2007-194283 and corresponding US Patent Appln. 2007187695. When this method is applied to the SiC trench gate type MOSFET shown in FIG. 37, an embedding insulator 15 is embedded in a lower portion of each trench 10 while the trench 10 has a depth to reach a drain-side highly doped layer (a field stopping layer 2 in FIG. 68) as shown in FIG. 68. According to this structure, breakdown is avoided because an electric field substantially equal to that applied to the voltage withstanding layer 3 is applied to the embedding insulator 15 based on the electromagnetic law regardless of the relative dielectric constant if the trench 10 can reach the field stopping layer 2.

This method is powerful if a technique of etching the trench 10 deeply sufficiently to reach the field stopping layer 2 and embedding the insulator appropriately in the lower portion of the trench 10 can be established. Although this method can be achieved if the trench width is as large as that according to the related art, it is very difficult to achieve this method if the cell pitch and the trench width are reduced.

For example, when the withstand voltage is 1.2 kV, the thickness of the voltage withstanding layer 3 is about 10 μm in consideration of production error. Because a thickness of about 2.5 μm is required as the total thickness of the body region 5, the source extension region 6b and the source contact region 6a, a depth of about 15 μm is required as the depth of the trench 10 from the front surface in consideration of production error. In the related art, it was possible to achieve this method because the trench width was heretofore about 2 μm and the aspect ratio was about 7.5. In the example shown in FIG. 68, however, the aspect ratio of the trench 10 reaches 25 because the width of the trench 10 is, for example, no more than 0.6 μm as described above. It is conceivable that a considerable time will be required for achieving this method because the aspect ratio is not lower than three times as high as the aspect ratio in the related art. In addition, the high aspect ratio is a barrier to provision of the embedding insulator 15. For example, in the case where polycrystalline silicon doped with a high concentration of phosphorus is deposited thinly and oxidized thoroughly as described in JP-A-2007-194283, to say nothing of the case where BPSG is deposited by LPCVD, it is unavoidable to require a long time for solving the problem that the polycrystalline silicon is not deposited evenly or only an upper part of the polycrystalline silicon is oxidized earlier but a lower part of the polycrystalline silicon remains as polycrystalline silicon.

As for the function of protecting the insulating film in the bottom of each trench from an excessive electric field as described in JP-A-8-204179, firstly there is provided a structure in which the maximum electric field at off-time is produced near the Schottky electrode, not the insulating film in the bottom of each trench, to prevent the insulating film from being broken down. Secondly the voltage withstanding layer is pinched off by the depletion region extending from the Schottky electrode adjacent at off-time to thereby prevent an excessive electric flux line from reaching the gate trench.

Although the gate trench can be protected by the first function alone, there is a problem that the withstand voltage is decided by a tunnel current in the Schottky barrier (or the withstand voltage is reduced remarkably) because the tunnel current in the Schottky barrier becomes excessive before the semiconductor results in avalanche breakdown when the Schottky barrier is low in the case where a semiconductor such as SiC high in dielectric breakdown electric field is used.

Moreover, in the first function, there is a risk that the temperature characteristic of the withstand voltage may become negative because a part of the tunnel current due to thermionic electric field emission increases as the temperature increases. There is a problem that it is undesirable to apply the first function to a power device. Although this problem can be eliminated if the Schottky barrier is sufficiently high, a thick voltage withstanding layer lower in doping concentration than the vicinity of the Schottky barrier has to be provided, for example, in the vicinity of the gate trench in order to protect effectively the insulating film in the bottom of the gate trench from being broken down in this state. Then, the resistance of the voltage withstanding layer at on-time becomes considerable, so that there is a problem that on-state-resistance increases.

Although the use of the second function permits a high withstand voltage to be achieved by a thinner voltage withstanding layer and a higher Schottky barrier compared with the first function, there is a possibility that on-state-resistance will increase because the current flow path at on-state is narrowed by the depletion region extending from the Schottky contact, for example, in the same manner as in the case where an embedded region of a conductivity type reserve to the voltage withstanding layer is provided in the bottom of the gate trench as shown in FIG. 67. However, increase in on-state-resistance can be suppressed because the built-in potential of the Schottky contact is lower than that of a pn junction so that the extension of the depletion region at on-state in the Schottky contact is smaller than that in the pn junction.

In view of the above, the invention further provides a trench gate type semiconductor device and a method of producing the same, for example illustrated in Embodiments 8-10, in which an excessive electric field is prevented from being applied to an insulating film in the bottom of each trench while the second object can be satisfied.

According to a first aspect of the invention, there is provided a method of producing a trench gate type semiconductor device, including the steps of: (I) laminating a voltage withstanding layer of a wide band gap semiconductor of a first conductivity type and a body layer of a wide band gap semiconductor of a second conductivity type successively on a wide band gap semiconductor substrate with a high impurity concentration by epitaxially growing the voltage withstanding layer and the body layer respectively on the whole area of a surface of the semiconductor substrate; (II) forming a first mask having first opening portions on a surface of the body layer; (III) forming source ion-implanted regions by ion implantation from the first opening portions; (IV) depositing a second mask having a thickness smaller than one second as large as the width of each first opening portion, on the whole area of the surface of the semiconductor substrate after the step (III) and performing anisotropic etching to provide second opening portions in the second mask on the respective bottoms of the first opening portions; (V) performing anisotropic etching from the second opening portions to form first trenches each of which passes through the corresponding source ion-implanted region and the body layer and reaches the voltage withstanding layer; and (VI) forming an insulating film on an inner wall surface of each first trench and embedding a gate electrode in the first trench so as to be located opposite to the corresponding source ion-implanted region, the body layer and the voltage withstanding layer respectively through the insulating film.

According to a second aspect of the invention, there can be provided a method of producing a trench gate type semiconductor device, including the steps of: (I) laminating a voltage withstanding layer of a wide band gap semiconductor of a first conductivity type, a body layer of a wide band gap semiconductor of a second conductivity type and a body contact layer of a wide band gap semiconductor of the second conductivity type having a high impurity concentration surface capable of obtaining practical ohmic contact successively on a wide band gap semiconductor substrate with a high impurity concentration by epitaxially growing the voltage withstanding layer, the body layer and the body contact layer respectively on the whole area of a surface of the semiconductor substrate; (II) forming a first mask having first opening portions on a surface of the body contact layer; (IIIa) performing anisotropic etching from the first opening portions to form first trenches each of which passes through the body contact layer and has a bottom in the body layer; (IIIb) performing ion implantation in the respective bottoms of the first trenches or epitaxial growth on the respective bottoms of the first trenches to form source ion-implanted regions of the first conductivity type in a position at least deeper than the body contact layer; (IV) depositing a second mask having a thickness smaller than one second as large as the width of each first trench, on the whole area of the surface of the semiconductor substrate after the step (IIIb) and performing anisotropic etching to provide second opening portions in the second mask on the respective bottoms of the first trenches; (V) performing anisotropic etching from the second opening portions to form second trenches each of which reaches the voltage withstanding layer; and (VI) forming an insulating film on an inner wall surface of each second trench and embedding a gate electrode in the second trench so as to be located opposite to the corresponding source ion-implanted region, the body region and the voltage withstanding layer respectively through the insulating film.

According to a third aspect of the invention, there can be provided a method of producing a trench gate type semiconductor device, including the steps of: (I) laminating a voltage withstanding layer of a wide band gap semiconductor of a first conductivity type, a body layer of a wide band gap semiconductor of a second conductivity type and a body contact layer of a wide band gap semiconductor of the second conductivity type having a high impurity concentration surface capable of obtaining practical ohmic contact successively on a wide band gap semiconductor substrate with a high impurity concentration by epitaxially growing the voltage withstanding layer, the body layer and the body contact layer respectively on the whole area of a surface of the semiconductor substrate; (II) forming a first mask having first opening portions on a surface of the body contact layer; (IIIa) performing anisotropic etching from the first opening portions to form first trenches each of which passes through the body contact layer and has a bottom in the body layer; (IIIb) performing ion implantation in the respective bottoms of the first trenches or epitaxial growth on the respective bottoms of the first trenches to form source ion-implanted regions of the first conductivity type in a position at least deeper than the body contact layer; (IVa) depositing a second mask having a thickness smaller than one second as large as the width of each first trench, on the whole area of the surface of the semiconductor substrate after the step (IIIb) and performing anisotropic etching to provide second opening portions in the second mask on the respective bottoms of the first trenches; (IVb) performing anisotropic etching from the second opening portions to form third trenches each of which has a bottom in the corresponding source ion-implanted region; (IVc) performing ion implantation in the respective bottoms of the third trenches or epitaxial growth on the respective bottoms of the third trenches to form source elongation ion-implanted regions at least deeper than the source ion-implanted regions; (IVd) depositing a third mask having a thickness smaller than one second as large as the width of each third trench, on the whole area of the surface of the semiconductor substrate after the step (IVc) and performing anisotropic etching to provide third opening portions in the third mask on the respective bottoms of the third trenches; (V) performing anisotropic etching from the third opening portions to form second trenches each of which reaches the voltage withstanding layer; and (VI) forming an insulating film on an inner wall surface of each second trench and embedding a gate electrode in the second trench so as to be located opposite to the corresponding source elongation ion-implanted region, the body layer and the voltage withstanding layer respectively through the insulating film.

According to a fourth aspect of the invention, there can be provided a method of producing a trench gate type semiconductor device according to the second aspect, wherein: the step (IIIb) is replaced by a step of performing ion implantation in the respective bottoms of the first trenches or epitaxial growth on the respective bottoms of the first trenches to form source contact ion-implanted regions of the first conductivity type on a surface side having a high impurity concentration surface capable of obtaining ohmic contact and source extension ion-implanted regions of the first conductivity type on a lower layer side so as to be located at least deeper than the body contact layer; and the step (VI) is replaced by a step of forming an insulating film on an inner wall surface of each second trench and embedding a gate electrode in the second trench so as to be located opposite to the corresponding source extension ion-implanted region, the corresponding body region and the voltage withstanding layer respectively through the insulating film.

According to a fifth aspect of the invention, there can be provided a method of producing a trench gate type semiconductor device according to the third aspect, wherein: the step (IIIb) is replaced by a step of performing ion implantation in the respective bottoms of the first trenches or epitaxial growth on the respective bottoms of the first trenches to form source contact ion-implanted regions of the first conductivity type on a surface side having a high impurity concentration surface capable of obtaining ohmic contact and source extension ion-implanted regions of the first conductivity type on a lower layer side so as to be located at least deeper than the body contact layer; and the step (IVc) is replaced by a step of performing ion implantation in the respective bottoms of the third trenches or epitaxial growth on the respective bottoms of the third trenches to form source elongation ion-implanted regions of the first conductivity type which are at least in contact with the source extension ion-implanted regions respectively.

According to a sixth aspect of the invention, there can be provided a method of producing a trench gate type semiconductor device according to the second or fourth aspect, wherein a step (Va) of performing heat treatment at a temperature where the function of the first mask is not spoiled and where ions implanted in the source contact regions cannot be activated perfectly but the source contact regions can be prevented from being degenerated by the following steps is inserted between the steps (V) and (VI).

According to a seventh aspect of the invention, there can be provided a method of producing a trench gate type semiconductor device according to the third or fifth aspect, wherein a step (Va) of performing heat treatment at a temperature where the function of the third mask is not spoiled and where ions implanted in the source extension ion-implanted regions cannot be activated perfectly but the source extension ion-implanted regions can be prevented from being degenerated by the following steps is inserted between the steps (V) and (VI).

According to an eighth aspect of the invention, there can be provided a method of producing a trench gate type semiconductor device according to the sixth or seventh aspect, wherein: each of the first to third masks contains silicon dioxide as a main component; and the temperature for heat treatment in the step (Va) is not higher than 1350° C.

According to a ninth aspect of the invention, there can be provided a method of producing a trench gate type semiconductor device according to the sixth or seventh aspect, wherein: the semiconductor substrate contains hexagonal silicon carbide as a main semiconductor material; and the temperature for heat treatment in the step (Va) is not lower than 1250° C.

According to a tenth aspect of the invention, there can be provided a method of producing a trench gate type semiconductor device according to the sixth or seventh aspect, wherein a step of forming a selectively releasable cap material containing carbon or silicon nitride at least on any one of the semiconductor substrate, the first mask and the third mask is provided before the heat treatment in the step (Va).

According to an eleventh aspect of the invention, there can be provided a method of producing a trench gate type semiconductor device according to the tenth aspect, wherein the semiconductor substrate contains silicon carbide as a main semiconductor material.

According to a twelfth aspect of the invention, there can be provided a trench gate type semiconductor device including: a wide band gap semiconductor substrate with a high impurity concentration; a voltage withstanding layer of a wide band gap semiconductor of a first conductivity type with a low impurity concentration which is provided on one principal surface of the semiconductor substrate; body regions of a wide band gap semiconductor of a second conductivity type which are higher in impurity concentration than the voltage withstanding layer and which are provided on the voltage withstanding layer; body contact regions of the second conductivity type each of which is a selective region having a high impurity concentration surface capable of obtaining ohmic contact and each of which is provided in a surface layer of the corresponding body region; source contact regions of the first conductivity type each of which is a selective region having a high impurity concentration surface capable of obtaining ohmic contact and each of which is provided in the surface layer of the corresponding body region; source extension regions of the first conductivity type each of which is provided as a layer under the corresponding source contact region; trenches each of which extends from a surface of the corresponding source contact region to the voltage withstanding layer while passing through the corresponding source contact region, the corresponding source extension region and the corresponding body region; insulating films each of which is provided on an inner wall surface of the corresponding trench; and gate electrodes each of which is embedded in the corresponding trench so as to be located opposite to the corresponding source extension region, the corresponding body region and the voltage withstanding layer through the corresponding insulating film; wherein: each of the trenches includes a first trench which is wide, and a second trench which is made narrower than the first trench by the thickness of a first mask provided on a side wall surface of the first trench so that the second trench opens in the bottom of the first trench; each of the second trenches has such a depth that the second trench reaches the voltage withstanding layer while passing through the corresponding source contact region, the corresponding source extension region and the corresponding body region provided below the bottom of the corresponding first trench; the gate electrodes are provided in the second trenches respectively through insulating films provided on respective inner wall surfaces of the second trenches; and interlayer insulating films are provided in the second trenches respectively so that respective upper portions of the gate electrodes are covered with the interlayer insulating films respectively.

According to a thirteenth aspect of the invention, there can be provided a trench gate type semiconductor device according to the twelfth aspect, wherein: each third trench is provided between the corresponding first trench and the corresponding second trench; each of the third trenches has a structure in which the third trench is made narrower than the first trench by the thickness of a first mask provided on a side wall surface of the first trench so that the third trench opens in the bottom of the first trench and in which the second trench is made narrower than the third trench by the thickness of a second mask provided on a side wall surface of the third trench so that the second trench opens in the bottom of the third trench; each of the third trenches has such a depth that the third trench reaches the corresponding source extension region on a lower layer side while passing through the corresponding source contact region on a surface side provided below the bottom of the first trench; source elongation regions provided below the respective bottoms of the third trenches are in contact with the source extension regions respectively; and the second trenches are provided in the respective bottoms of the third trenches.

According to a fourteenth aspect of the invention, there can be provided a trench gate type semiconductor device according to the twelfth or thirteenth aspect, wherein the semiconductor substrate contains silicon carbide as a main semiconductor material.

According to a fifteenth aspect of the invention, there can be provided a trench gate type semiconductor device according to the fourteenth aspect, wherein elements are added simultaneously at epitaxial growth so that each body contact region effectively contains aluminum with an impurity concentration of $2\times10^{19}$ cm$^{-3}$ or higher.

According to a sixteenth aspect of the invention, there can be provided a trench gate type semiconductor device according to the fourteenth aspect, wherein each source contact region or at least a surface region of each source contact region is doped with phosphorus while a remaining part of each source ion-implanted region is doped with nitrogen or each source extension region and each source elongation region are doped with nitrogen.

According to a seventeenth aspect of the invention, there can be provided a trench gate type semiconductor device according to the fourteenth aspect, wherein the principal surface of the semiconductor substrate is substantially a (000-1) C-face of a hexagonal silicon carbide semiconductor.

According to an eighteenth aspect of the invention, there can be provided a trench gate type semiconductor device according to the twelfth or thirteenth aspect, wherein the semiconductor substrate contains any one of gallium nitride, aluminum nitride and an alloy of gallium nitride and aluminum nitride as a main component.

According to a nineteenth aspect of the invention, there can be provided a trench gate type semiconductor device according to the fourteenth aspect, wherein each body contact region includes a quantum well structure suitable for obtaining ohmic contact.

According to the invention, there can be provided a trench gate type semiconductor device and a method of producing the same, in which the cell pitch can be made smaller than that in the related art even when a semiconductor material not established yet as a mass-production method for impurity doping due to a thermal diffusion method is used. Moreover, there can be provided a trench gate type semiconductor device and a method of producing the same, in which good ohmic contact can be obtained without use of selective epitaxial growth for at least one conductivity type while the first object can be satisfied. In addition, there can be provided a trench gate type semiconductor device and a method of producing the same, in which an excessive electric field is prevented from being applied to an insulating film in the bottom of each trench while the second object can be satisfied.

These and other features, advantages and aspects of the invention will become clear to those skilled in the art from the following detailed description of the preferred embodiments of the invention and the accompanying drawings.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS

A trench gate type insulated gate field-effect transistor according to the invention will be described below in detail with reference to the drawings. The invention is not limited to the following description of embodiments without departing from the gist of the invention.

Figure 44:
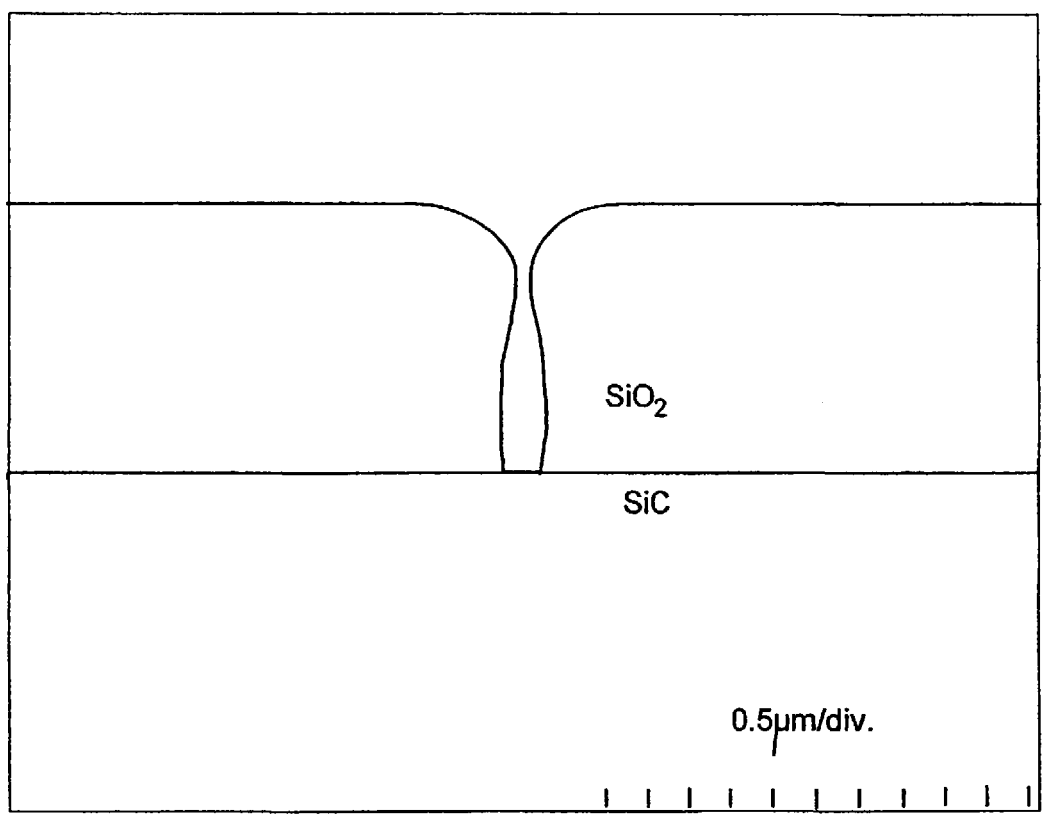
FIG. 44 is a tomographic model view of an SiO$_2$ film mask after redeposition of an SiO$_2$ film on an SiC wafer according to Embodiment 6 of the invention.
Figure 45:
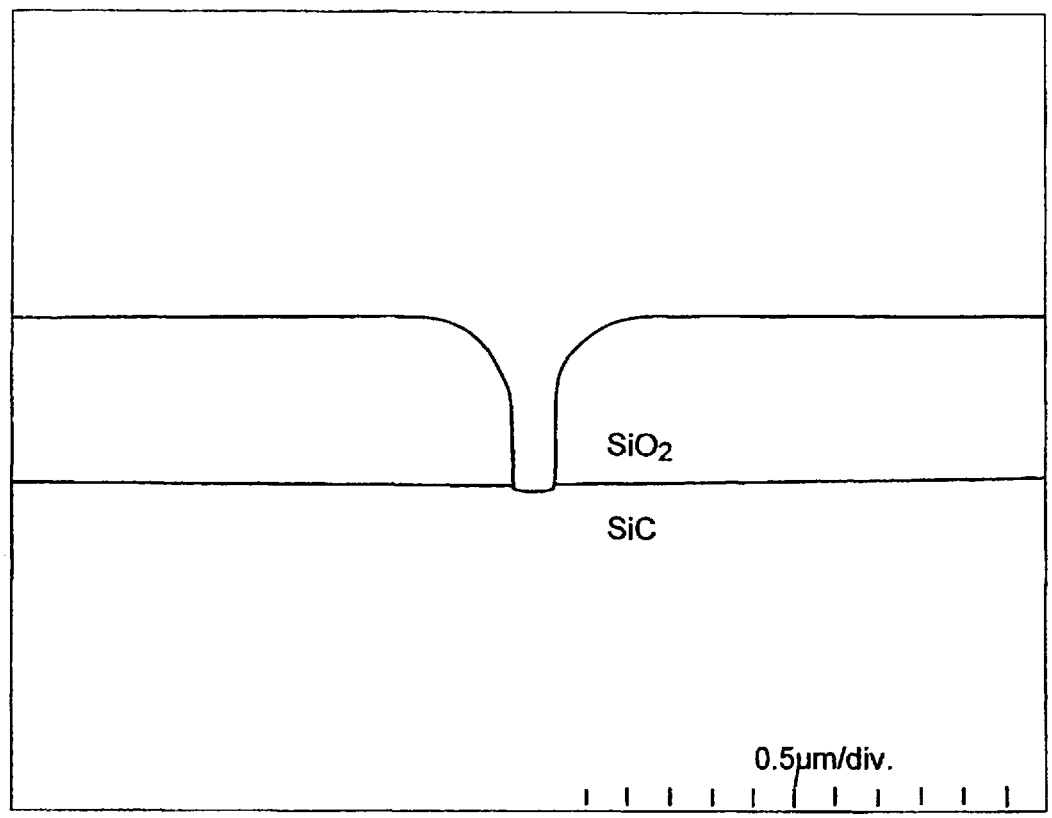
FIG. 45 is a tomographic model view of an SiO$_2$ film mask after re-etching of an SiO$_2$ film redeposited on an SiC wafer according to Embodiment 6 of the invention.
Figure 46:
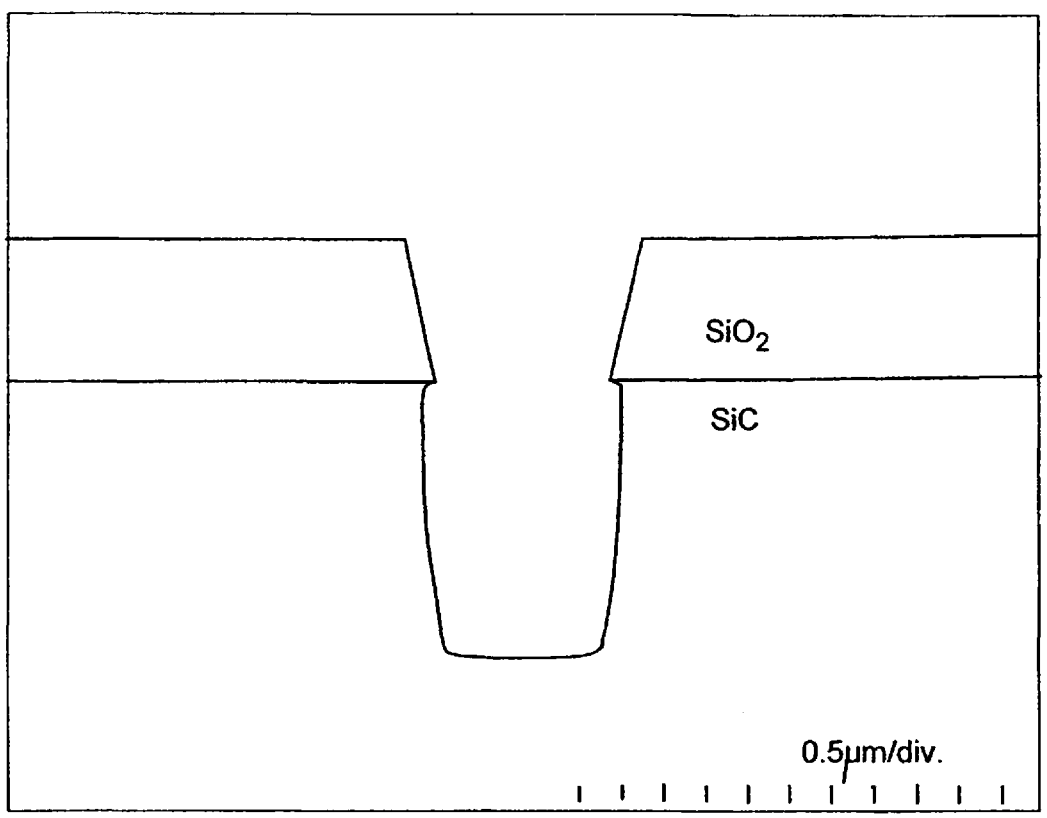
FIG. 46 is a tomographic model view of an SiO$_2$ film mask on an SiC wafer according to the related art.
Figure 47:
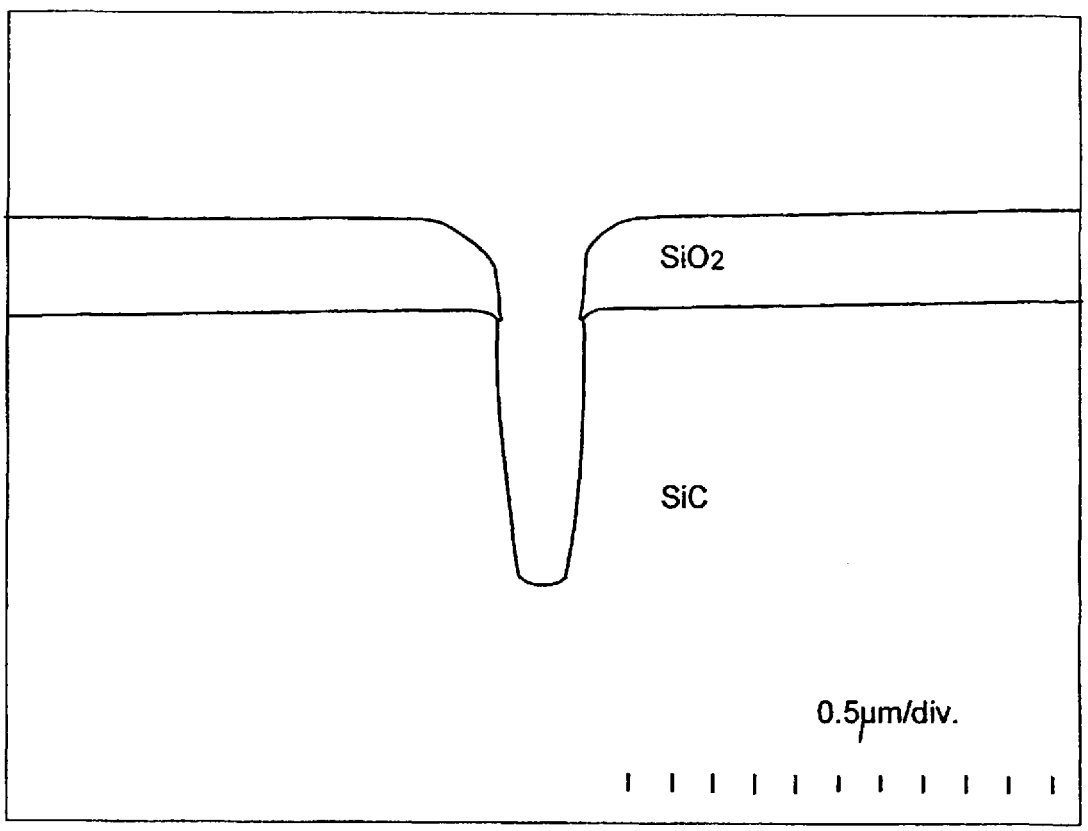
FIG. 47 is a tomographic model view of an SiC wafer etched by use of an SiO$_2$ film mask according to Embodiment 6 of the invention.
Figure 48:
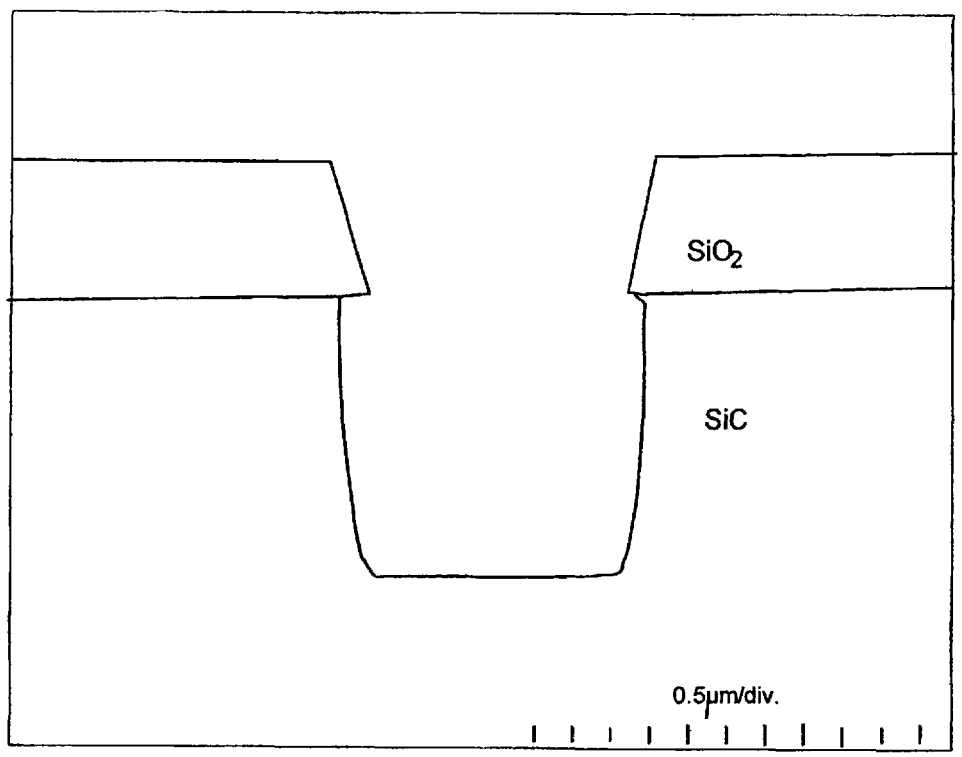
FIG. 48 is a tomographic model view of an SiC wafer etched by use of an SiO$_2$ film mask according to Embodiment 7 of the invention.
Figure 49:
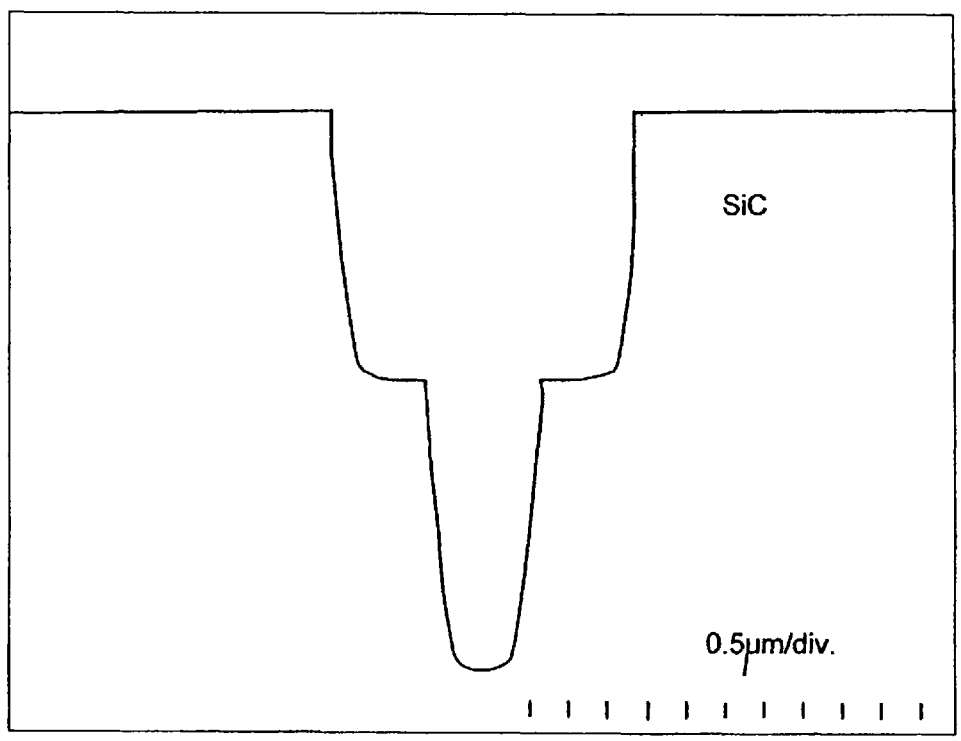
FIG. 49 is a tomographic model view of an SiC wafer two-stage etched by use of an SiO$_2$ film mask according to Embodiment 7 of the invention.
Figure 50:
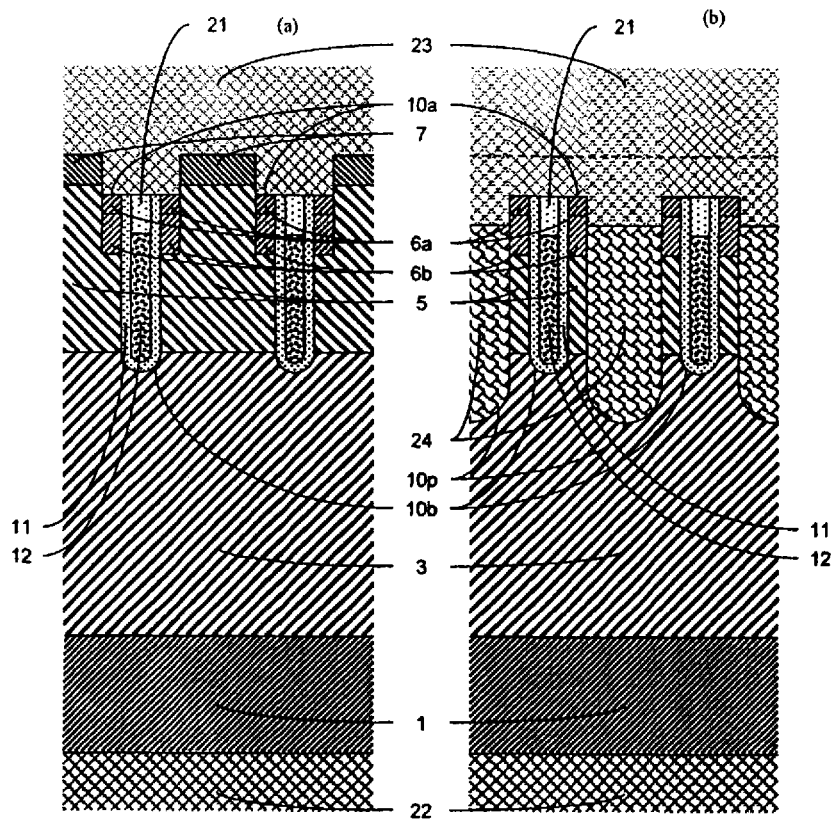
FIGS. 50A and 50B are sectional views (No. 1) of important part of a unit cell portion of an SiC trench gate type MOSFET according to Embodiment 8 of the invention.
Figure 51:
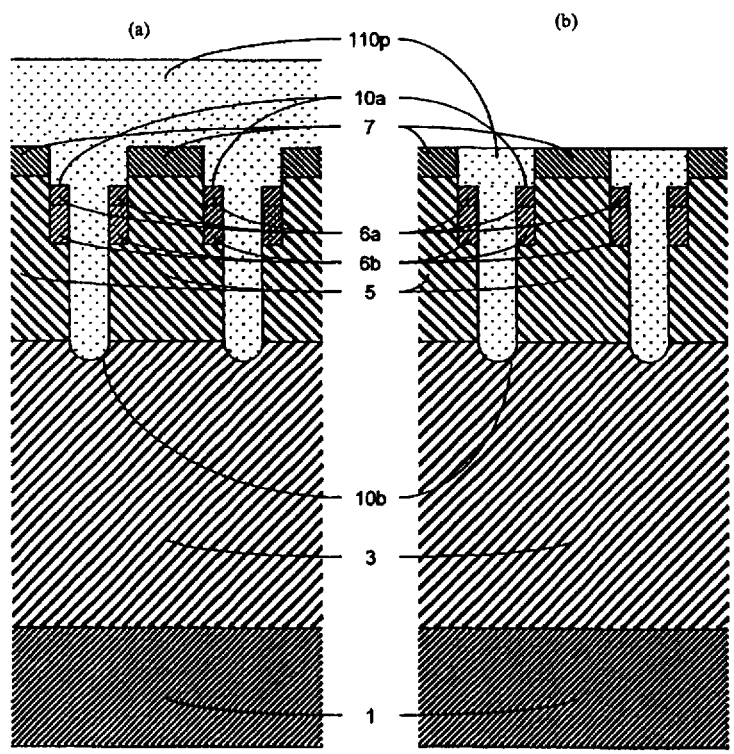
FIGS. 51A and 51B are sectional views (No. 2) of important part of a unit cell portion showing a method of producing an SiC trench gate type MOSFET according to Embodiment 8 of the invention.
Figure 52:
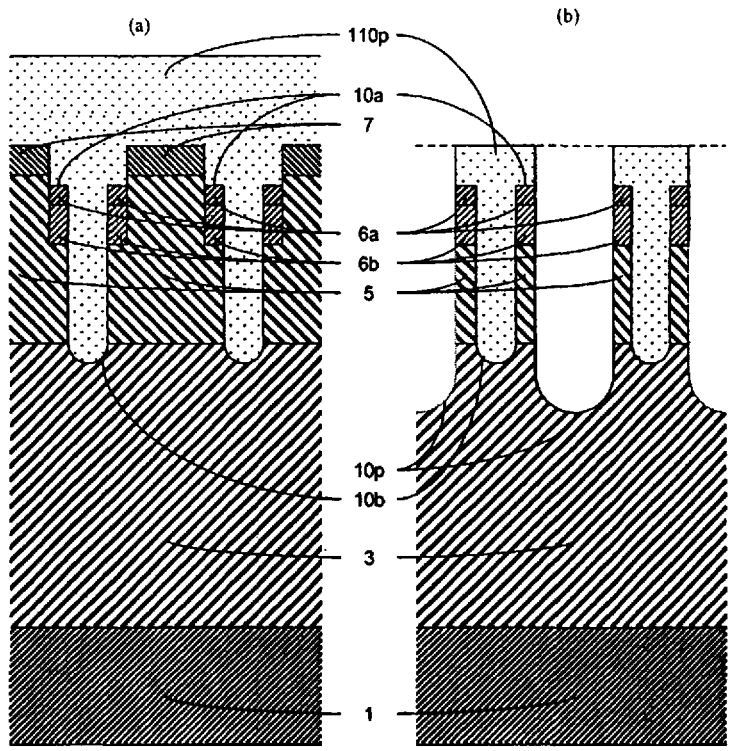
FIGS. 52A and 52B are sectional views (No. 3) of important part of a unit cell portion showing a method of producing an SiC trench gate type MOSFET according to Embodiment 8 of the invention.
Figure 53:
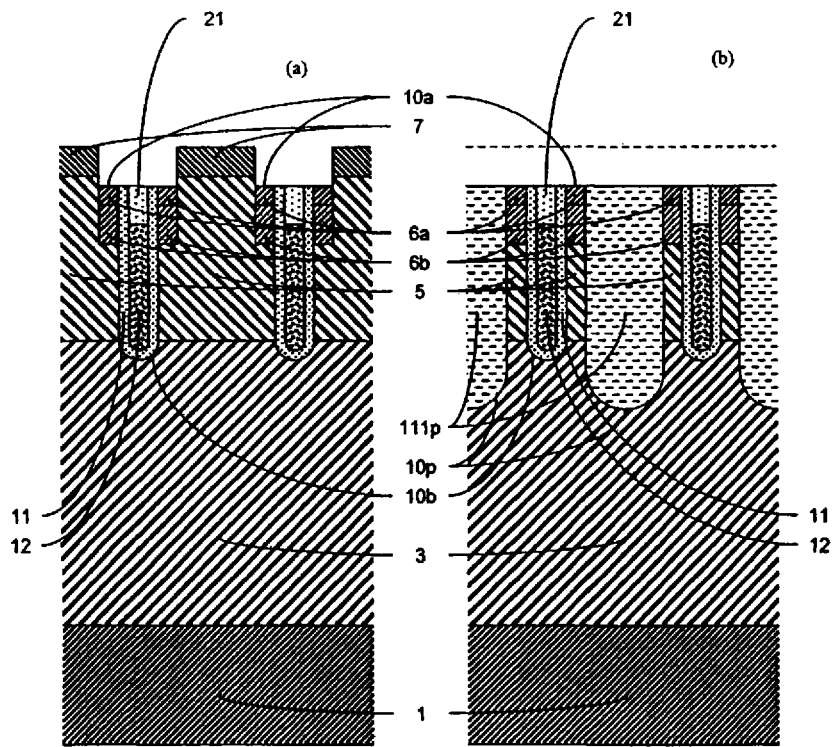
FIGS. 53A and 53B are sectional views (No. 4) of important part of a unit cell portion showing a method of producing an SiC trench gate type MOSFET according to Embodiment 8 of the invention.
Figure 54:
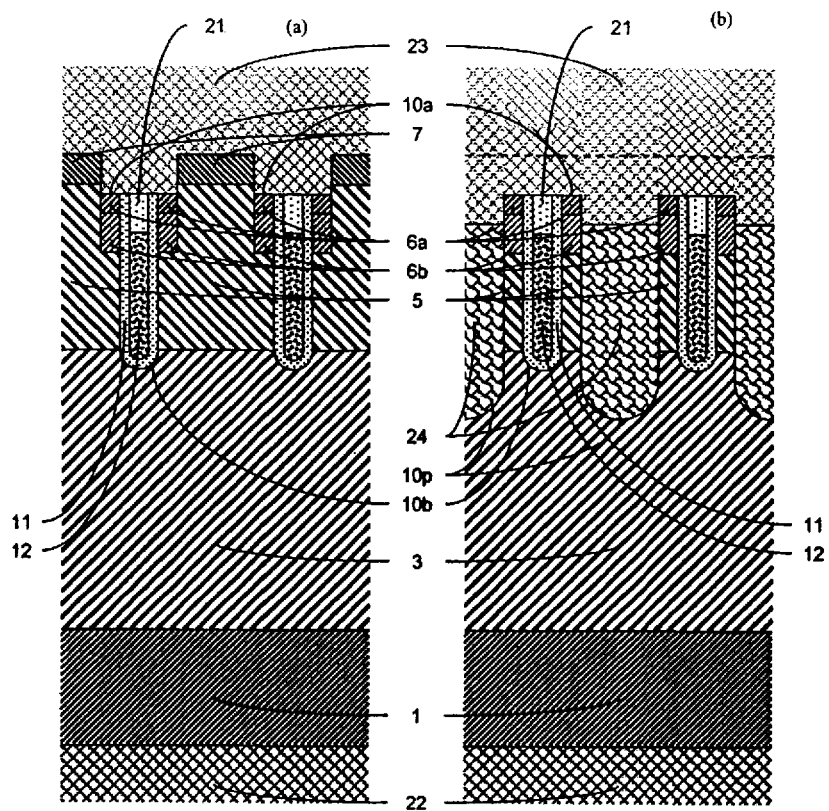
FIGS. 54A and 54B are sectional views (No. 1) of important part of a unit cell portion showing a method of producing an SiC trench gate type MOSFET according to Embodiment 9 of the invention.
Figure 55:
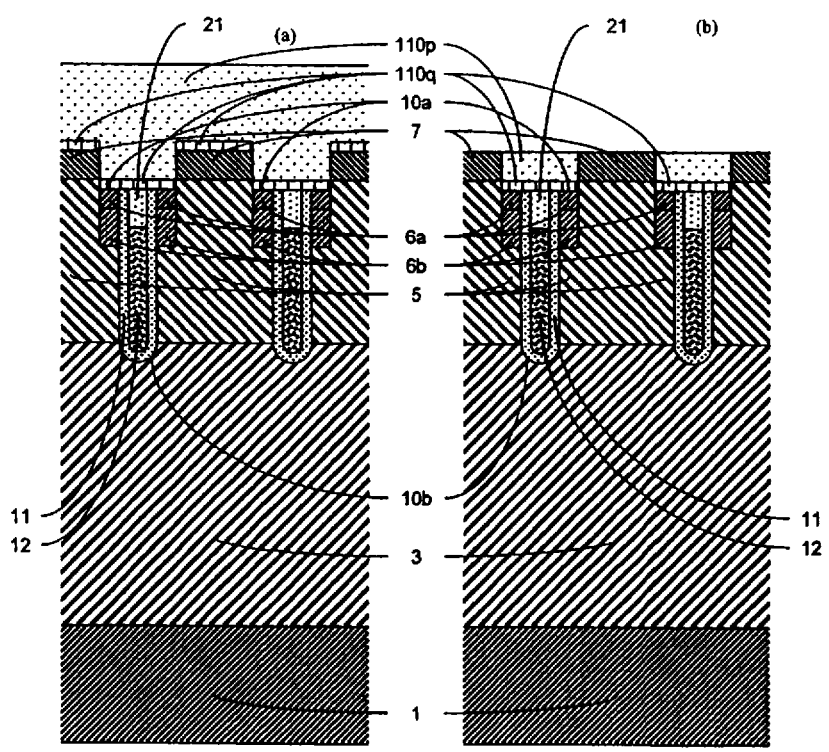
FIGS. 55A and 55B are sectional views (No. 2) of important part of a unit cell portion showing a method of producing an SiC trench gate type MOSFET according to Embodiment 9 of the invention.
Figure 56:
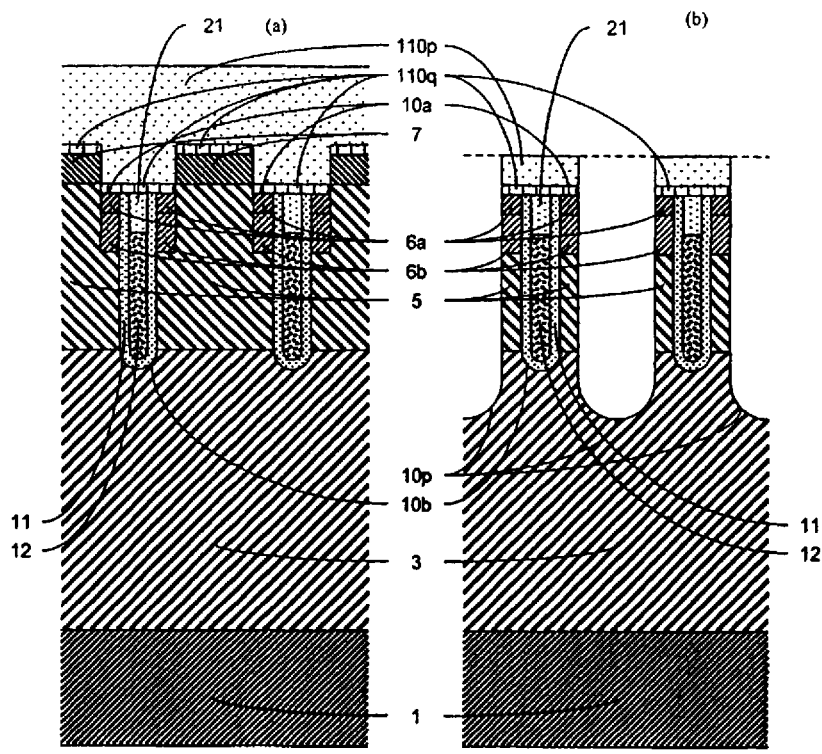
FIGS. 56A and 56B are sectional views (No. 3) of important part of a unit cell portion showing a method of producing an SiC trench gate type MOSFET according to Embodiment 9 of the invention.
Figure 57:
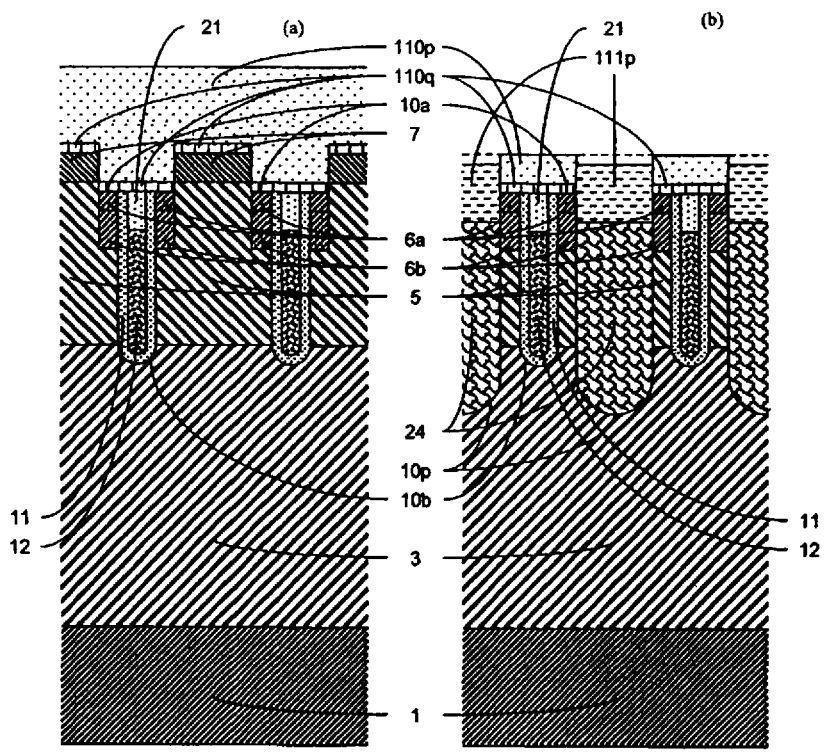
FIGS. 57A and 57B are sectional views (No. 4) of important part of a unit cell portion showing a method of producing an SiC trench gate type MOSFET according to Embodiment 9 of the invention.

FIGS. 1 to 4 are sectional views of important part of a semiconductor wafer for explaining a method of producing a trench gate type semiconductor device according to Embodiment 1 of the invention. FIGS. 5 to 10 are sectional views of important part of a semiconductor wafer for explaining a method of producing a trench gate type semiconductor device according to Embodiment 2 of the invention. FIGS. 11 to 17 are sectional views of important part of a semiconductor wafer for explaining a method of producing a trench gate type semiconductor device according to Embodiment 3 of the invention. FIGS. 18 to 24 are sectional views (Nos. 1 to 7) of important part of a unit cell portion for explaining an SiC trench gate type MOSFET and a method of producing the same according to Embodiment 4 of the invention. FIGS. 25 to 31 are sectional views (Nos. 1 to 7) of important part of a unit cell portion for explaining an SiC trench gate type MOSFET and a method of producing the same according to Embodiment 5 of the invention. FIGS. 42 to 47 except FIG. 46 are tomographic model views for explaining a producing method according to Embodiment 6 of the invention. FIGS. 48 and 49 are tomographic model views for explaining a producing method according to Embodiment 7 of the invention. Incidentally, the outer frame in each of FIGS. 42 to 49 indicates an end edge of each tomogram. FIGS. 50A and 50B to 53A and 53B are sectional views of important part of a unit cell portion for explaining an SiC trench gate type MOSFET and a method of producing the same according to Embodiment 8 of the invention. FIGS. 54A and 54B to 57A and 57B are sectional views of important part of a unit cell portion for explaining an SiC trench gate type MOSFET and a method of producing the same according to Embodiment 9 of the invention. FIGS. 58, 60, 63 and 65 are plain views showing a method of producing an intersection portion between a gate trench and an intersection trench in the SiC trench gate type MOSFET according to Embodiment 8 of the invention. FIGS. 59, 61, 62 and 64 are enlarged sectional views showing the method.

Embodiment 1

Figure 1:
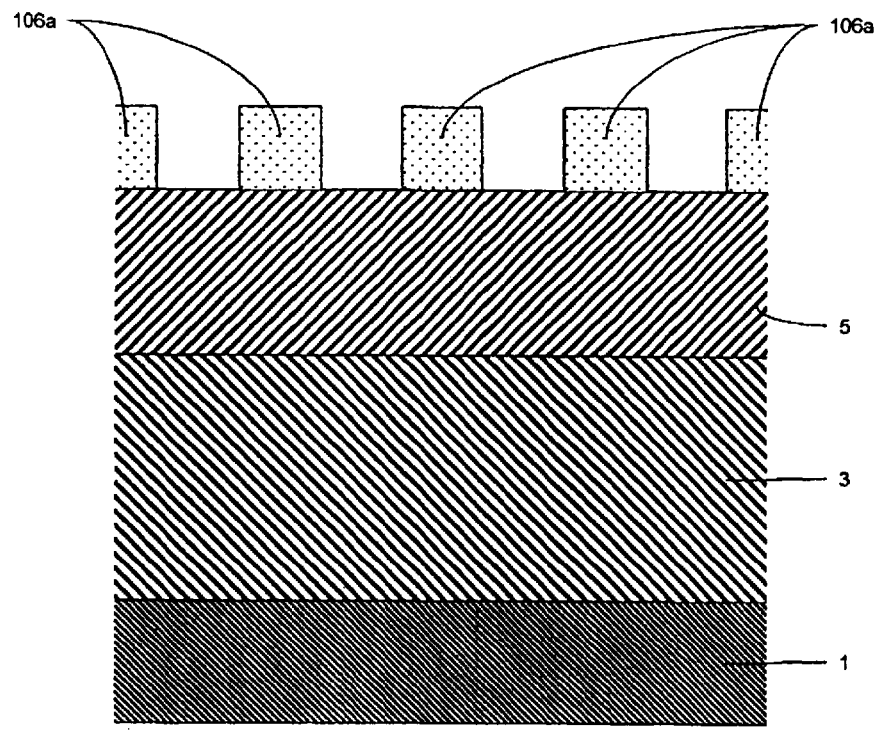
FIG. 1 is a sectional view (No. 1) of a semiconductor wafer showing a method of producing a trench gate type semiconductor device according to Embodiment 1 of the invention.

As shown in FIG. 1, a voltage withstanding layer 3 having a predetermined doping concentration of an n type and a predetermined thickness and a body layer having a predetermined doping concentration of a p type and a predetermined thickness are formed successively by epitaxial growth on the whole area of one principal surface (referred to as front surface) of an n-type SiC substrate 1. A predetermined first mask layer, for example, made of an $SiO_2$ film is formed on a front surface of the body layer. The mask layer is patterned to form a first mask 106a having a predetermined first opening portion by photolithograpy. Although a $SiO_2$ film is preferred as the first mask, another material may be used. In principle, the term "body region" means a region formed selectively on the wafer surface and the term "body layer" means a layer formed fully on the wafer surface. However, strict discrimination between layer and region may not be made in the following description because it may be difficult to read discrimination between layer and region from the drawings when the drawings are partial sectional views. Because body regions 5 in FIG. 1 are formed as a body layer at an initial stage of the process but the body layer is changed to body regions 5 when a semiconductor device is finished, the body layer 5 is shown in FIG. 1. That is, the body layer described in Embodiment 1 is synonymous with the body regions 5 shown in FIG. 1. Incidentally, a protective film such as a screen oxide film may be formed on a surface of the body region 5 exposed in the first opening portion.

Figure 2:
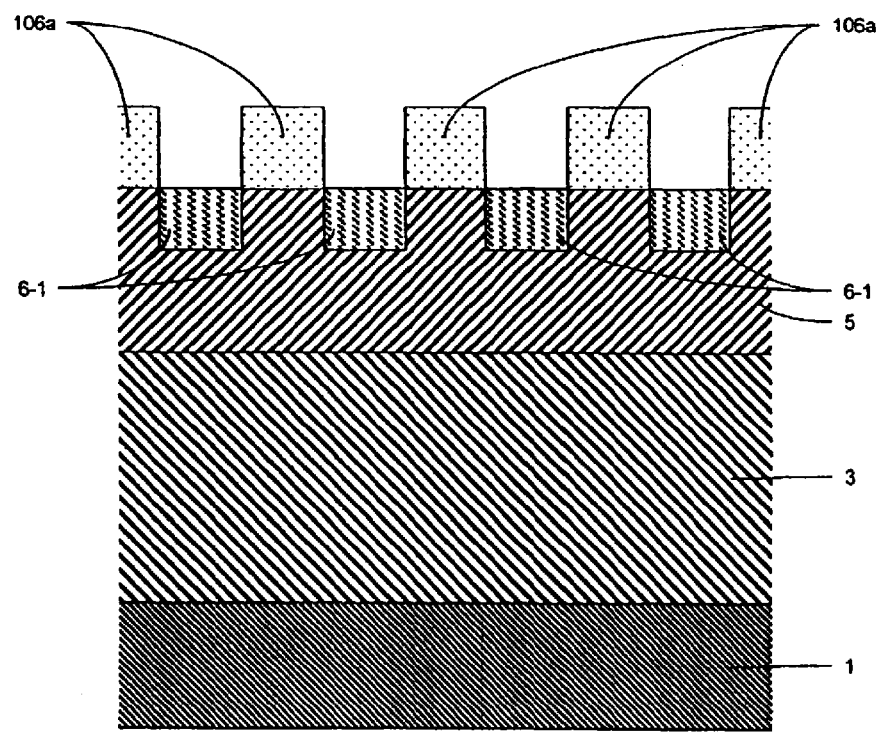
FIG. 2 is a sectional view (No. 2) of a semiconductor wafer showing a method of producing a trench gate type semiconductor device according to Embodiment 1 of the invention.
Figure 3:
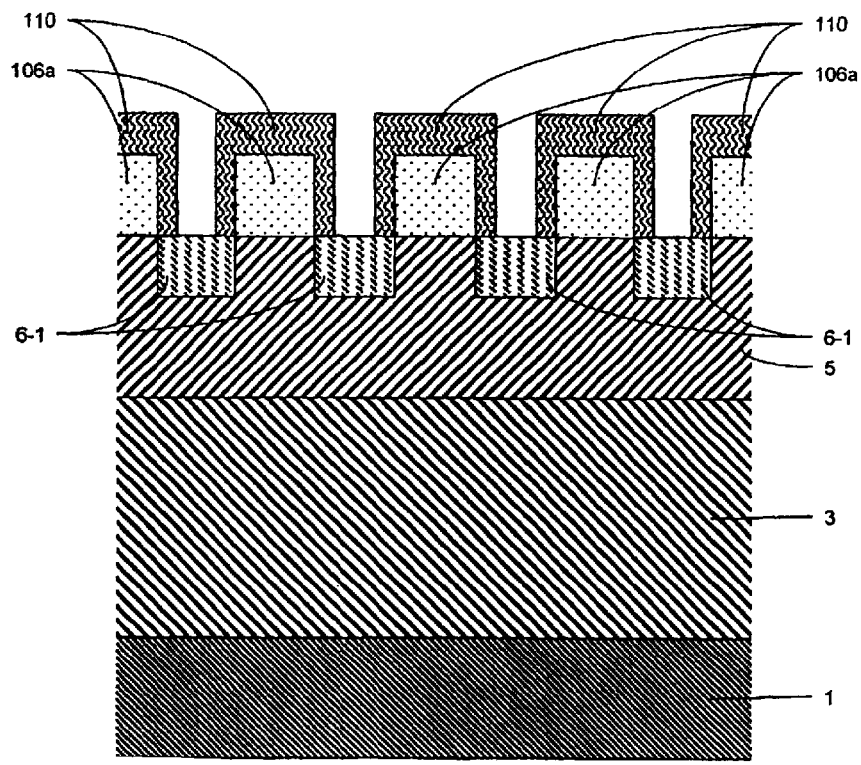
FIG. 3 is a sectional view (No. 3) of a semiconductor wafer showing a method of producing a trench gate type semiconductor device according to Embodiment 1 of the invention.

Then, ion implantation for forming a source region is performed from the first opening portion with use of the first mask 106a to form a source ion-implanted region 6-1. A section at this stage is shown in FIG. 2. Incidentally, when there is a possibility that the source ion-implanted region 6-1 will be degenerated in steps after this step, the first mask 106a may be heat-treated beforehand in such a range that the function of the first mask 106a is not spoiled. The heat-treating process itself may be an activation annealing process. When, for example, the first mask 106a is made of an $SiO_2$ film, heat treatment can be performed at a temperature, for example, up to 1350° C. though the temperature varies according to the film-making condition of the $SiO_2$ film and the heat-treating atmosphere. On the other hand, when heat treatment is performed at a temperature, for example, of 1250° C. or higher, for example, in an inert gas atmosphere, the region of SiC, for example, implanted with a high dose quantity of ions can be sufficiently prevented from being degenerated by an oxidizing atmosphere, for example, for forming the $SiO_2$ film after ion implantation. If surface roughness or surface composition change becomes a barrier to heat treatment, a film of a cap material capable of being selectively removed may be formed on the first mask 106a before heat treatment. When, for example, the first mask 106a contains a $SiO_2$ film as a main component while the semiconductor material is SiC, a commonly known material such as silicon nitride or graphitic carbon can be used. Silicon nitride is also effective for a semiconductor wafer such as AlGaN. It is easy to remove silicon nitride selectively from the $SiO_2$ film with hot phosphoric acid. When the semiconductor material is SiC, graphitic carbon can be removed by an oxygen atmosphere, for example, at 800-900° C. without influence on the $SiO_2$ film while the progress of thermal oxidation of SiC is suppressed if heat treatment is performed appropriately as described above.

Successively, when a predetermined second mask material, for example, of an $SiO_2$ film is formed on the whole area of the wafer surface and anisotropic etching is applied to the whole area of the wafer surface while the first mask 106a is left as it is, a second opening portion can be formed in the bottom of the first opening portion while a second mask 110 for forming a trench 10 is left on the upper and side surfaces of the first mask 106a. It is apparent that the width of the second opening portion of the second mask 110 is narrower by twice of the thickness of the second mask 110 than the width of the first opening portion of the first mask 106a. This is because the second mask not etched is left on the side surface of the first opening portion while the second mask substantially has the original thickness. The second mask 110 is formed while self-aligned with the first mask 106a without any photolithography process. By changing the thickness of a film formed from the second mask material, the width of the opening portion of the second mask 110 can be generally controlled to be narrowed. Accordingly, when the thickness of the second mask is set to be not smaller than one second as large as the width of the first opening portion, the width of the second opening portion disappears.

Figure 4:
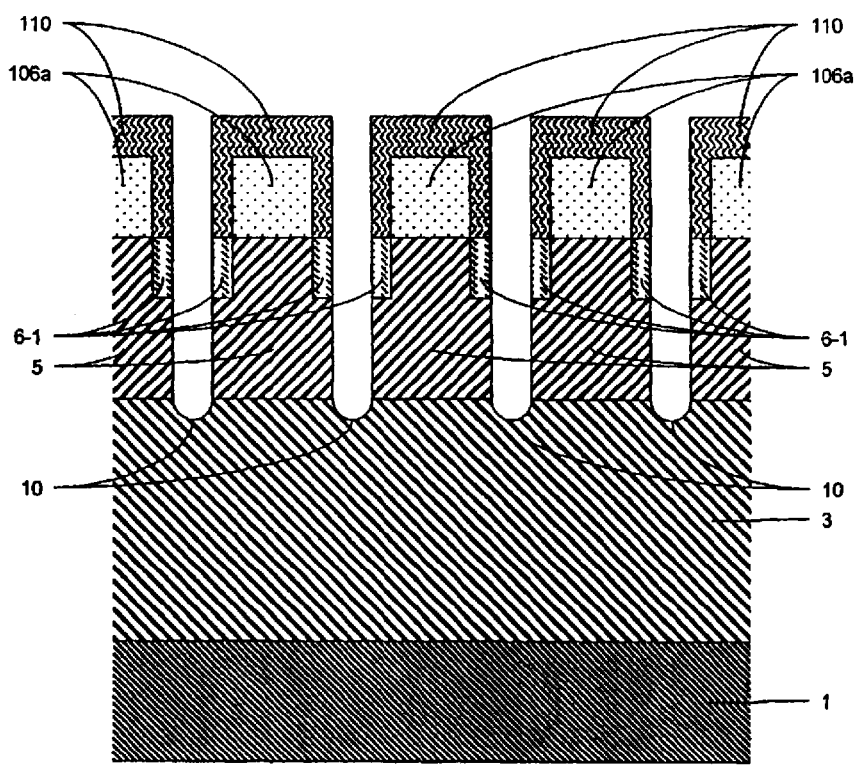
FIG. 4 is a sectional view (No. 4) of a semiconductor wafer showing a method of producing a trench gate type semiconductor device according to Embodiment 1 of the invention.

When anisotropic etching is then performed from the second opening portion with use of the second mask 110, the trench 10 is formed while self-aligned with the source ion-implanted region 6-1. This state is shown in FIG. 4. Then, the second mask 110 and the first mask 106a are removed according to necessity. Then, activation annealing is performed according to necessity to change the source ion-implanted region 6-1 to a source region 6. Then, a gate electrode is embedded in the trench 10 through a gate insulating film until the gate electrode reaches a required height. Further, an interlayer insulating film is formed and a required source electrode is formed. Thus, a trench gate type semiconductor device is completed.

According to the aforementioned method of producing a trench gate type semiconductor device, the cell pitch can be reduced because the source region 6 and the trench 10 can be formed by self-alignment regardless of thermal diffusion. Moreover, as a secondary effect, the trench 10 narrower than the resolution limit of a stepper or the like used can be formed because the width of the trench 10 is smaller than the width of the opening portion of the first mask 106a. When, for example, a g-line stepper described in the related art is used, the width of each trench 10 (without account of side etching) is 0.6 μm on the assumption that the width of each opening portion in the first mask 106a is reduced to a resolution limit (e.g. 1 μm) and the thickness (the lateral length) of the second mask 110 formed on a side wall surface of each opening portion in the first mask 106a is set at 0.2 μm. Because the width of each trench 10 can be reduced in this manner, the production margin at etching back can be enlarged when a conductive substance (e.g. a gate electrode 12 or the like in the related art) to be embedded in each trench 10 is formed by etching back. The aforementioned producing method can be further changed variously as follows by way of example.

Embodiment 2

Figure 5:
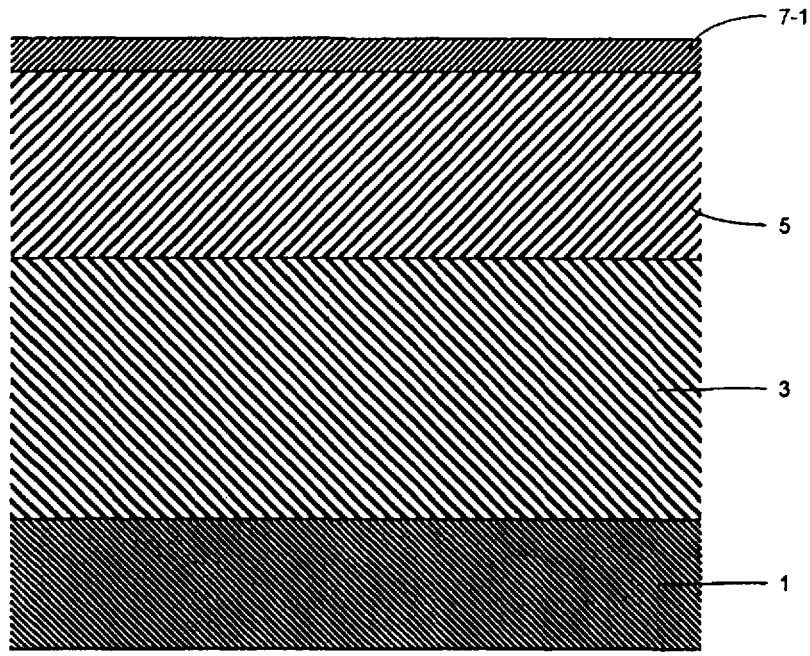
FIG. 5 is a sectional view (No. 1) of a semiconductor wafer showing a method of producing a trench gate type semiconductor device according to Embodiment 2 of the invention.

When nonselective, i.e. full epitaxial growth is an essential or effective method for forming body contact regions 7, a body contact layer 7-1 is first formed on the whole front surface of a body region 5 as shown in FIG. 5. As for the body contact layer 7-1, doping may be performed simultaneously with epitaxial growth to provide a predetermined doping concentration in order to obtain good ohmic contact, or the composition of alloys may be controlled in a growth direction to form a predetermined quantum well structure. Alternatively, the two characteristics may be used in combination. Description will be made topically on the fact that source regions 6, body contact regions 7 and trenches 10 can be formed by self-alignment from the state shown in FIG. 5.

Figure 6:
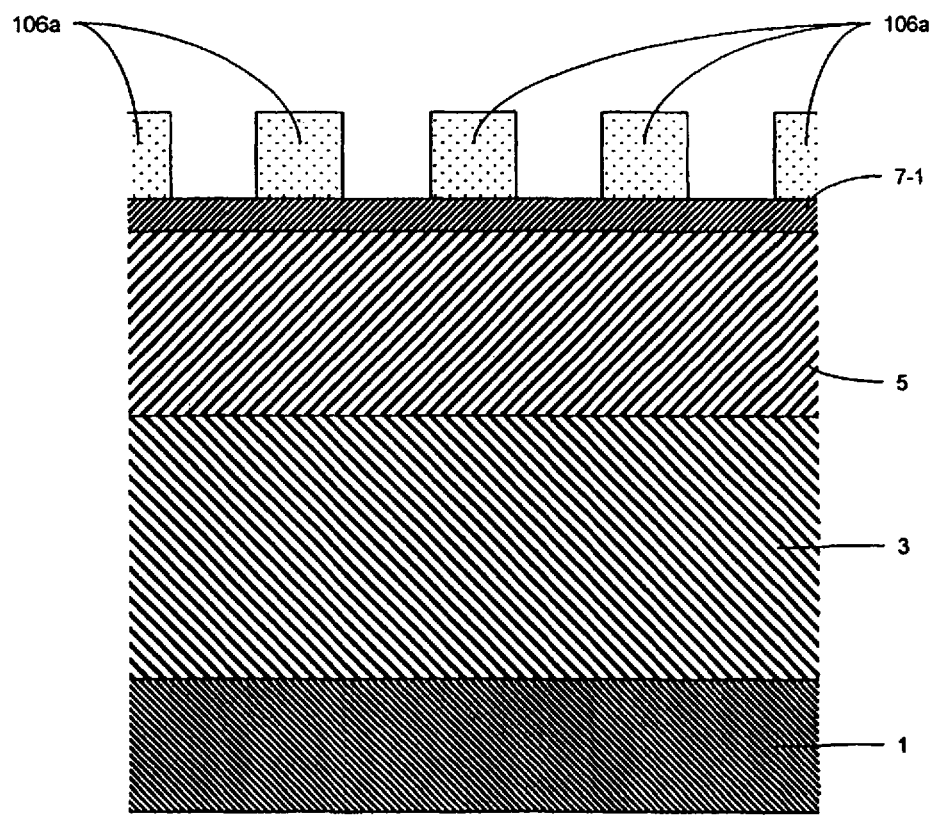
FIG. 6 is a sectional view (No. 2) of a semiconductor wafer showing a method of producing a trench gate type semiconductor device according to Embodiment 2 of the invention.
Figure 7:
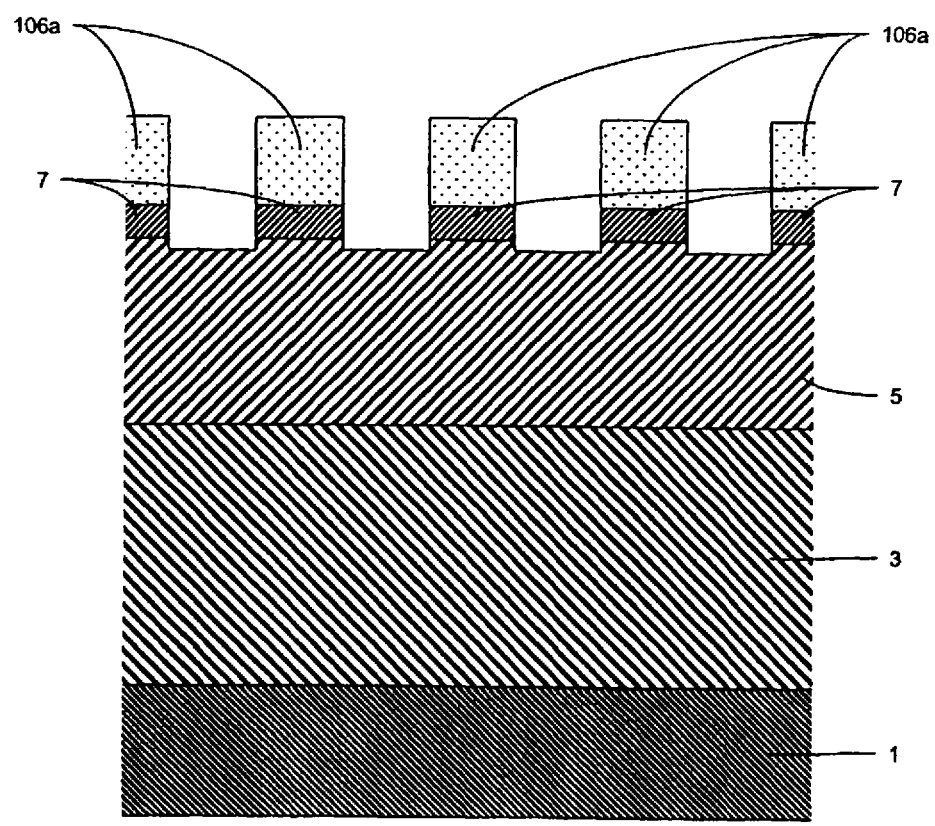
FIG. 7 is a sectional view (No. 3) of a semiconductor wafer showing a method of producing a trench gate type semiconductor device according to Embodiment 2 of the invention.

First, as shown in FIG. 6, a first mask 106a having predetermined first opening portions is formed. Then, anisotropic etching is performed with use of the first mask 106a as a mask to partially remove the body contact layer 7-1 and the body region 5 below the opening portions of the first mask 106a. The remaining part of the body contact layer 7-1 is provided as body contact regions 7. FIG. 7 is a sectional view showing this stage. Incidentally, a protective film such as a screen oxide film may be applied on surfaces of the body regions 5 exposed in the etching bottom in the same manner as in the producing method according to Embodiment 1 before an ion implantation process as a next process.

Figure 8:
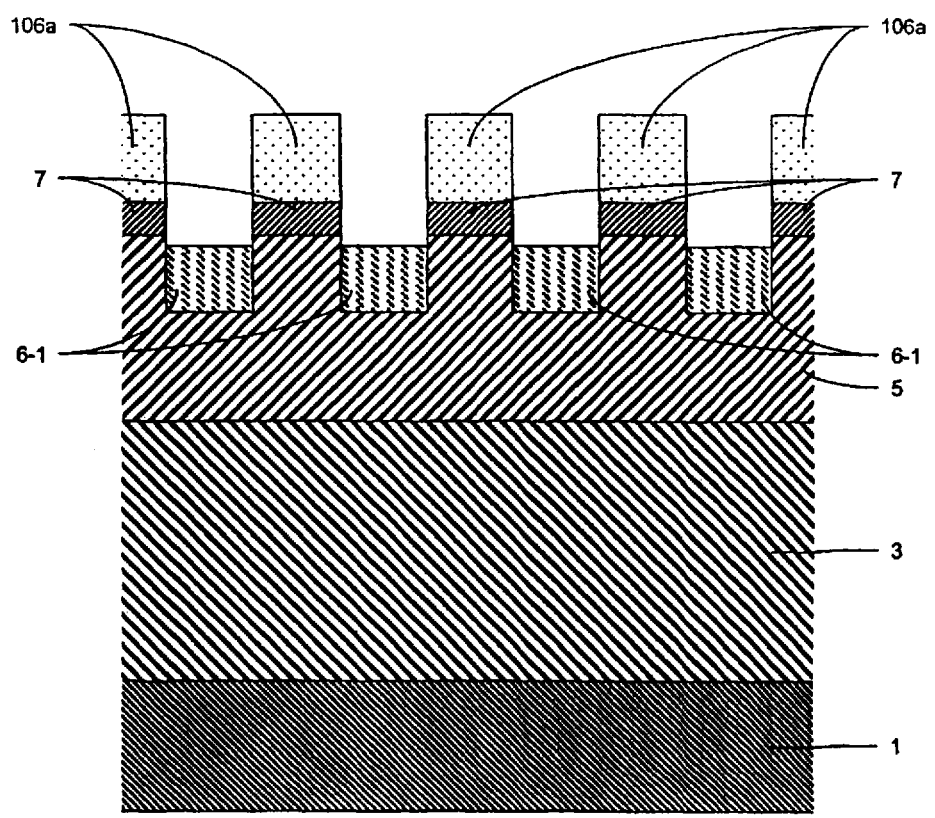
FIG. 8 is a sectional view (No. 4) of a semiconductor wafer showing a method of producing a trench gate type semiconductor device according to Embodiment 2 of the invention.
Figure 9:
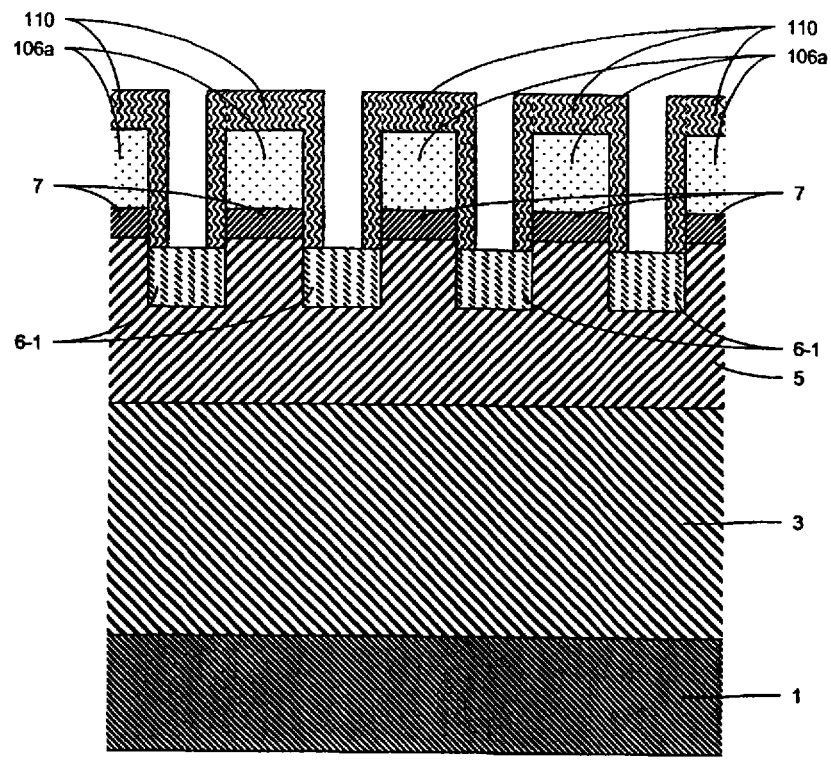
FIG. 9 is a sectional view (No. 5) of a semiconductor wafer showing a method of producing a trench gate type semiconductor device according to Embodiment 2 of the invention.
Figure 10:
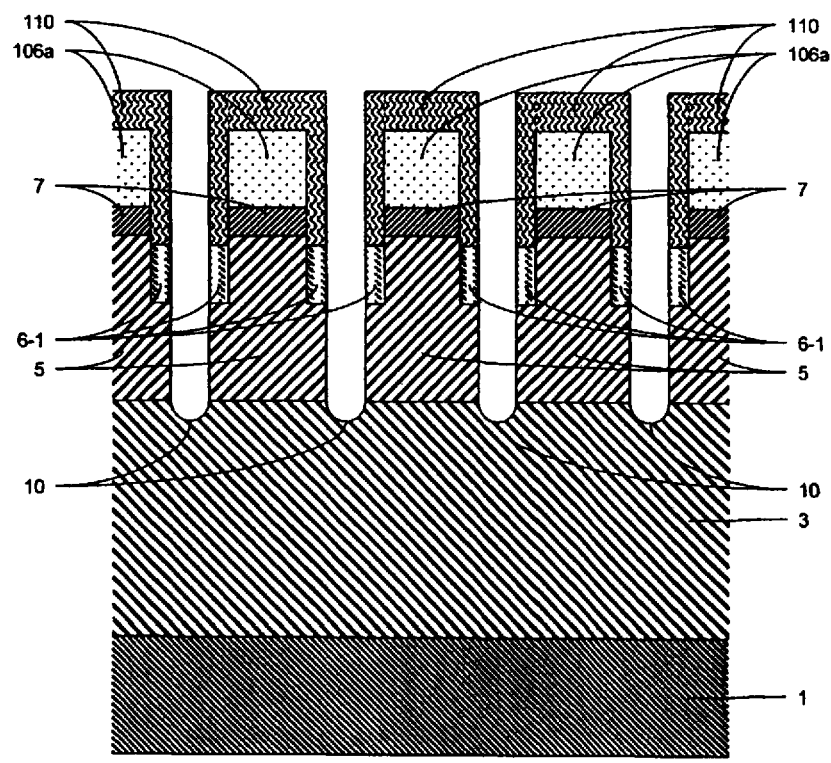
FIG. 10 is a sectional view (No. 6) of a semiconductor wafer showing a method of producing a trench gate type semiconductor device according to Embodiment 2 of the invention.

Successively, ion implantation for forming source regions 6 is performed again from the first opening portions of the first mask 106a to thereby form source ion-implanted regions 6-1. FIG. 8 is a sectional view showing this stage. Incidentally, when there is a possibility that the source ion-implanted regions 6-1 will be degenerated by a post-process, heat treatment or activation annealing may be performed in the same manner as in the producing method according to Embodiment 1 and the temperature for the heat treatment and the cap material provided in accordance with necessity may be the same as in the producing method according to Embodiment 1 because there is no special reason to change these conditions. In addition, selective epitaxial growth may be used in place of ion implantation.

Then, a second mask 110 is formed (FIG. 9) and trenches 10 are self-aligned by further anisotropic etching with use of the second mask as a mask (FIG. 10) in the same manner as in the producing method according to Embodiment 1. Then, the second mask 110 and the first mask 106a are removed. Activation annealing is performed in accordance with necessity to change the source ion-implanted regions 6-1 to source regions 6. The producing method according to Embodiment 2 permits the cell pitch to be reduced because the body contact regions 7 can be formed not due to thermal diffusion but by self-alignment in addition to the source regions 6 and the trenches 10. As a secondary effect, each trench 10 narrower than the resolution limit of the used stepper or the like can be formed in the same manner as in the producing method according to Embodiment 1.

Embodiment 3

Because the producing method according to Embodiment 1 and the producing method according to Embodiment 2 make it possible to form each trench 10 narrower than the resolution limit of the used stepper or the like, the production margin at etching back can be enlarged when a gate electrode or the like to be embedded in each trench 10 is formed by etching back. However, when such a semiconductor material that the temperature for impurity doping due to a thermal diffusion method cannot be said to be practical in an ordinary production process is used, there may occur a second problem that the production margin at etching back is still short because the depth of each source region 6 is limited by the ion implantation device. The producing method according to Embodiment 3 is provided as a modification adapted for such a case.

Figure 11:
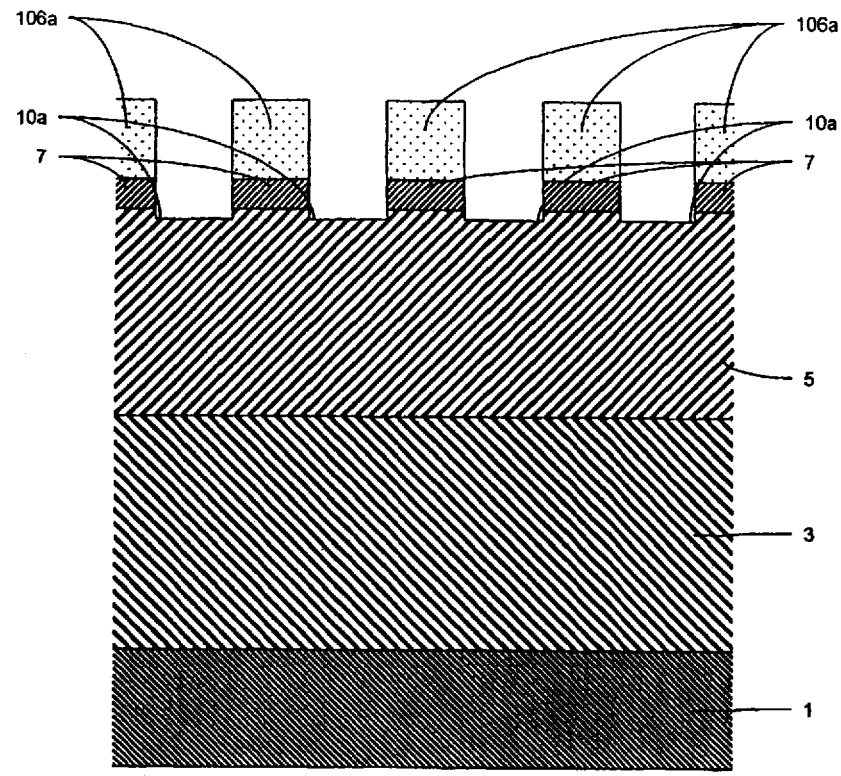
FIG. 11 is a sectional view (No. 1) of a semiconductor wafer showing a method of producing a trench gate type semiconductor device according to Embodiment 3 of the invention.

First, a body contact layer 7-1 is formed on each body region 5 in accordance with necessity. Although this filmforming is not an essential process, description will be made below on the assumption that the body contact layer 7-1 is formed. In the same manner as in the producing method according to Embodiment 2, a first mask 106a having predetermined first opening portions is formed and then anisotropic etching is performed from the first opening portions with use of the first mask 106a as a mask to partially remove the body contact layer 7-1 and the body region 5 in the first opening portions of the first mask 106a to thereby form first trenches 10a. The remaining part of the body contact layer 7-1 is provided as body contact regions 7. FIG. 11 is a sectional view showing this stage.

Figure 12:
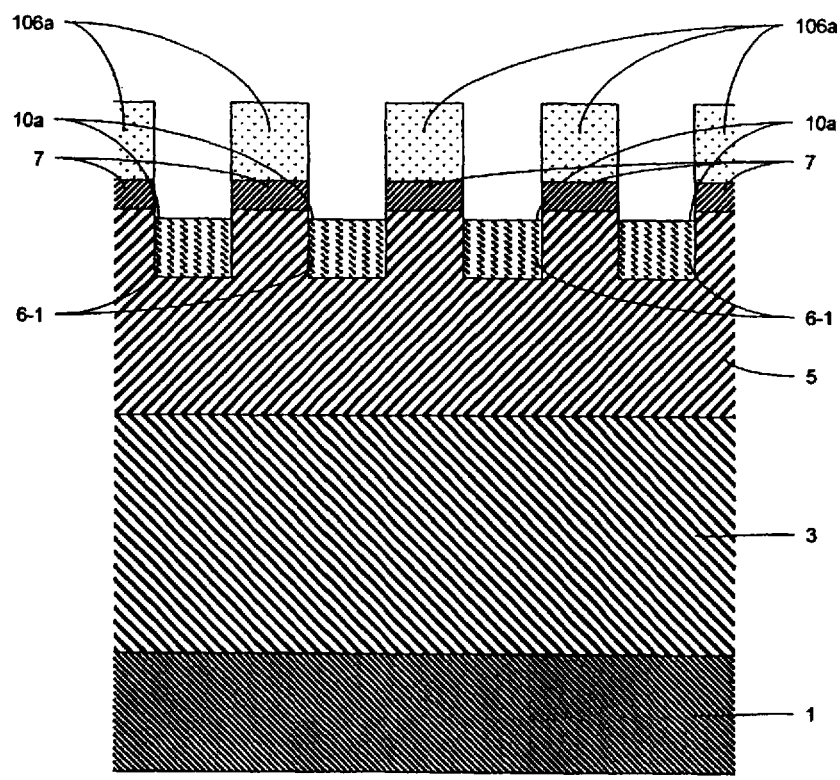
FIG. 12 is a sectional view (No. 2) of a semiconductor wafer showing a method of producing a trench gate type semiconductor device according to Embodiment 3 of the invention.
Figure 13:
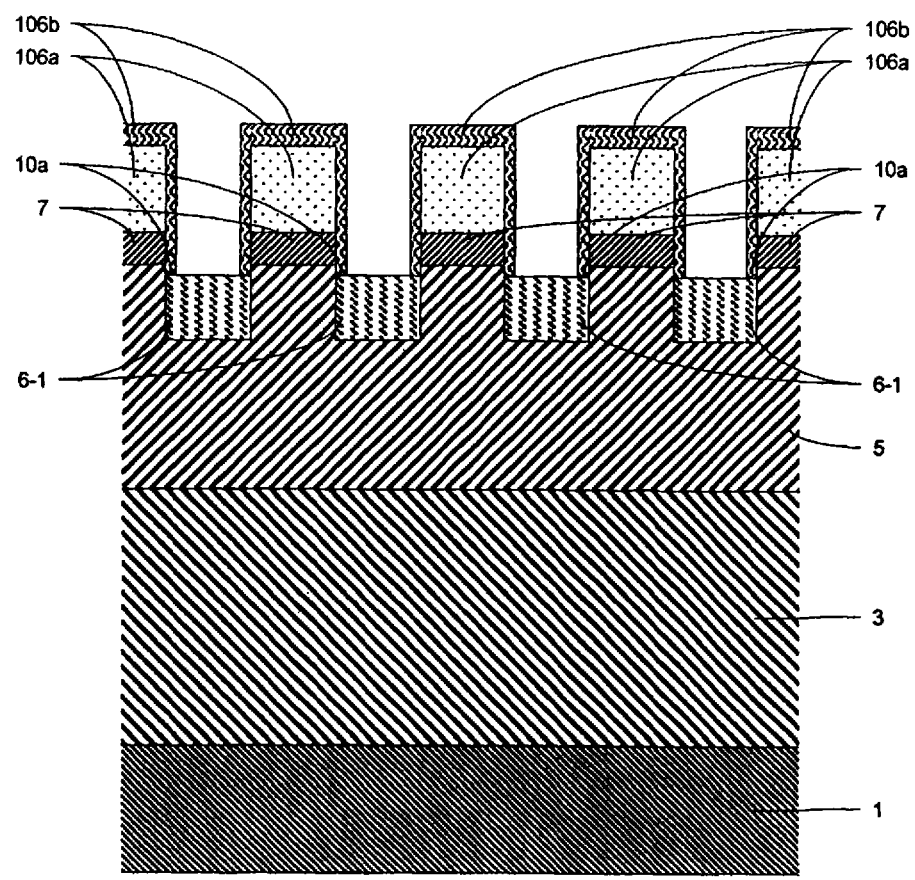
FIG. 13 is a sectional view (No. 3) of a semiconductor wafer showing a method of producing a trench gate type semiconductor device according to Embodiment 3 of the invention.
Figure 14:
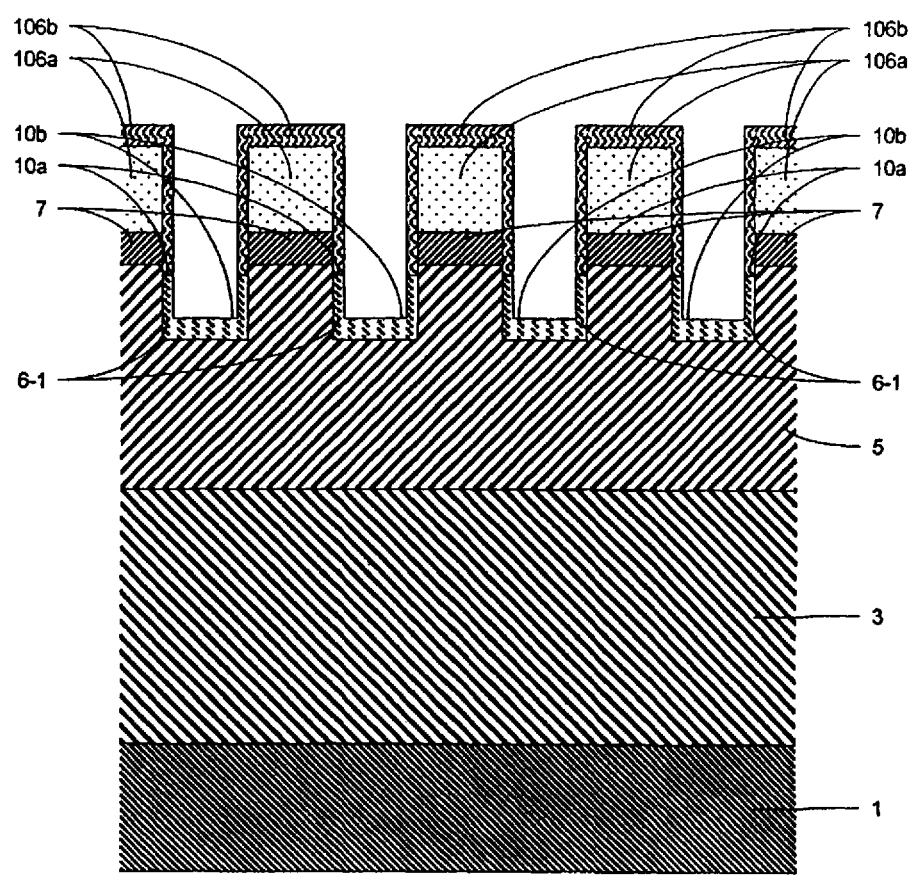
FIG. 14 is a sectional view (No. 4) of a semiconductor wafer showing a method of producing a trench gate type semiconductor device according to Embodiment 3 of the invention.
Figure 15:
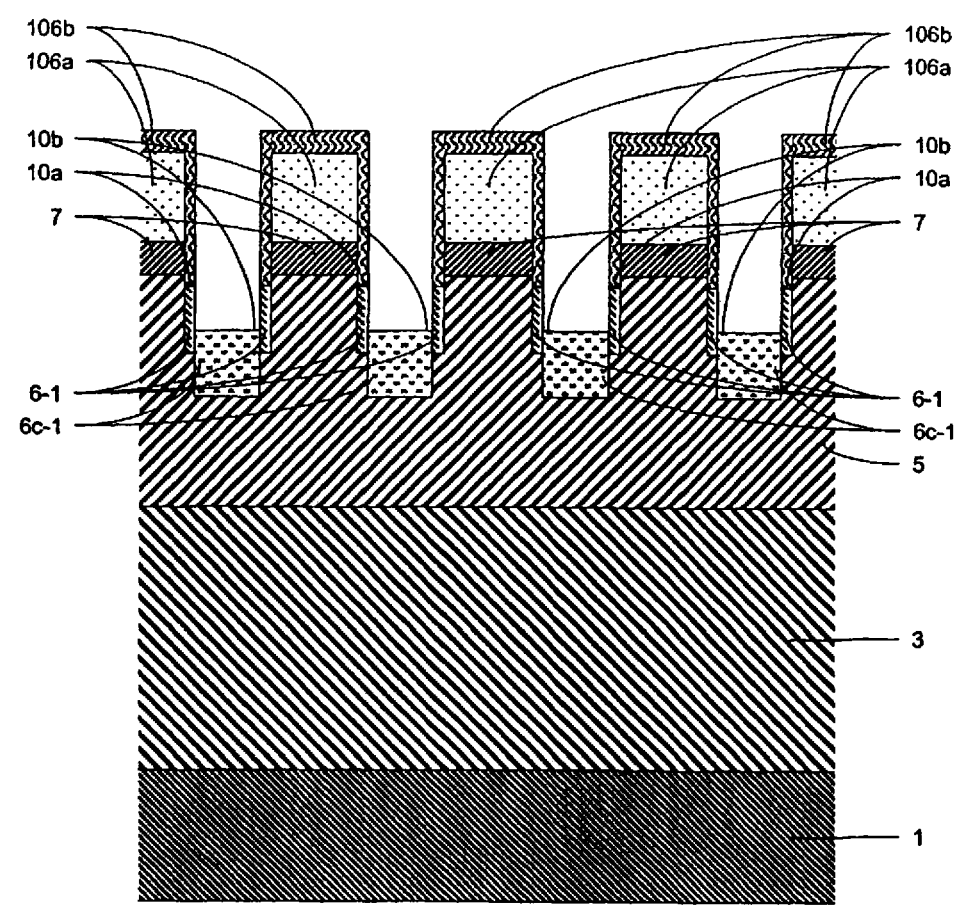
FIG. 15 is a sectional view (No. 5) of a semiconductor wafer showing a method of producing a trench gate type semiconductor device according to Embodiment 3 of the invention.

Successively, ion implantation for forming source regions 6 is performed again from the bottom of each first trench 10a through the first mask 106a to thereby form source ion-implanted regions 6-1. FIG. 12 is a sectional view showing this stage. Incidentally, heat treatment or the like may be performed in accordance with necessity in the same manner as in the producing method according to Embodiment 1 and the producing method according to Embodiment 2. Successively, while the first mask 106a is left, the whole surface of the wafer is coated with a predetermined second mask material, for example, made of an SiO₂ film and then aisotropically etched directly. Consequently, a second mask 106b is formed on upper and side surfaces of the first mask 106a as shown in FIG. 13. When anisotropic etching is performed with use of the second mask 106b as a mask, third trenches 10b are formed while self-aligned with the first trenches 10a as shown in FIG. 14. On this occasion, the bottom of each third trench 10b is set to be located above the corresponding source ion-implanted region 6-1. Then, ion implantation for elongating the source regions 6 is performed again from the bottom of each third trench 10b through the first and second masks 106a and 106b to thereby form source elongation ion-implanted regions 6c-1. On this occasion, the bottom of each source elongation ion-implanted region 6c-1 can be located below the bottom of the corresponding source ion-implanted region 6-1. FIG. 15 is a sectional view showing this stage. Incidentally, heat treatment or the like may be performed in accordance with necessity in the same manner as in the source ion-implanted regions 6-1.

Figure 16:
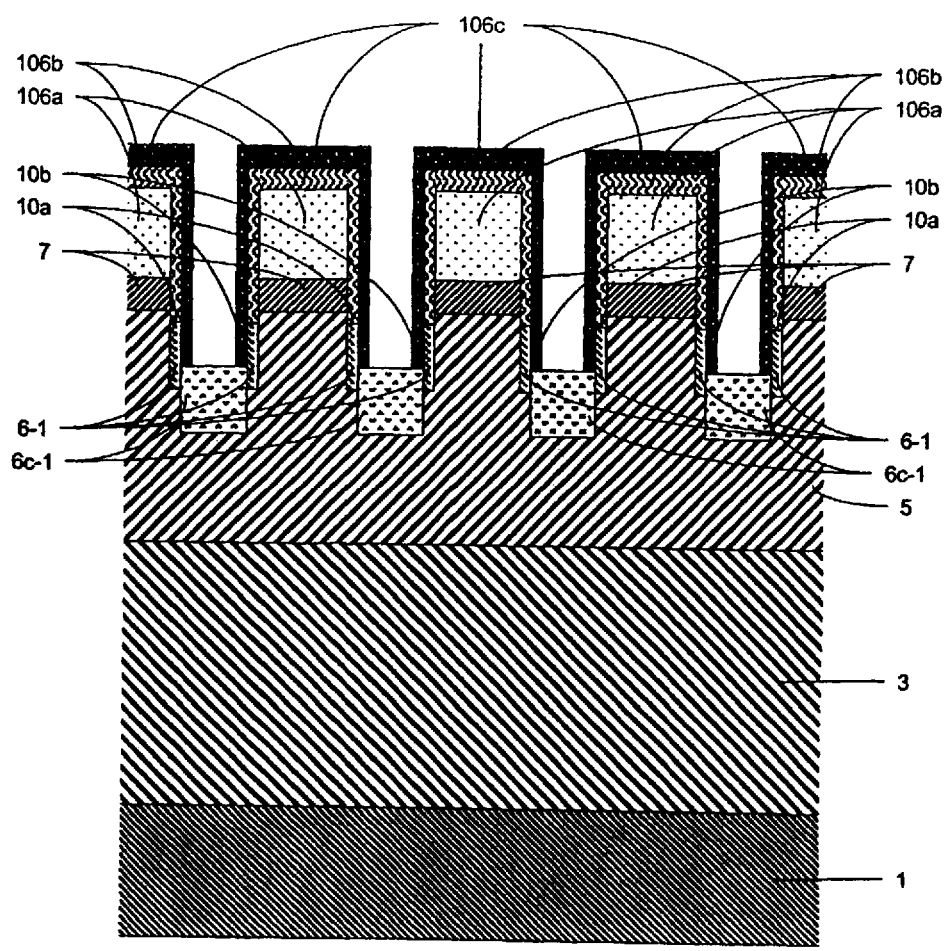
FIG. 16 is a sectional view (No. 6) of a semiconductor wafer showing a method of producing a trench gate type semiconductor device according to Embodiment 3 of the invention.
Figure 17:
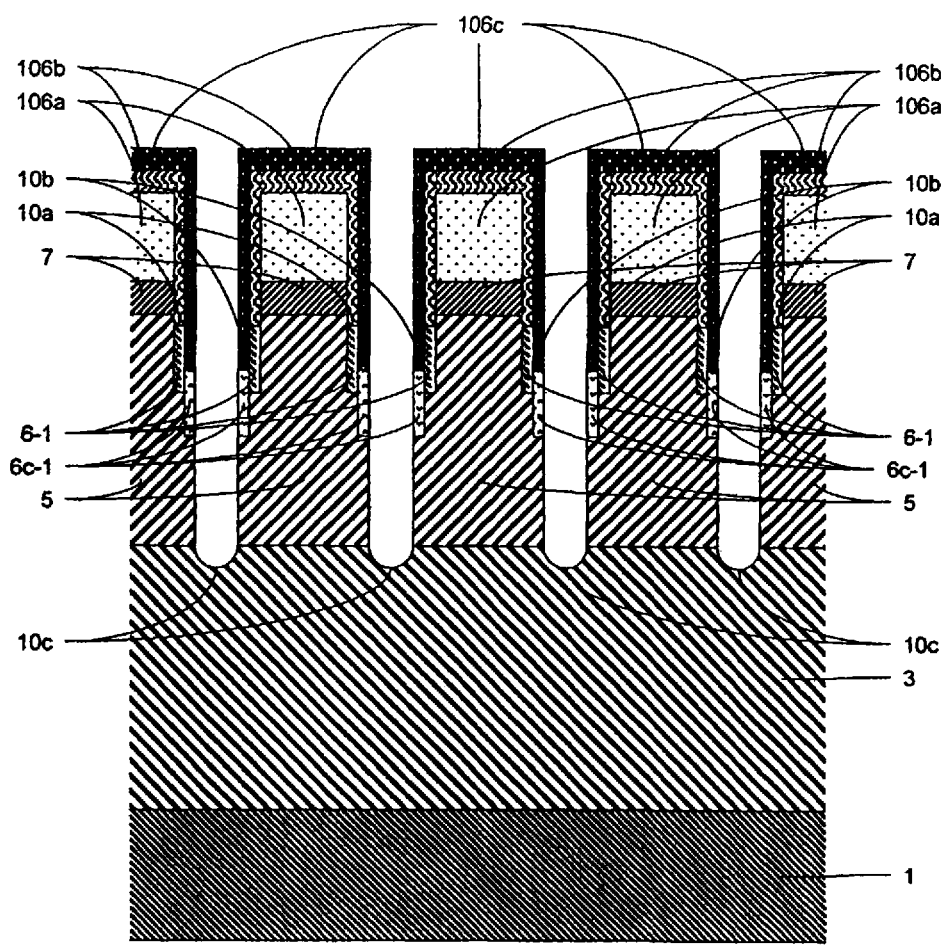
FIG. 17 is a sectional view (No. 7) of a semiconductor wafer showing a method of producing a trench gate type semiconductor device according to Embodiment 3 of the invention.

Successively, while the first mask 106a and the second mask are left, the whole surface of the wafer is further coated with a predetermined third mask material, for example, made of an SiO₂ film and etched anisotropically with respect to the third mask. Consequently, as shown in FIG. 16, the third mask 106c remains on upper and side surfaces of the second mask 106b, so that a third opening portion is formed in the bottom of each third trench 10b. When anisotropic etching is performed with use of the third mask 106c as a mask, second trenches 10c are formed while self-aligned with the third trenches 10b as shown in FIG. 17. Then, the third mask 106c, the second mask 106b and the first mask 106a are removed. Activation annealing is performed in accordance with necessity to merge each source ion-implanted region 6-1 and the corresponding source elongation ion-implanted region 6c-1 into a source region 6. The producing method according to Embodiment 3 permits the source regions 6, the first trenches 10a, the third trenches 10b, the second trenches 10c and the body contact regions 7 in accordance with necessity to be formed while self-aligned with one another. Since the distance between the top and bottom surfaces of each source region 6 can be made larger than the maximum implantation depth decided by the ion implantation device, the production margin at etching back can be enlarged when a gate electrode or the like to be embedded in each trench 10 is formed by etching back. Or the production margin at etching back can be enlarged for two or more kinds of different gate electrodes or the like to be embedded. Incidentally, when the production margin at etching back is still short, the same process as the process of forming the second mask 106b, formation of the third trenches 10b and the source elongation ion-implanted regions 6c-1 may be repeated by a necessary number of times before the third mask 106c is formed.

Embodiment 4

Figure 18:
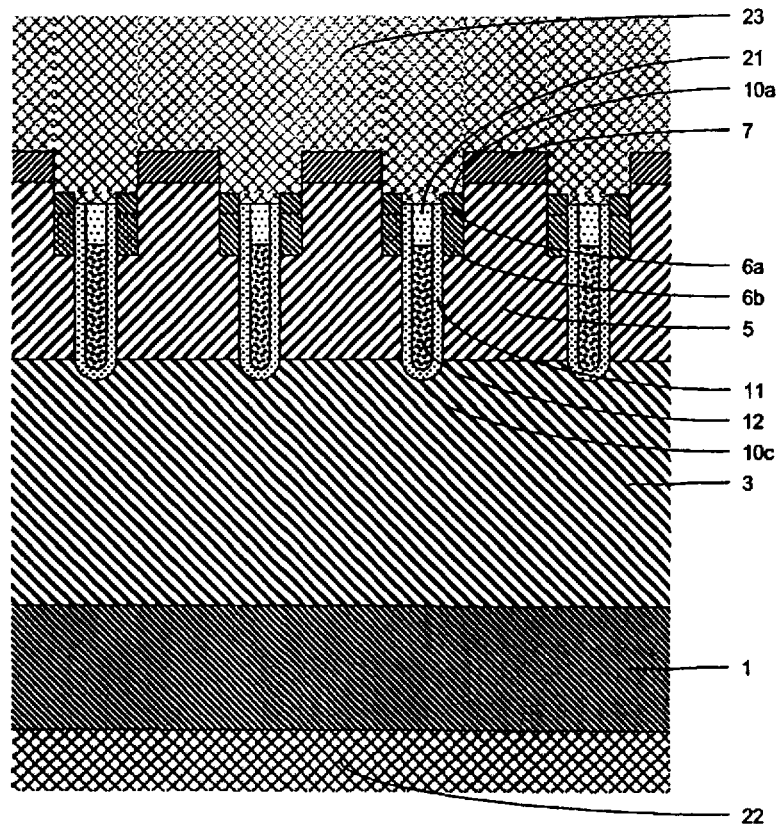
FIG. 18 is a sectional view (No. 1) of important part of a unit cell portion of an SiC trench gate type MOSFET according to Embodiment 4 of the invention.

FIG. 18 is a sectional view showing important part of each unit cell portion. An SiC trench gate type MOSFET shown in FIG. 18 will be described as Embodiment 4. An n-type voltage withstanding layer 3, a p-type body region 5 and a highly doped p-type body contact region 7 are laminated successively on an n-type SiC substrate 1 with a high doping concentration (high impurity concentration). First trenches 10a are formed so as to pierce the body contact region 7 from the wafer surface and reach the body region 5. A highly doped n-type source contact region 6a is formed on a surface of the body region 5 exposed in the bottom of each first trench 10a. A source extension region 6b is formed just under each source contact region 6a. Second trenches 10c are formed while self-aligned with the first trenches 10a without any photolithography process so that each second trench 10c pierces the corresponding source contact region 6a, the corresponding source extension region 6b and the remaining part of the body region 5 from the bottom of the corresponding first trench 10a and reaches the voltage withstanding layer 3. A producing method for self-alignment will be described later. A gate electrode 12 is embedded in the inside of each second trench 10c through a gate insulating film 11 to a height to face at least part of the source extension region 6b and the voltage withstanding layer 3 and the body region 5. An interlayer insulating film 21 is further embedded in each second trench 10c so as to be located on the gate electrode 12. Each gate electrode 12 is electrically insulated from a source electrode 23 by the interlayer insulating film 21. The source electrode 23 forms ohmic contact with a surface of the source contact region 6a in an upper portion of the recess of the first trench 10a and covers surfaces of the body contact regions 7 to form ohmic contact. A drain electrode 22 is in ohmic contact with the other principal surface (referred to as rear surface) of the substrate 1.

Although FIG. 18 shows the drain electrode 22 and the source electrode 23 as if each of them were made of one kind of material, a portion being actually in contact with the SiC wafer surface is such a laminated film that nickel, titanium and aluminum are laminated successively on the SiC wafer surface as described in the related art. The thickness, width, doping quantity or concentration, etc. of each constituent member should be decided appropriately in accordance with required characteristic such as withstand voltage and required production error. When the withstand voltage is, for example, 1.2 kV, the voltage withstanding layer 3 has a doping concentration, for example, of $1 \times 10^{16}$ cm$^{-3}$ and a thickness, for example, of 10 µm and each body region 5 has a doping concentration, for example, of $2 \times 10^{17}$ cm$^{-3}$ and a thickness (which is a distance between the corresponding source extension region 6b and the voltage withstanding layer 3 and equal to the channel length), for example, of 1.5 µm. As for the surface of each body contact region 7, when aluminum is used, it is preferable that the effective aluminum concentration (which means an electrically active acceptor concentration remaining as a result of compensation etc. for donors) is not lower than $2 \times 10^{19}$ cm$^{-3}$ in order to obtain ohmic contact with nickel. Incidentally, the effective aluminum concentration of slightly lower than $2 \times 10^{19}$ cm$^{-3}$ can be put into practical use if it has no large influence on on-state-resistance. However, in practice, as the effective aluminum concentration becomes higher in a range where epitaxial growth is allowed, the result becomes better if fatal surface roughness does not occur. The thickness of each body contact region 7 can be set, for example, at 0.5 µm because the body contact region 7 may be thin if the thickness of each body contact region 7 can be controlled by epitaxial growth so that the body contact region 7 is sufficiently thick to avoid the risk that the body contact region 7 will be lost carelessly in a post producing process. Each source contact region 6a is doped with phosphorus, for example, to obtain a box profile of $2 \times 10^{20}$ cm$^{-3}$. Because the maximum acceleration energy of monovalent phosphorus ions in a general ion implantation device is, for example, about 350 keV, the depth of the source contact region 6a is, for example, about 0.35 µm. When nitrogen smaller in mass than phosphorus is used in each source extension region 6b located under the source contact region 6a, ions can be implanted into a more or less deeper position even by the same acceleration energy. However, use of another element such as phosphorus is not excluded. When divalent nitrogen ions are used and accelerated at 700 keV, the implantation depth can be set at about 0.8 µm. The doping quantity is set, for example, at $5 \times 10^{18}$ cm$^{-3}$ because crystal defects are produced frequently to probably cause lowering of withstand voltage yield rate when the impurity concentration is too high. In this case, the depth of the source extension region 6b from the front surface (not the bottom) of the source contact region 6a is slightly smaller than 0.9 µm based on a tail formed at ion implantation. Although the width, etc. of each trench varies widely according to the performance of the used stepper or the like, the case where the g-line stepper described in the related art is used will be described as an example for comparison with the related art. In this case, the width of each first trench 10a is, for example, 1 µm and the distance (equal to the cell pitch) between center lines of adjacent ones of the first trenches 10a is, for example, 2 µm. The width of each second trench 10c is, for example, 0.6 µm and the width of the voltage withstanding layer 3 put between adjacent ones of the second trenches 10c in this case is 1.4 µm. A (0001) Si-face or (000-1) C-face of hexagonal silicon carbide high in dielectric breakdown electric field is preferred as the plane direction of the substrate 1 to obtain a high withstand voltage. Incidentally, because a semiconductor substrate practically provided with off-angles of several degrees to obtain well epitaxially grown layers on these faces is available on the market, the (0001) Si-face or (000-1) C-face should be interpreted as containing these off-angles. To obtain a large production margin simultaneously with high channel mobility on a side wall surface of each trench, the (000-1) C-face is preferably used so that the direction of stretching of each trench in the wafer surface can be turned to a <11-20> direction (off-angle direction if possible). In the related art, an n-type layer called current spread layer was provided between the voltage withstanding layer 3 and the body region 5 because the cell pitch of unit cells was large. However, in Embodiment 4, the current spread layer need not be formed because the distance between adjacent ones of the second trenches 10c is so narrow that the effect of reducing electric resistance of the voltage withstanding layer 3 cannot be substantially obtained even when the current flow path is spread to a wide range of the voltage withstanding layer 3 by the current spread layer. More in detail, because the width of the voltage withstanding layer 3 put between adjacent ones of the second trenches 10c is, for example, 1.4 µm as described above, the effective width is, for example, only 0.7 µm from the interface between the body region 5 and the voltage withstanding layer 3 if the current is spread based on a 45 degree rule. The thickness of the voltage withstanding layer 3 is, for example, no smaller than 10 µm though the current flow path is spread to the whole region of the voltage withstanding layer 3. Moreover, a production error, for example, of about 10% is included in the doping concentration of the voltage withstanding layer 3, a production error of about 10% is also included in the electric resistance of the voltage withstanding layer 3. Because the quantity of reduction of resistance by the current spread layer is estimated at 7% (0.7 µm per 10 µm) at the most (in practice, smaller than 7%), it is originally in the production error range. On the other hand, because the current spread layer has a relatively high doping concentration, the allowable production error range for keeping a required withstand voltage is narrow. For this reason, Embodiment 4 dispenses with the current spread layer. However, provision of a relatively highly doped n-type layer similar to the current spread layer is not excluded when there is a special reason such as required for applying edge termination. Similarly, an n-type layer called field stopping layer may be provided between the substrate 1 and the voltage withstanding layer 3. Although a structure in which the n type and the p type are replaced by each other can be used, it is preferable that electrons are majority carriers because mobility of electrons is larger than that of holes in SiC like Si. Accordingly, it is preferable that the aforementioned conductivity type structure is used.

Figure 19:
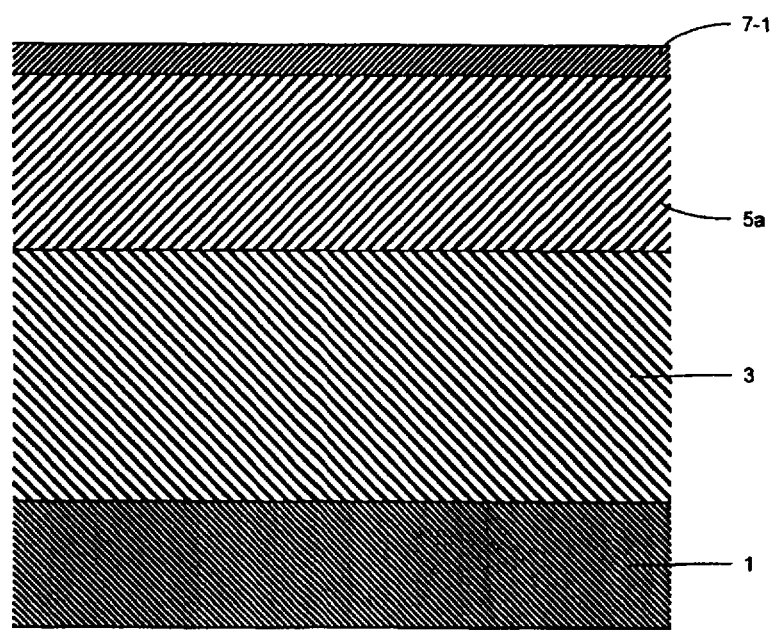
FIG. 19 is a sectional view (No. 2) of important part of a unit cell portion showing a method of producing an SiC trench gate type MOSFET according to Embodiment 4 of the invention.

The method of producing the trench gate type MOSFET shown in FIG. 18 will be described in due order with reference to FIGS. 19 to 22. First, as shown in FIG. 19, a voltage withstanding layer 3, a body layer 5a and a body contact layer 7-1 are formed successively on a substrate 1 by epitaxial growth. The doping concentration and thickness of the voltage withstanding layer 3 are, for example, $1 \times 10^{16}$ cm$^{-3}$ and 10 µm, respectively, as described above. The thickness of the body layer 5a is, for example, 2.7 µm.

Figure 20:
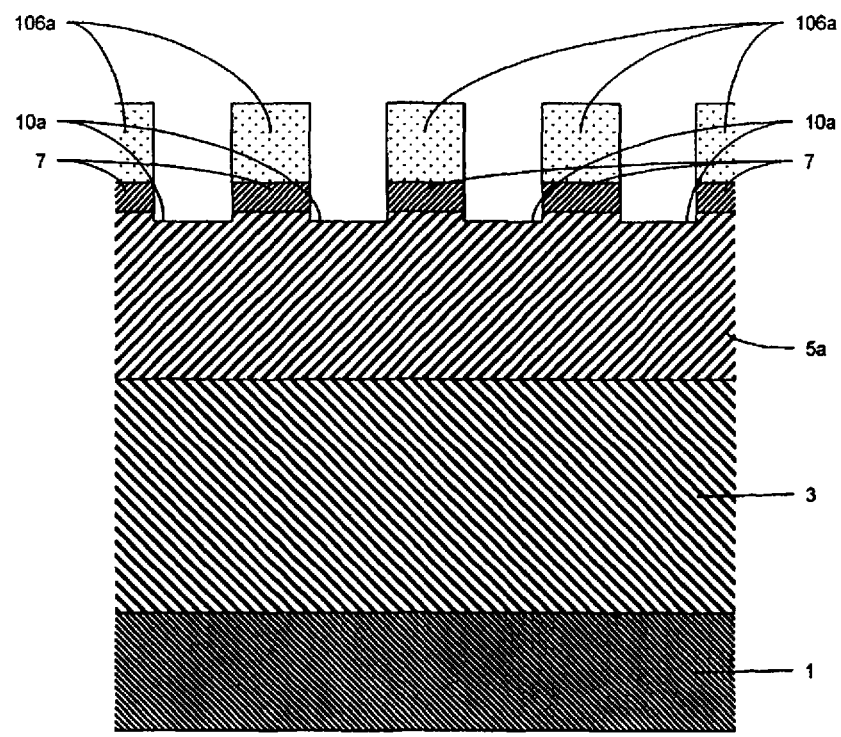
FIG. 20 is a sectional view (No. 3) of important part of a unit cell portion showing a method of producing an SiC trench gate type MOSFET according to Embodiment 4 of the invention.

Then, as shown in FIG. 20, an SiO$_2$ film, for example, 2.5 µm thick is formed on the whole surface of the wafer by plasma CVD (which may be replaced by LPCVD. The same rule will apply hereinafter) and then patterned to form a first mask 106a. The width of each opening portion in the first mask 106a is, for example, 1 µm whereas the width of each of remaining portions of the first mask 106a is, for example, 1 µm. Successively, SiC is etched anisotropically with use of the first mask 106a to form first trenches 10a which pierce the body contact layer 7-1 and reach the body layer 5a. The remaining part of the body contact layer 7-1 is provided as body contact regions 7. FIG. 20 is a sectional view showing this state.

Figure 21:
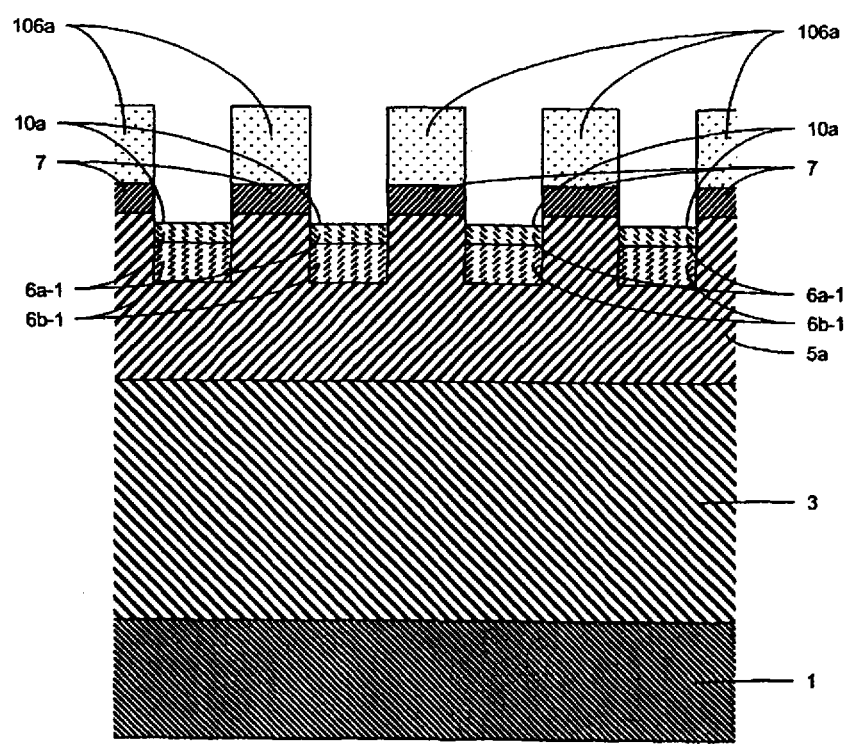
FIG. 21 is a sectional view (No. 4) of important part of a unit cell portion showing a method of producing an SiC trench gate type MOSFET according to Embodiment 4 of the invention.

Then, as shown in FIG. 21, monovalent or divalent nitrogen ions are implanted into the wafer kept at a temperature, for example, of 500° C. through the first mask 106a to thereby form source extension ion-implanted regions 6b-1 having the same doping concentration profile as the source extension regions 6b. Similarly, monovalent phosphoric ions are implanted into the wafer kept at a temperature, for example, of 500° C. to thereby form source contact ion-implanted regions 6a-1 having the same doping concentration profile as the source contact regions 6a. Incidentally, the order of ion implantation for the source contact ion-implanted regions 6a-1 and the source extension ion-implanted regions 6b-1 may be reversed.

Then, heat treatment is performed in an inert gas in accordance with necessity so that the source contact ion-implanted regions 6a-1 and the source extension ion-implanted regions 6b-1 are not degenerated. If the temperature for heat treatment is not higher than 1350° C., the SiO$_2$ film is not decomposed or evaporated spontaneously violently. When at least nitrogen or argon is selected as the inert gas, it is safe that some selectively removable cap is applied to the first mask 106a. For example, silicon nitride or graphitic carbon is preferably used as the cap material because it is heat-resistant, stable in a nitrogen or argon atmosphere and selectively removable with respect to the SiO$_2$ film. The lower limit of the temperature for heat treatment needs to be set so that the source contact ion-implanted regions 6a-1 and the source extension ion-implanted regions 6b-1 are not degenerated in a post process. For example, this condition is satisfied if the temperature is not lower than 1250° C. From the above, the temperature for heat treatment is set, for example, at 1300° C. After heat treatment, the cap material is removed but the first mask 106 has to be left. Silicon nitride can be selectively removed with hot phosphoric acid. Graphitic carbon can be removed when, for example, it is treated in an oxygen atmosphere at 800-900° C. FIG. 21 is a sectional view of important part of the wafer showing this stage.

Figure 22:
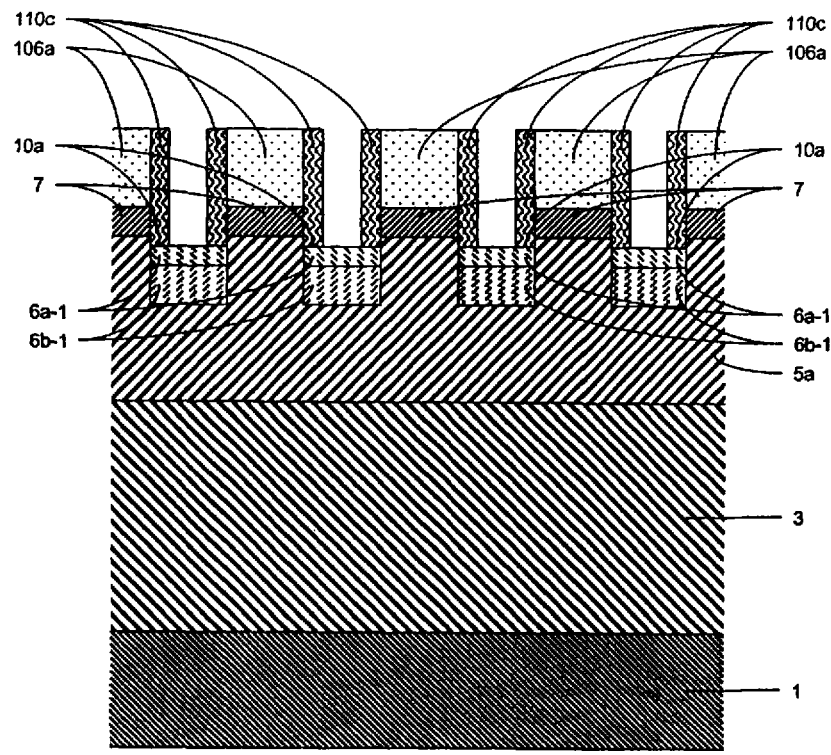
FIG. 22 is a sectional view (No. 5) of important part of a unit cell portion showing a method of producing an SiC trench gate type MOSFET according to Embodiment 4 of the invention.

Successively, an SiO$_2$ film is formed again on the whole surface of the wafer by plasma CVD. On this occasion, the thickness of the SiO$_2$ film needs to be selected so that the thickness (lateral length) of a second mask 110c which will be formed on a side wall surface of each opening portion in the first mask 106a is a predetermined thickness, for example, of 0.2 µm. Then, the SiO$_2$ film is etched anisotropically on the whole surface of the wafer until the bottom of each first trench 10a is exposed. Thus, a second mask 110c is formed. FIG. 22 is a sectional view of important part of the wafer showing this stage. Incidentally, because the SiO$_2$ film formed on the upper surface of the first mask 106a is almost extinguished by anisotropic etching, FIG. 22 is a view showing a state where the second mask 110c is formed only on a side wall surface of each opening portion in the first mask 106a. The second mask 110c may be left on the upper surface of the first mask 106a in accordance with the production condition for anisotropic etching. A part of the first mask 106a may be etched and removed by the anisotropic etching process. Either may be allowed if the sum of the first mask 106a and the second mask 110c (if any) remaining on the upper surface of the first mask 106a can tolerate the post process sufficiently.

Figure 23:
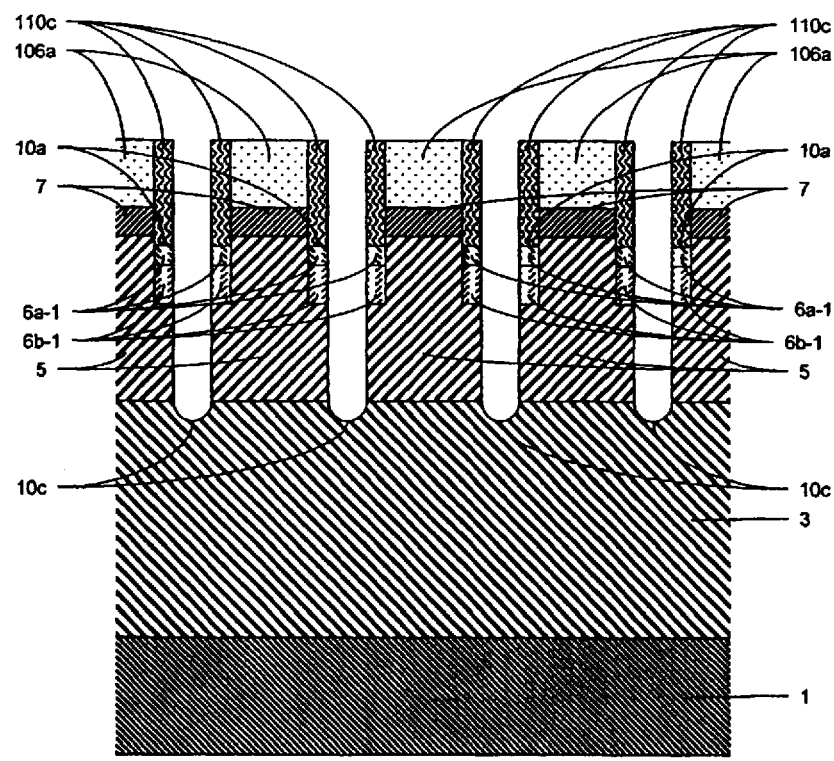
FIG. 23 is a sectional view (No. 6) of important part of a unit cell portion showing a method of producing an SiC trench gate type MOSFET according to Embodiment 4 of the invention.

Then, SiC is etched anisotropically with use of the second mask 110c and the first mask 106a to form second trenches 10c each of which pierces the source contact ion-implanted region 6a-1, the source extension ion-implanted region 6b-1 and the body layer 5a and reaches the voltage withstanding layer 3. The width of each second trench is 0.6 µm. The width of each second trench can be controlled by the thickness of the second mask 110c. If the thickness of the second mask is set to be not smaller than one second as large as the width of each first trench, the width of each second trench is lost. It is therefore necessary to set the thickness of the second mask to be smaller than one second as large as the width of each first trench. Each remaining part of the body layer 5a put between adjacent ones of the second trenches 10c is provided as a body region 5. FIG. 23 is a sectional view of important part of the wafer showing this stage. On this occasion, the self-alignment means that the narrow second trenches 10c can be formed on the respective bottoms of the first trenches 10a without any photolithography process. Because the second trenches 10c can be formed by self-alignment without mask alignment, mask alignment error caused by mask alignment can be eliminated so that the cell pitch can be reduced accordingly.

Then, the second mask 110c and the first mask 106a are removed. For example, the wafer can be soaked in hydrofluoric acid. Then, activation annealing is performed, for example, in an inert gas atmosphere (which may contain a small amount of $SiH_4$ or the like), for example, at 1700° C. to change the source contact ion-implanted regions 6a-1 and the source extension ion-implanted regions 6b-1 to source contact regions 6a and source extension regions 6b respectively. Then, a process of flattening the rough inner wall surface of each trench is performed in accordance with necessity. In addition, sacrificial oxidation process may be performed in accordance with necessity.

Figure 24:
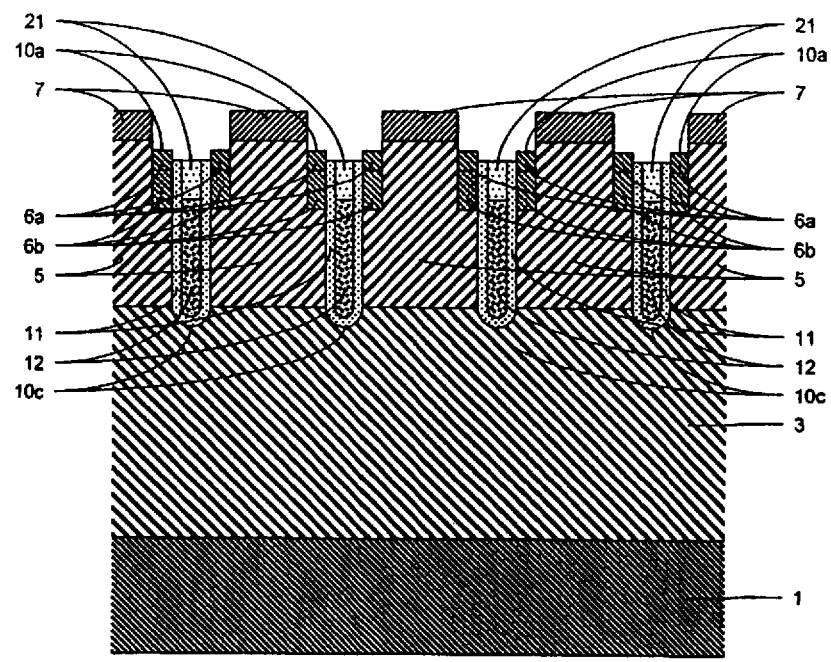
FIG. 24 is a sectional view (No. 7) of important part of a unit cell portion showing a method of producing an SiC trench gate type MOSFET according to Embodiment 4 of the invention.

Then, a gate insulating film 11 is formed on an inner wall surface of each second trench 10c. On this occasion, there is a risk that the source contact regions 6a may be extinguished undesirably when only an attempt to obtain a required thickness by thermal oxidation is executed. It is therefore preferable that an $SiO_2$ film is deposited by means of LPCVD or the like and then reformed into a gate insulating film 11 by post-oxidation annealing. Successively, a film of highly doped polycrystalline silicon is formed on the whole surface of the wafer to protect the vicinity of each gate pad (not shown) and then etched back to embed a gate electrode 12 in the inside of each second trench 10c in the same manner as in the Si trench gate type MOSFET etc. according to the related art. Similarly, an appropriately doped $SiO_2$ film is formed on the whole surface of the wafer and etched back appropriately to thereby embed an interlayer insulating film 21 in the inside of each second trench 10c. The width of each second trench is, for example, 0.6 μm. Accordingly, there is a production margin enough to embed both the gate electrode 12 and the interlayer insulating film 21 in each second trench 10c if the interlayer insulating film 21 is not too thick. FIG. 24 is a sectional view of important part of the wafer showing this stage.

In the following process, for example, a nickel film and a titanium film are formed successively by sputtering and patterned in the same manner as in the SiC trench gate type MOSFET according to the related art. Incidentally, nickel and titanium (or a reaction product of these and SiC) may remain on the whole surface of each unit cell portion because there is no pattern to be aligned with each unit cell portion when patterning is performed. Heat treatment, formation and patterning of an aluminum film or the like and a rear surface process are the same as in the SiC trench gate type MOSFET according to the related art.

In the aforementioned manner, the SiC trench gate type MOSFET shown in FIG. 18 is finished. The on-state-resistance of the finished SiC trench gate type MOSFET is, for example, about 3.5 $mΩcm^2$. The channel resistance estimated from mutual conductance is, for example, about 0.5 $mΩcm^2$ which is about 14% as large as the whole on-state-resistance. The ratio of the channel resistance to the whole on-state-resistance is reduced, for example, by about one digit compared with the SiC trench gate type MOSFET according to the related art. It is conceivable that the cell pitch in the SiC trench gate type MOSFET according to Embodiment 4 is, for example, 2 μm, that is, reduced remarkably compared with the cell pitch 16-18 μm in the related art to thereby increase channel density. Moreover, in Embodiment 4, in a trench gate type semiconductor device using such a semiconductor material that a thermal diffusion method cannot be said to be a practical production method, the cell pitch can be reduced remarkably because each unit cell portion can be formed by self-alignment without mask alignment though the body contact region 7 is formed by full epitaxial growth. Consequently, high channel density can be achieved and channel resistance and on-state-resistance can be reduced.

Embodiment 5

When the thickness of each interlayer insulating film 21 must be made large for some reason, the production margin enough to embed both the gate electrode 12 and the interlayer insulating film 21 in each second trench 10c may be short in the SiC trench gate type MOSFET and the method of producing the same according to Embodiment 4. An example of the SiC trench gate type MOSFET and the method of producing the same to obtain the production margin in such a case will be described as Embodiment 5.

Figure 25:
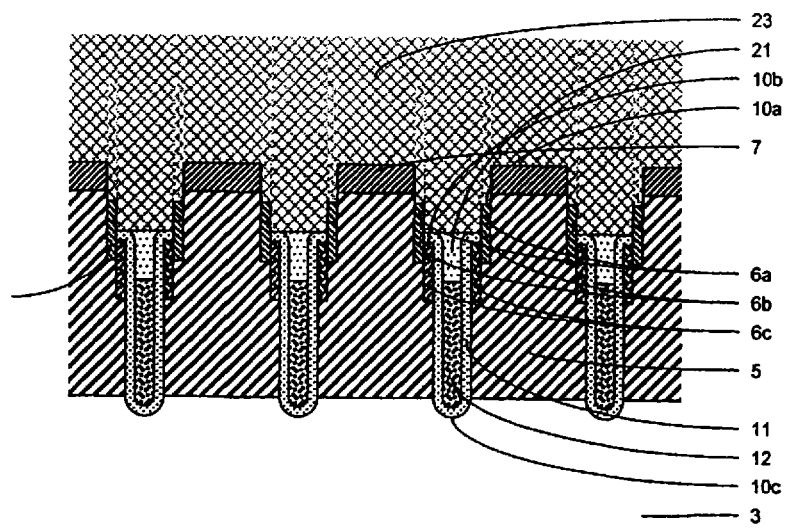
FIG. 25 is a sectional view (No. 1) of important part of a unit cell portion of an SiC trench gate type MOSFET according to Embodiment 5 of the invention.
Figure 25:
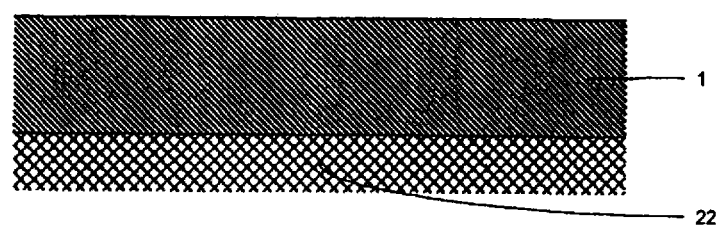

FIG. 25 is a sectional view showing important part of each unit cell portion in the SiC trench gate type MOSFET according to Embodiment 5. A lot of constituent members in Embodiment 5 shown in FIG. 25 are the same as those in Embodiment 4 shown in FIG. 18. The same constituent members are referred to by the same numerals for the sake of omission of duplicate description. A large difference from Embodiment 4 is as follows: third trenches 10b are formed newly while self-aligned with first trenches 10a; second trenches 10c are further formed while self-aligned with the third trenches 10b; and n-type source elongation regions 6c are provided newly in the respective bottoms of the third trenches 10b so that the n-type source elongation regions 6c are at least connected to source extension regions 6b respectively.

The thickness (depth) of each source elongation region 6c can be set, for example, at 0.9 μm by implantation, for example, of monovalent or divalent nitrogen ions. Accordingly, the thickness from the bottom of the source elongation region 6c to the top of the source contact region 6a (the bottom of the first trench 10a) can be set, for example, at about 1.5 μm though it depends on the production margin of the bottom position of the third trench 10b. Accordingly, even when etching back is performed so that the top of the gate electrode 12 is located between the top and bottom of the source elongation region 6c, and etching back is performed so that the top of the interlayer insulating film 21 is located between the top of the source contact region 6a and the bottom of the source extension region 6b, the thickness of the interlayer insulating film 21 can be set, for example, at about 0.8 μm (a thickness of about 0.6 μm remains by the intension of aiming at the centers but a thickness of 0.8 μm is obtained by the intension of aiming at 0.1 μm lower and upper from the centers respectively). Accordingly, Embodiment 5 has an advantage that the production margin for embedding the interlayer insulating film 21 in the inside of each second trench is large compared with Embodiment 4.

The method of producing the SiC trench gate type MOSFET shown in FIG. 25 will be described in due order with reference to FIGS. 26 to 31. Incidentally, while the same processes as in Embodiment 4 shown in FIG. 18 will be described in brief to avoid duplicate description, the difference from Embodiment 4 will be described in detail. First, like FIG. 19, a voltage withstanding layer 3, a body layer 5b and a body contact layer 7-1 are formed successively on a substrate 1 by full epitaxial growth. Here, the thickness of the body layer 5b is set, for example, at 3.3 µm because the body layer 5b has to be thicker than the body layer 5a in Embodiment 4, in accordance with new provision of source elongation regions 6c.

Figure 26:
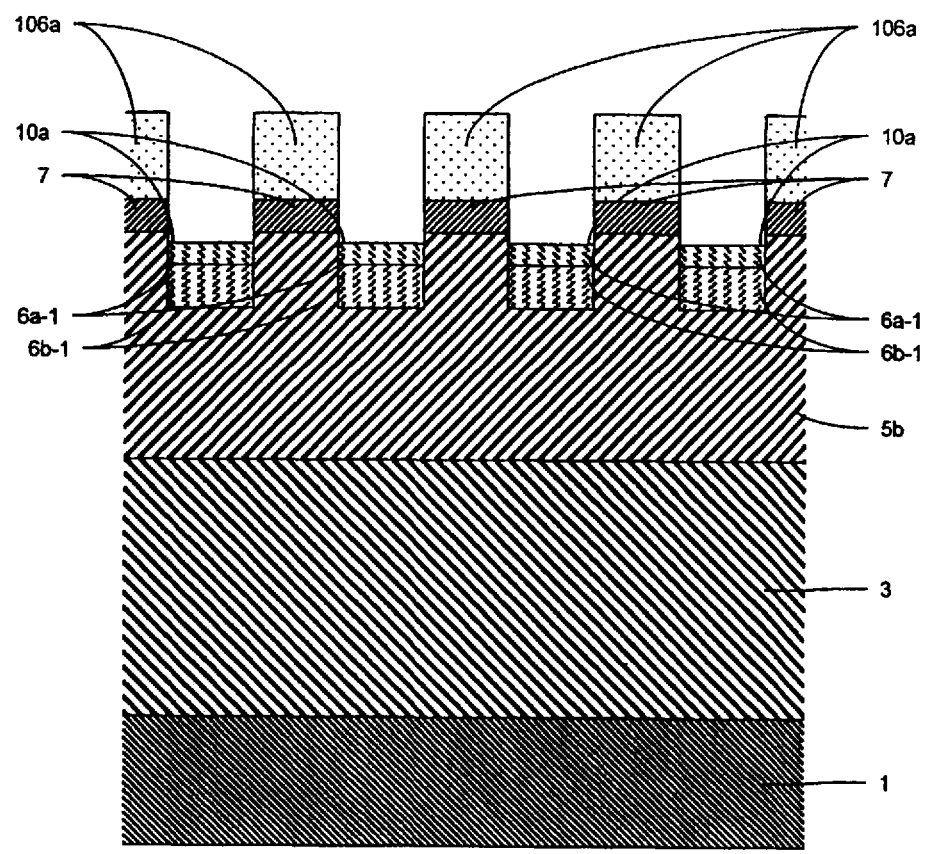
FIG. 26 is a sectional view (No. 2) of important part of a unit cell portion showing a method of producing an SiC trench gate type MOSFET according to Embodiment 5 of the invention.

Then, like FIGS. 20 and 21, an SiO$_2$ film is formed on the whole surface of the SiC wafer and patterned to form a first mask 106a having first opening portions. Successively, the surface of the SiC wafer is etched anisotropically from the first opening portions with use of the first mask 106a to form first trenches 10a. Then, for example, nitrogen ions and phosphorus ions are implanted from the respective bottoms of the first trenches 10a through the same first mask 106a to form source extension ion-implanted regions 6b-1 and source contact ion-implanted regions 6a-1. The same heat treatment as in Embodiment 4 is performed in accordance with necessity. FIG. 26 is a sectional view showing important part of the wafer in a state where the aforementioned processes are completed. FIG. 26 is the same as FIG. 21 except the thickness of the body layer 5b.

Then, while the first mask 106a is left, an SiO$_2$ film is formed again on the whole surface of the wafer by plasma CVD. On this occasion, the thickness has to be selected so that the thickness (lateral length) of a second mask 106b to be formed on a side wall surface of each first opening portion in the first mask 106a is a predetermined thickness, for example, of 0.1 µm.

Figure 27:
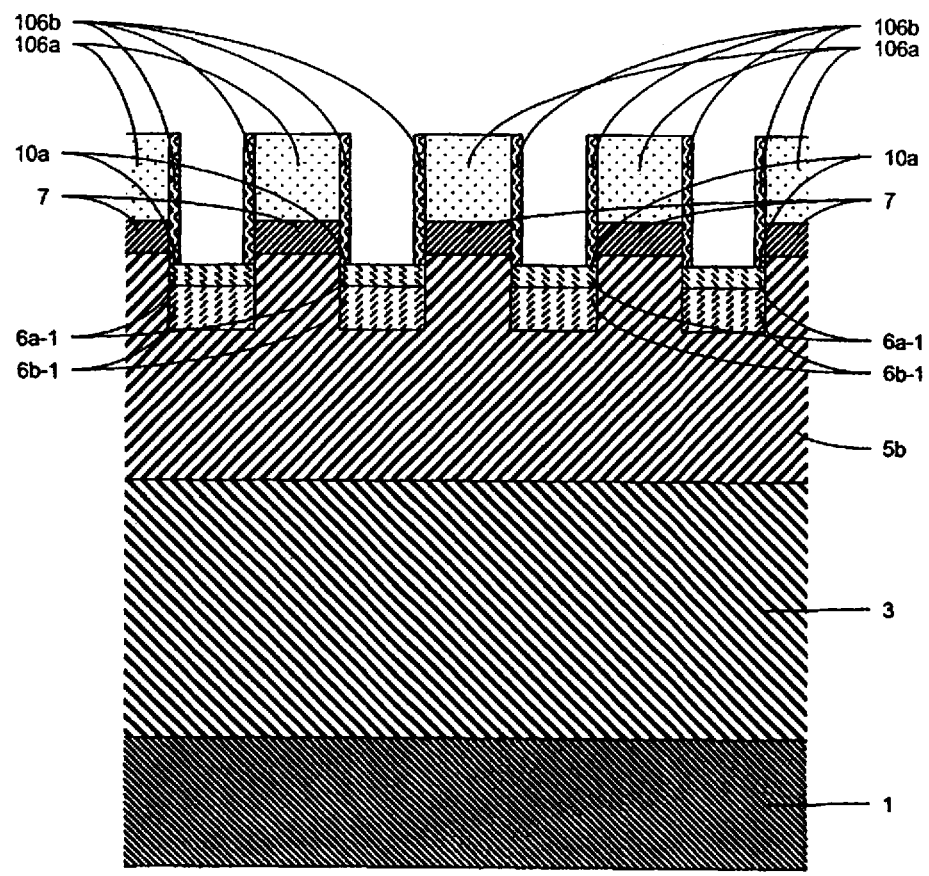
FIG. 27 is a sectional view (No. 3) of important part of a unit cell portion showing a method of producing an SiC trench gate type MOSFET according to Embodiment 5 of the invention.

Then, the SiO$_2$ film is etched anisotropically on the whole surface of the wafer until the bottom of each first trench 10a is exposed. Thus, a second mask 106b having second opening portions is formed. FIG. 27 is a sectional view showing important part of the wafer in this state. Although FIG. 27 shows an example in which the second mask 106b is formed only on the side wall surface of each first opening portion in the first mask 106a, the second mask 106b need not be limited thereto, like the second mask 110c in Embodiment 4.

Figure 28:
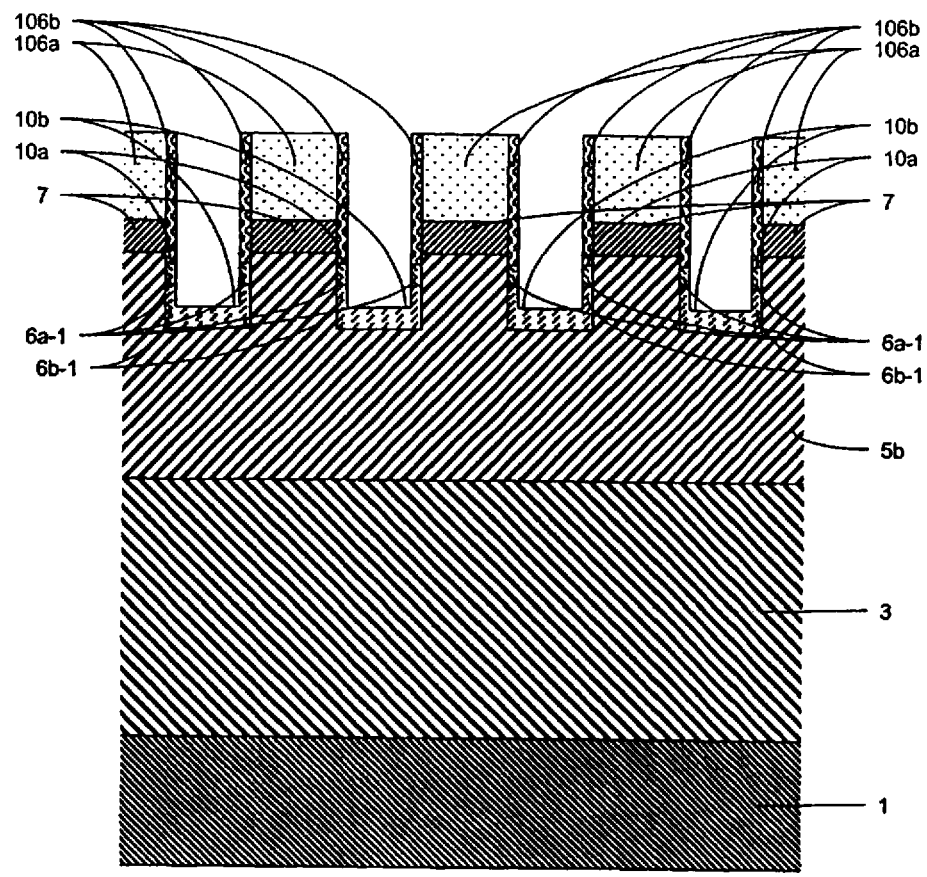
FIG. 28 is a sectional view (No. 4) of important part of a unit cell portion showing a method of producing an SiC trench gate type MOSFET according to Embodiment 5 of the invention.

Successively, the surface of the SiC wafer is etched anisotropically from the second opening portions in the respective bottoms of the first trenches 10a with use of the first and second masks 106a and 106b to form third trenches 10b. The width of each third trench is 0.8 µm. The bottom of each third trench 10b is provided so as to be located above the bottom of the corresponding source extension ion-implanted region 6b-1. For example, when the depth of each third trench 10b is 0.6 µm, that is, when the bottom of each third trench 10b is located 0.6 µm lower from the bottom of the corresponding first trench 10a, the bottom of the third trench 10b can be located, for example, 0.3 µm upper from the bottom of the corresponding source extension ion-implanted region 6b-1 (on the assumption that the thickness of the source extension ion-implanted region 6b-1 is 0.9 µm). FIG. 28 is a sectional view of important part of the wafer showing this stage.

Figure 29:
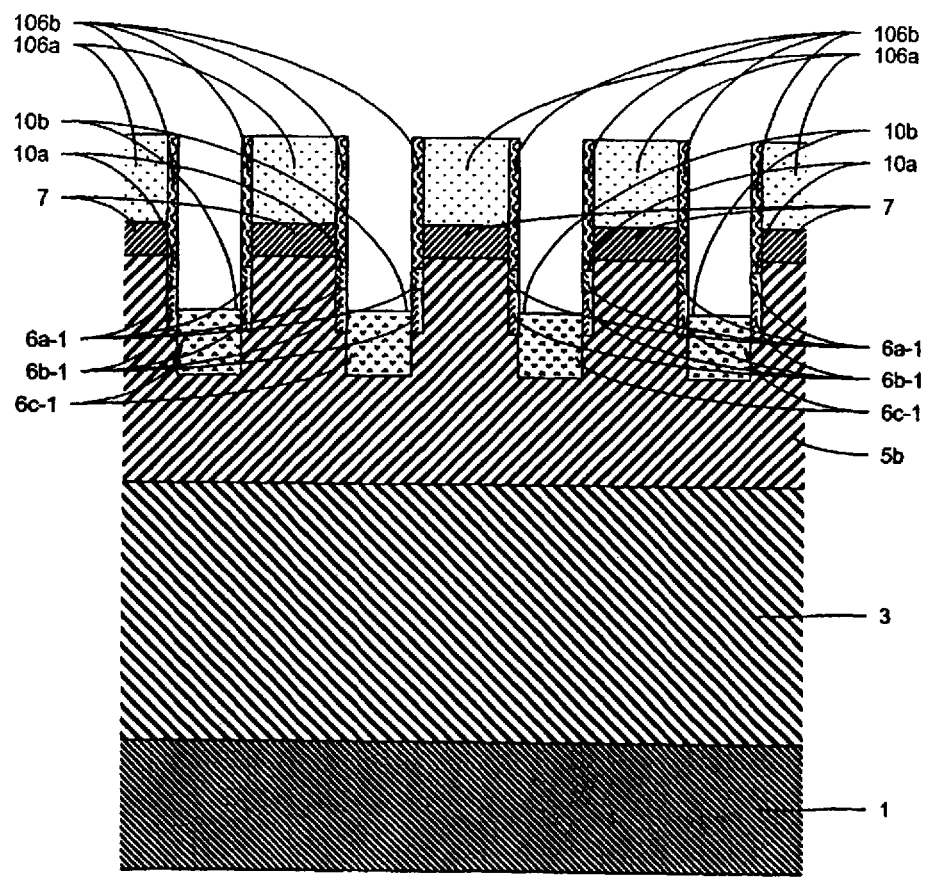
FIG. 29 is a sectional view (No. 5) of important part of a unit cell portion showing a method of producing an SiC trench gate type MOSFET according to Embodiment 5 of the invention.

Then, for example, nitrogen ions are implanted into the wafer, for example, kept at 500° C. through the first and second masks 106a and 106b and then heat treatment is performed in accordance with necessity in the same manner as in formation of the source contact ion-implanted regions 6a-1 and the source extension ion-implanted regions 6b-1 to thereby form source elongation ion-implanted regions 6c-1. FIG. 29 is a sectional view showing important part of the wafer in this stage.

Figure 30:
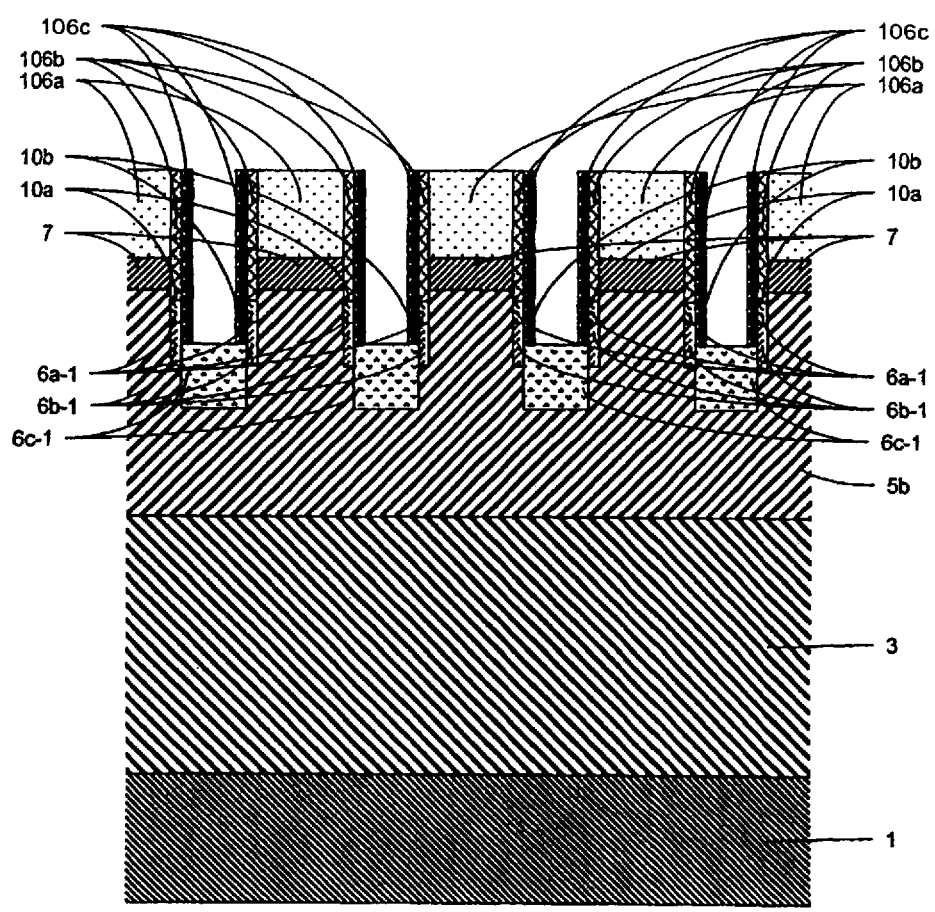
FIG. 30 is a sectional view (No. 6) of important part of a unit cell portion showing a method of producing an SiC trench gate type MOSFET according to Embodiment 5 of the invention.

Successively, while the first and second masks 106a and 106b are left, an SiO$_2$ film is formed again on the whole surface of the wafer by plasma CVD. On this occasion, the thickness has to be selected so that the thickness (lateral length) of a third mask 106c to be formed on a side wall surface of each opening portion in the second mask 106b is a predetermined thickness, for example, of 0.1 µm. Then, the SiO$_2$ film is etched anisotropically on the whole surface of the wafer until the bottom of each third trench 10b is exposed. Thus, a third mask 106c having third opening portions is formed. FIG. 30 is a sectional view showing important part of the wafer in this state. Although FIG. 30 shows an example in which the third mask 106c is formed only on the side wall surface of each opening portion in the second mask 106b, the third mask 106c need not be limited thereto like the second mask 106b.

Figure 31:
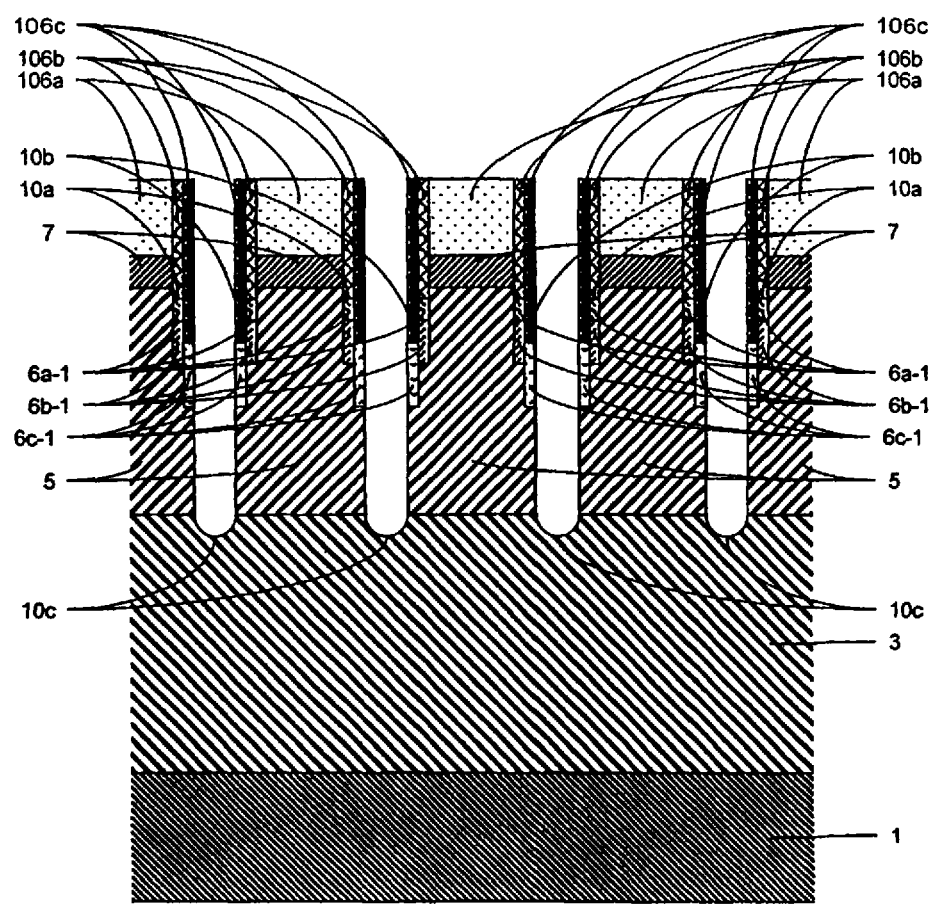
FIG. 31 is a sectional view (No. 7) of important part of a unit cell portion showing a method of producing an SiC trench gate type MOSFET according to Embodiment 5 of the invention.
Figure 32:
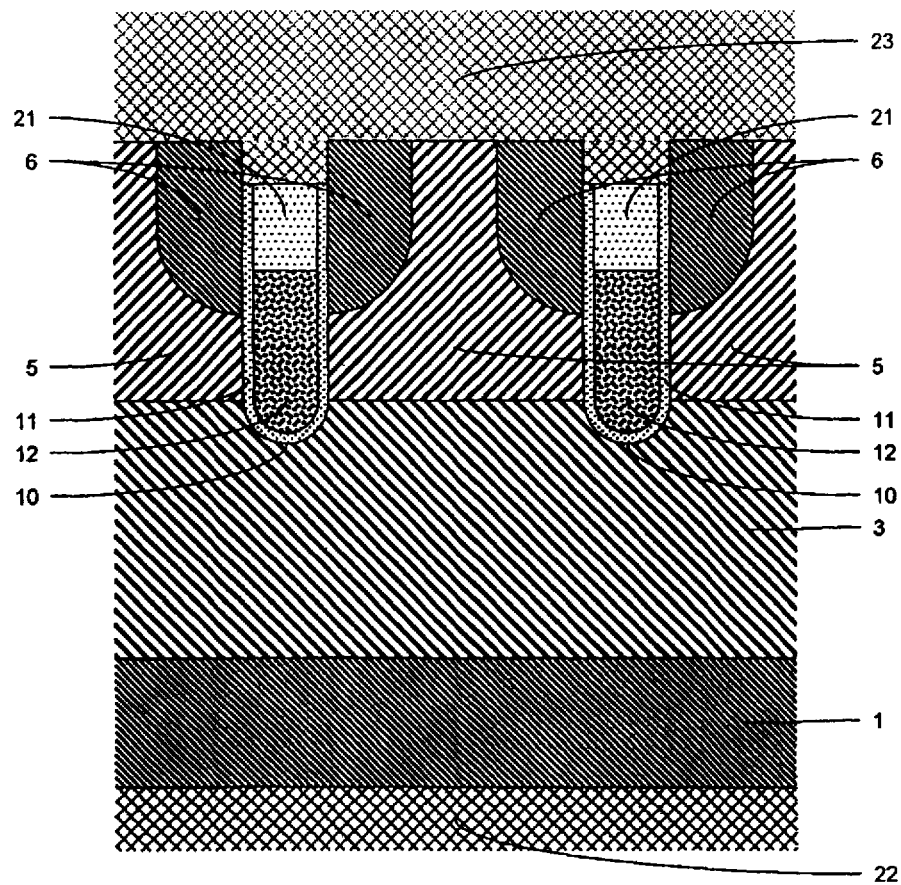
FIG. 32 is a sectional view of important part of a unit cell portion of an Si trench gate type MOSFET according to the related art.
Figure 33:
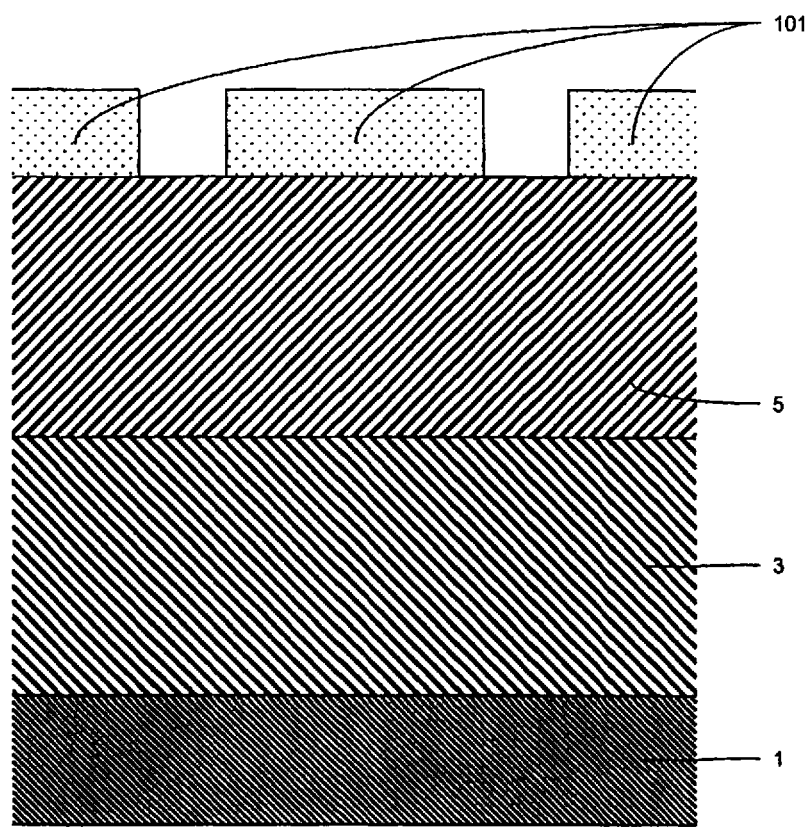
FIG. 33 is a sectional view (No. 1) of important part showing a method of producing the Si trench gate type MOSFET according to the related art shown in FIG. 32.
Figure 34:
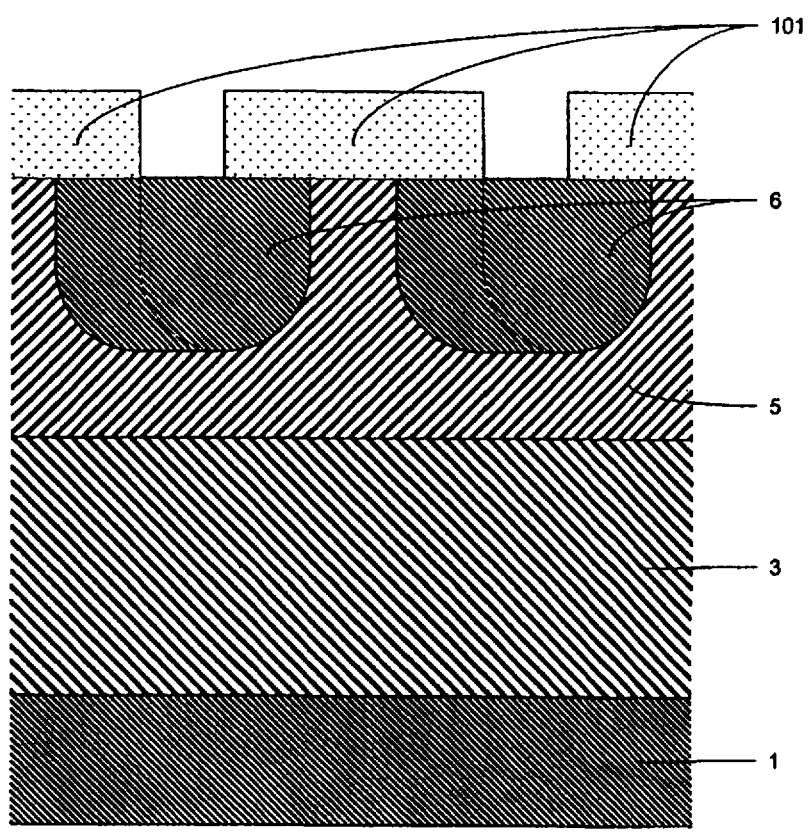
FIG. 34 is a sectional view (No. 2) of important part showing a method of producing the Si trench gate type MOSFET according to the related art shown in FIG. 32.
Figure 35:
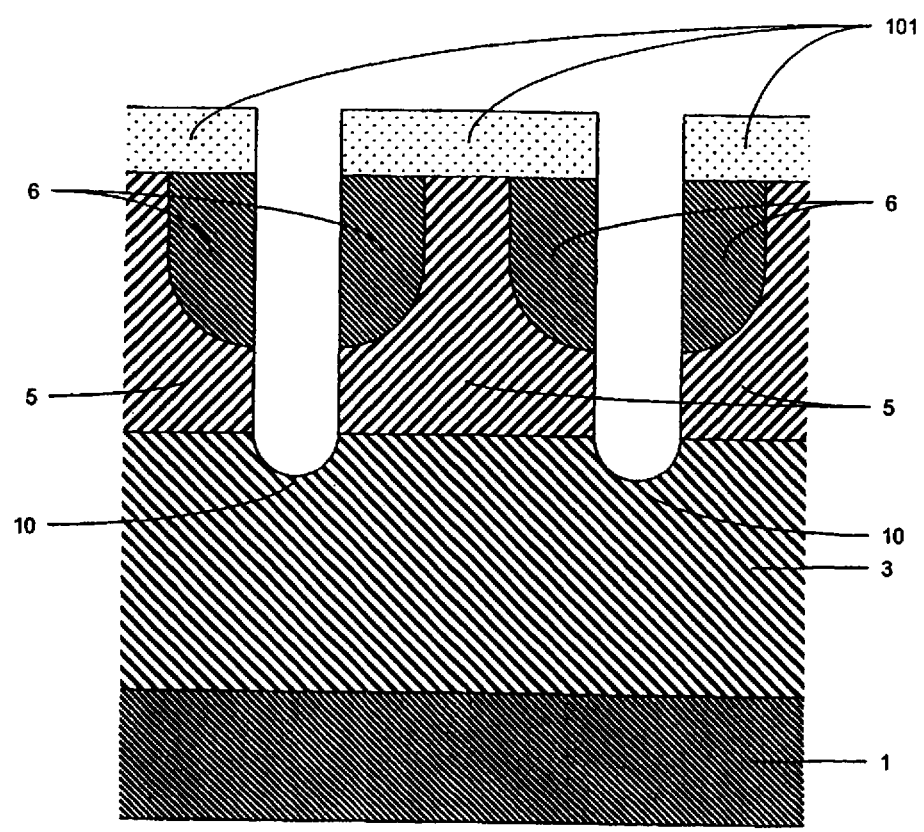
FIG. 35 is a sectional view (No. 3) of important part showing a method of producing the Si trench gate type MOSFET according to the related art shown in FIG. 32.
Figure 36:
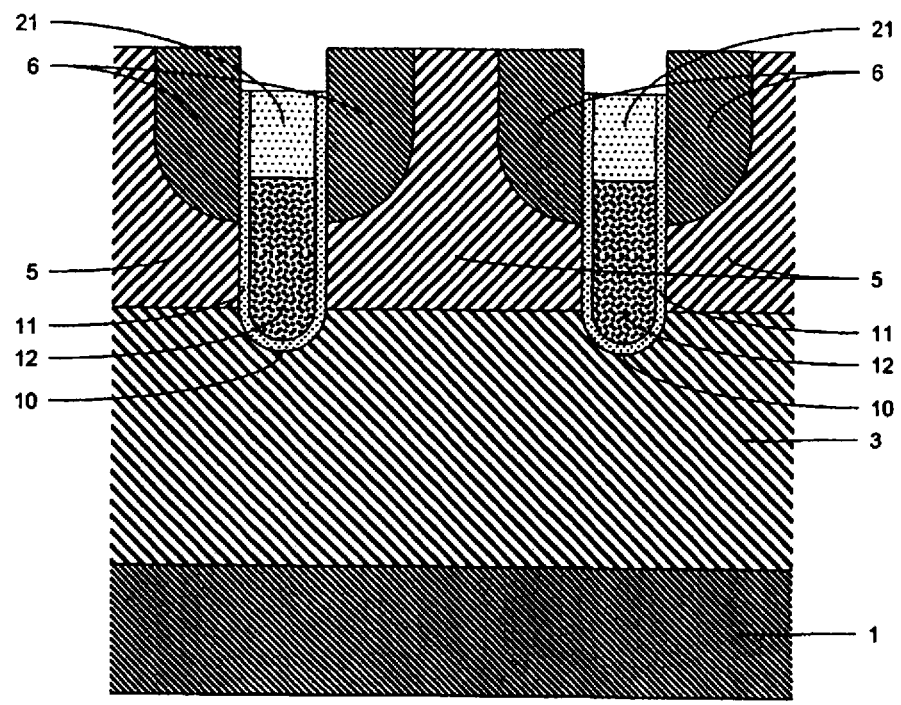
FIG. 36 is a sectional view (No. 4) of important part showing a method of producing the Si trench gate type MOSFET according to the related art shown in FIG. 32.
Figure 37:
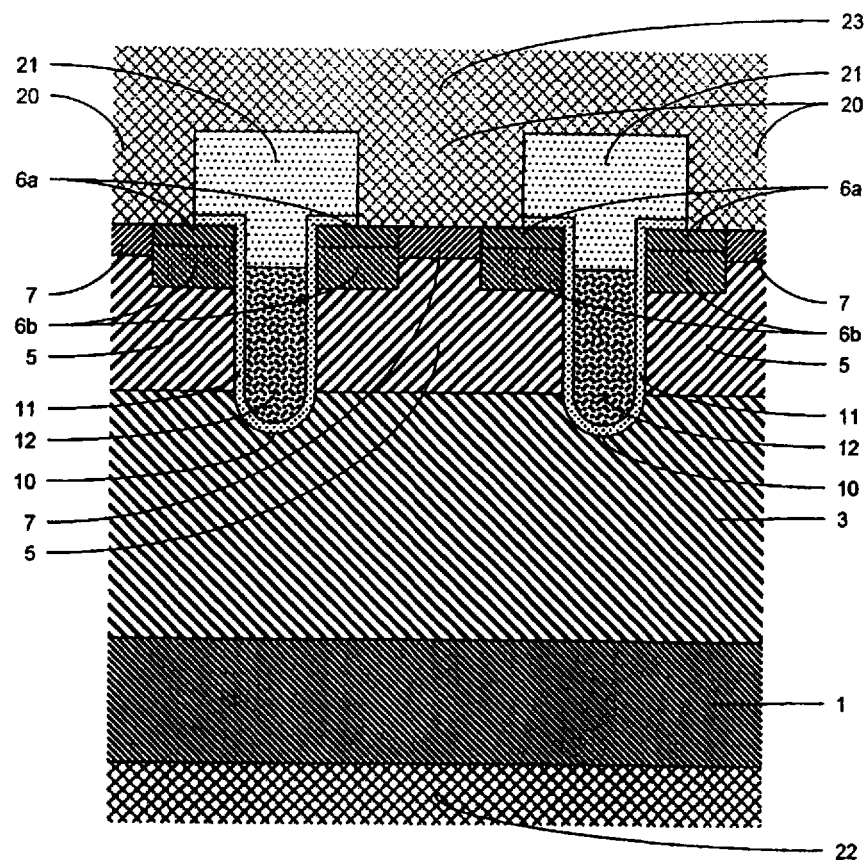
FIG. 37 is a sectional view of important part showing a method of producing the Si trench gate type MOSFET according to a related art.
Figure 38:
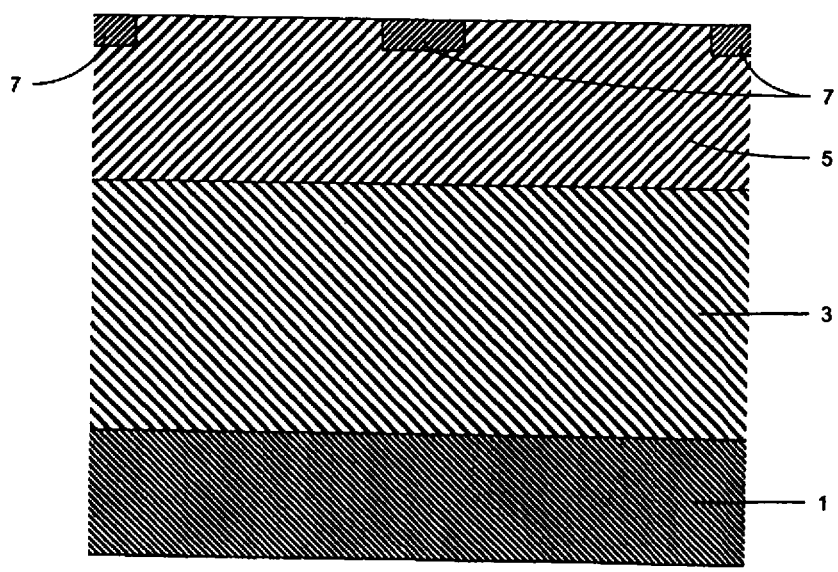
FIG. 38 is a sectional view (No. 1) of important part showing a method of producing the Si trench gate type MOSFET according to the related art shown in FIG. 37.
Figure 39:
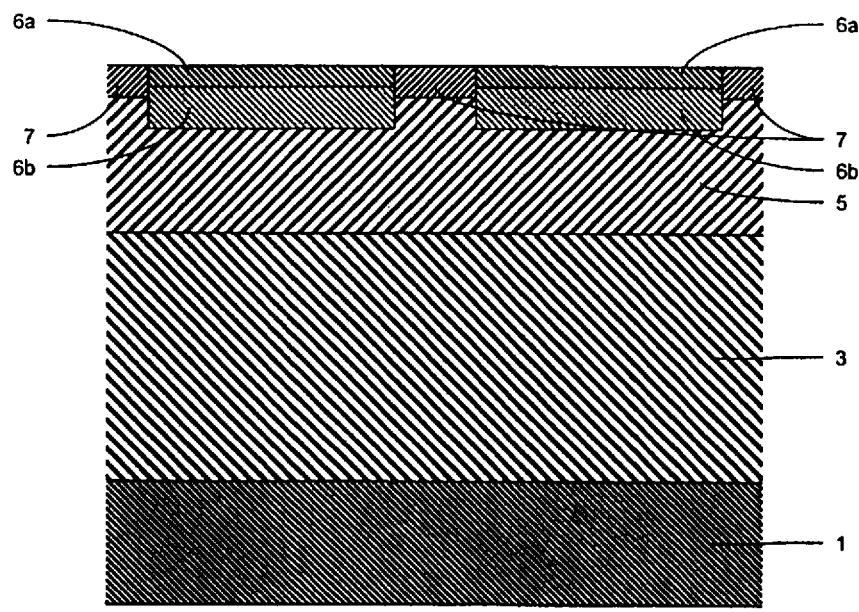
FIG. 39 is a sectional view (No. 2) of important part showing a method of producing the Si trench gate type MOSFET according to the related art shown in FIG. 37.
Figure 40:
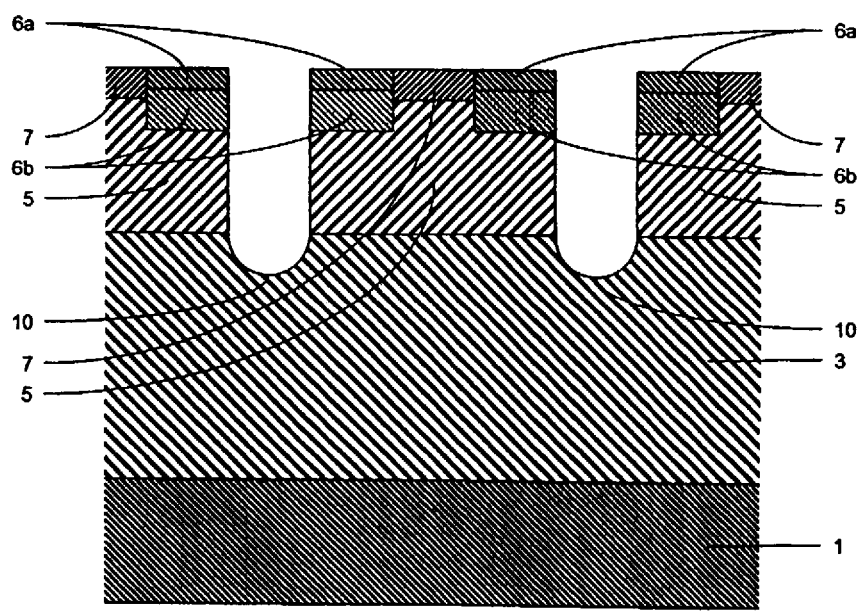
FIG. 40 is a sectional view (No. 3) of important part showing a method of producing the Si trench gate type MOSFET according to the related art shown in FIG. 37.
Figure 41:
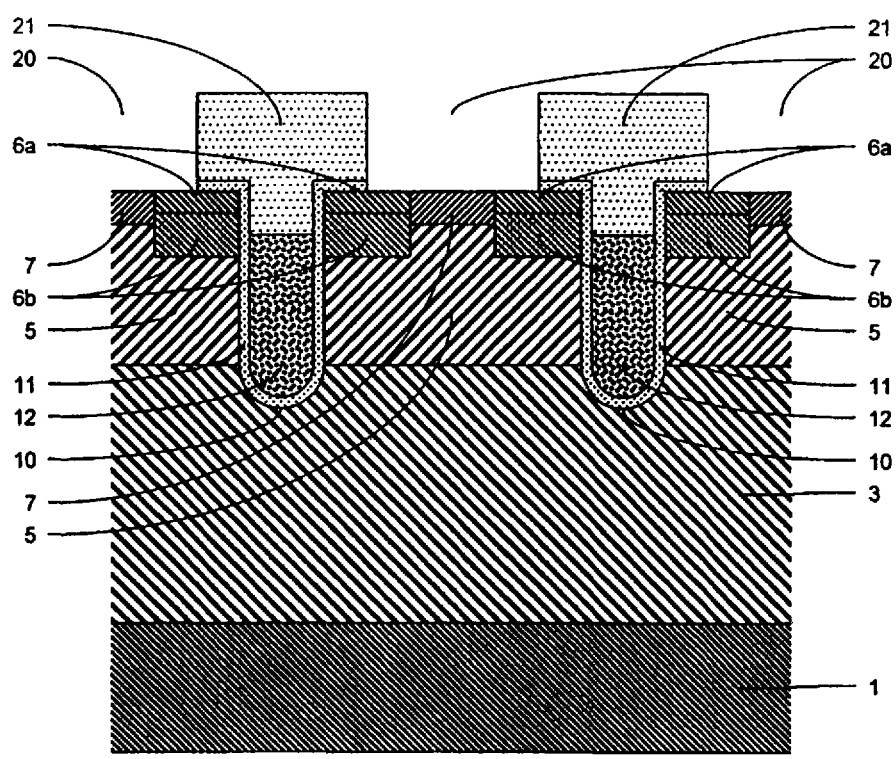
FIG. 41 is a sectional view (No. 4) of important part showing a method of producing the Si trench gate type MOSFET according to the related art shown in FIG. 37.

Then, the surface of the SiC wafer is etched anisotropically from the third opening portions in the respective bottoms of the third trenches 10b with use of the third mask 106c, the second mask 106b and the first mask 106a to form second trenches 10c each of which pierces the corresponding source elongation ion-implanted region 6c-1 and the body layer 5b and reaches the voltage withstanding layer 3. The width of each second trench is 0.6 µm. The remaining portion of the body layer 5b is provided as body regions 5. FIG. 31 is a sectional view showing important part of the wafer in this stage. Hereafter, processing is the same as in Embodiment 4 except that upper end positions for etching back the gate electrode 12 and the interlayer insulating film 21 respectively are set to be located between the bottom of the source elongation region 6c and the top of the source contact region 6a. The on-state-resistance of the finished MOSFET was substantially equal to that in Embodiment 4. As described above, in accordance with Embodiment 5, though such a semiconductor material that thermal diffusion cannot be put into practical use is used and the body contact regions 7 are formed not by selective epitaxial growth but by full epitaxial growth, the cell pitch can be reduced remarkably because the source regions can be made effectively thick as well as the unit cell portions can be self-aligned. Consequently, the reduction in cell pitch is useful for reduction in channel resistance and there is further obtained a merit that the production margin for etching back the gate electrode 12 and the interlayer insulating film 21 is large compared with Embodiment 4.

Incidentally, the aforementioned embodiments are only exemplary and the scope of the invention is not limited to Embodiments 1 to 5. Although Embodiments 1 to 5 have been described on a trench gate type MOSFET as an example, application to another semiconductor device having a trench gate structure such as a trench IGBT is not excluded and those skilled in the art will make necessary changes easily when the invention is applied to these semiconductor devices.

Embodiment 6

Embodiment 6 as to the method of producing the trench gate type MOSFET, especially the producing method for reducing the trench width finely, that is, reducing the cell pitch will be described more in detail with reference to the drawings.

Figure 42:
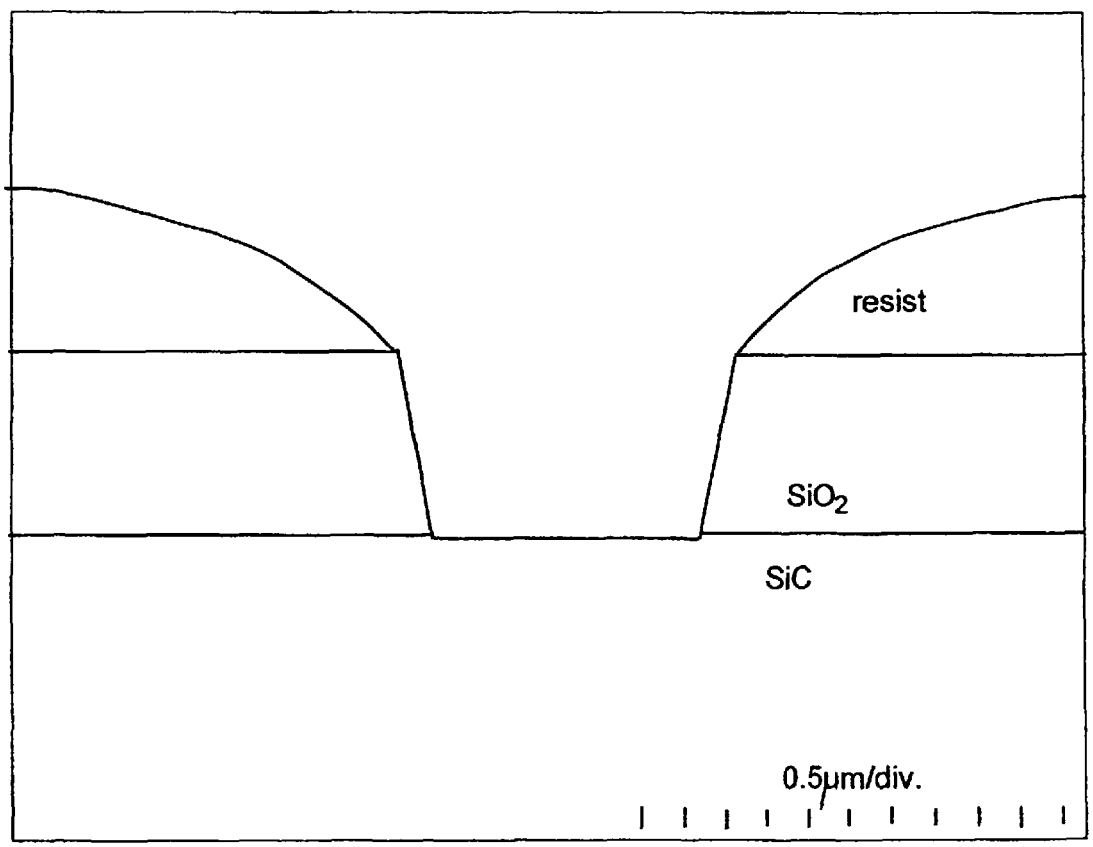
FIG. 42 is a tomographic model view of a resist pattern and an SiO$_2$ film mask on an SiC wafer according to Embodiment 6 of the invention.

After an SiC wafer (or an SiC epitaxial film-containing wafer) is cleaned well, an SiO$_2$ film with a thickness of 2.5 µm is formed on the wafer by a radical shower CVD method. The film-forming gas is SiH$_4$+O$_2$+Ar, the pressure is 50 Pa, the VHF power is 500 W, and the temperature for heating the wafer is 400° C. After the wafer with the SiO$_2$ film formed thus is cleaned, a resist is applied on the SiO$_2$ film by a coater. Exposure is performed with use of a reticle having a pattern of 1 µm-wide trenches formed by a stepper device and then development is performed. Baking at 100° C. for 1 minute is performed and additional baking at 123° C. for 15 minute is performed. On this occasion, the resist is about 2.5 µm thick and shaped like a taper of about 50 degrees in sectional view. Then, the $SiO_2$ film is dry-etched, so that an $SiO_2$ film mask having tapered opening portion side wall surfaces is formed on the SiC wafer as shown in FIG. 42. The condition for etching the $SiO_2$ film is RF power of 75 W under a pressure of 3 Pa with use of $CHF_3/Ar$=1:1 mixed gas. Because the resist is tapered at about 50 degrees as described above, the $SiO_2$ film is shaped like a taper of about 80 degrees in sectional view. After etching, the resist is removed by ashing. Ashing is performed in the condition of RF power of 150 W under a pressure of 150 Pa with use of $CHF_3/O_2$=1:25 mixed gas. After ashing, the resist is soaked in a release solution so that the resist is removed perfectly.

Figure 43:
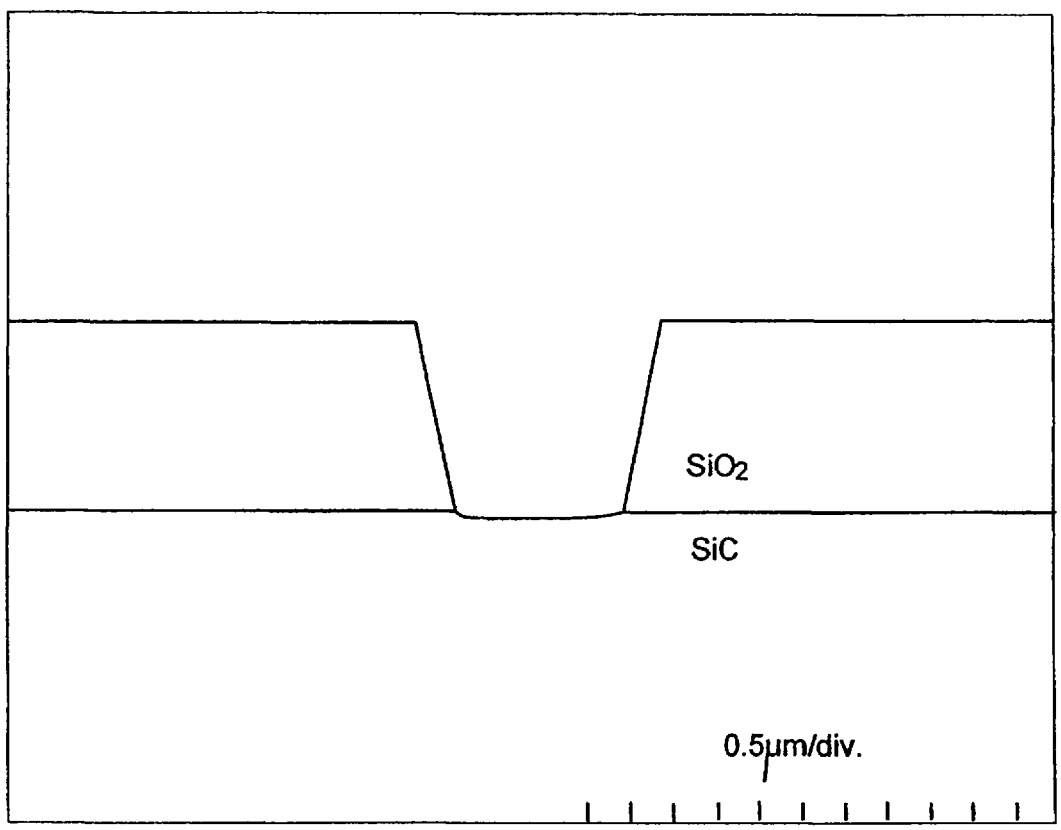
FIG. 43 is a tomographic model view of an SiO$_2$ film mask on an SiC wafer according to Embodiment 6 of the invention.

After soaked in isopropyl alcohol, the wafer is washed with water, dried and then a second $SiO_2$ film is deposited on the wafer. A second $SiO_2$ film with a thickness of 2 μm is formed on the whole surface of the wafer having the $SiO_2$ film patterned by a radical shower CVD method. The film-forming gas is $SiH_4+O_2+Ar$, the pressure is 50 Pa, the VHF power is 500 W, and the temperature for heating the wafer is 400° C. FIG. 43 shows the wafer in which the $SiO_2$ film is patterned at an angle of 80° by dry etching of the $SiO_2$ film. FIG. 44 shows a state where the second $SiO_2$ film is deposited. It is apparent from FIG. 44 that the pattern width can be reduced dramatically when the second $SiO_2$ film is deposited. Because the $SiO_2$ film protrudes based on film-forming, the upper edge portion of the $SiO_2$ film pattern is verging on a blocked state at deposition of 2 μm and is blocked perfectly at deposition of 2.5 μm. The initial $SiO_2$ film patterning has to be tapered at an angle of 80° because of the protrusion of the $SiO_2$ film. If it is provided vertically, the pattern width cannot be narrowed sufficiently because the blocked state of the pattern edge occurs even when the film thickness is smaller. After the second $SiO_2$ film is deposited, second dry etching is performed for the deposited film thickness so that the $SiO_2$ film deposited on the pattern bottom portion is removed until the SiC surface is exposed perfectly. Etching is performed in the condition of RF power of 75 W under a pressure of 3 Pa with use of $CHF_3/Ar$=1:1 mixed gas. FIG. 45 is a sectional view showing a state where second etching of the $SiO_2$ film is completed. The $SiO_2$ film deposited on the pattern bottom is etched to form a narrow $SiO_2$ film pattern. In the initial state shown in FIG. 43, the $SiO_2$ film pattern width is 1.9 μm. When the process of re-depositing and re-etching the $SiO_2$ film shown in FIG. 45 is performed, the pattern width can be narrowed to 0.4 μm.

As described above, it is apparent that even when an exposure device low in resolution and mask alignment accuracy and inferior in fine processing ability is used, an $SiO_2$ film mask having a fine pattern width beyond the ability of the exposure device can be formed by the method according to Embodiment 6.

Then, the SiC wafer is dry-etched with use of the $SiO_2$ film mask. An ICP (Inductively Coupled Plasma) etching device is used for the etching. The etching condition is ICP power of 540 W, a bias of 9 W, etching gas of $SF_6/O_2/Ar$=8.3/2.2/43 sccm and a pressure of 2.5 Pa. FIG. 46 is a sectional view showing a state where etching of the SiC wafer is completed with use of a conventional $SiO_2$ film mask without use of the mask fine-forming method according to Embodiment 6 shown in FIG. 43. FIG. 47 is a sectional view showing a state where etching of the SiC wafer is completed with use of an $SiO_2$ film mask having a mask width reduced to 0.4 μm finely according to Embodiment 6. When the conventional mask width shown in FIG. 46 is used, the etching sectional shape of the SiC wafer is provided so that the trench width is 2.3 μm for the trench depth of 3.2 μm. On the contrary, when the method according to Embodiment 6 shown in FIG. 47 is used, the trench width can be reduced to 0.9 μm for the trench depth of 3.2 μm.

Embodiment 7

After an SiC wafer (or an SiC epitaxial film-containing wafer) is cleaned well, a resist is applied on an $SiO_2$ film in the same manner as in Embodiment 6. Then, exposure and development are performed with use of a reticle having a pattern of 2 μm-wide trenches formed by a stepper device. Then, the wafer is baked so that the resist is shaped like a taper of about 50 degrees in sectional view in the same manner as in Embodiment 6. Then, the $SiO_2$ film is dry-etched to produce an $SiO_2$ film mask in the same manner as in Embodiment 6. The $SiO_2$ film is further etched in the same etching condition as in Embodiment 6, so that the $SiO_2$ film is shaped like a taper of about 80 degrees in sectional view. After etching, the resist is removed by ashing. Ashing is performed in the condition of RF power of 150 W under a pressure of 150 Pa with use of $CHF_3/O_2$=1:25 mixed gas. After ashing, the resist is soaked in a release solution so that the resist is removed perfectly. After soaked in isopropyl alcohol, the wafer is washed with water, dried and then first dry etching is applied to the SiC wafer. In the dry etching, the $SiO_2$ film mask is used and an ICP etching device is used as the etching device. The etching condition is ICP power of 540 W, a bias of 9 W, etching gas of $SF_6/O_2/Ar$=8.3/2.2/43 sccm and a pressure of 2.5 Pa. FIG. 48 is a sectional view showing the SiC wafer in a state where etching is completed. The trench width is 3.8 μm for the trench depth of 3.6 μm. Then, a second $SiO_2$ film is deposited on the whole surface of the wafer having first-stage trenches formed. A second $SiO_2$ film with a thickness of 4.5 μm is formed by a radial shower CVD method. The film-forming gas is $SiH_4+O_2+Ar$, the pressure is 50 Pa, the VHF power is 500 W, and the temperature for heating the wafer is 400° C. When the second $SiO_2$ film is deposited, the $SiO_2$ film is deposited on the side wall and bottom of each first-stage trench. After the second $SiO_2$ film is deposited, second dry etching is performed for the deposited film thickness of the second $SiO_2$ film so that the $SiO_2$ film deposited on the pattern bottom portion is removed until the SiC wafer surface is exposed perfectly. Etching is performed in the condition of RF power of 75 W under a pressure of 3 Pa with use of $CHF_3/Ar$=1:1 mixed gas. The $SiO_2$ film deposited on the bottom of each trench is etched so that a narrow $SiO_2$ film pattern is formed in the bottom of each first-stage trench.

It is apparent that even when an exposure device inferior in fine processing ability as in Embodiment 7 as described above is used, an $SiO_2$ film mask having a pattern width fine to some degree can be formed. Then, second dry etching is applied to the SiC wafer. An ICP etching device is used as the etching device. The etching condition is ICP power of 540 W, a bias of 9 W, etching gas of $SF_6/O_2/Ar$=8.3/2.2/43 sccm and a pressure of 2.5 Pa. FIG. 49 is a sectional view showing a state where the $SiO_2$ film is removed with hydrofluoric acid after second etching is applied to the SiC wafer. When the producing method described in Embodiment 7 is used, each two-stage trench can be formed so that the second stage is narrower than the first stage. When the trench depth of the second stage is 3.2 μm, the trench width can be reduced to 1.1 μm. When such a two-stage trench is provided, a design can be made theoretically so that the cell pitch is narrower than that of a one-stage trench generally used.

According to Embodiments 6 and 7 described above, the SiC wafer is etched after the process of depositing the $SiO_2$ film and the process of etching the $SiO_2$ film are repeated twice respectively. Accordingly, even when an exposure device low in pattern alignment accuracy and resolution and incapable of exposing the resist finely is used, a fine SiO$_2$ film mask pattern beyond the ability of the exposure device can be formed. When the SiC wafer is dry-etched with use of the SiO$_2$ film mask, the trench width can be reduced to 0.9 μm finely. When etching of the SiC wafer in this method is repeated twice, a two-stage trench can be formed so that the width of the second stage is 1.1 μm.

Although Embodiments 1 to 7 have been described on the SiC trench gate type MOSFET according to the invention, the invention can be applied not only to the SiC substrate but also to a trench gate type semiconductor device using a semiconductor substrate containing gallium nitride, aluminum nitride or alloy of gallium nitride and aluminum nitride as a main component.

Embodiment 8

The invention according to Embodiment 8 is characterized in that another trench than the gate trench filled with the gate electrode is provided so as to be deeper than the gate trench in order to prevent the insulating film in the bottom of the gate trench from being broken down by an excessive electric field. The other trench is hereinafter referred to as intersection trench to be distinguished from the gate trench. The structure of the intersection trench will be described below. The intersection trench is extended in a direction of crossing with the gate trench in plan view. The merit in provision of the intersection trench having such structure lies in that the pitch of intersection trenches can be designed independently of the pitch of gate trenches so that the height of the Schottky barrier of a Schottky electrode provided in the bottom of each intersection trench can be selected appropriately. Moreover, the structure having gate trenches and intersection trenches can prevent remarkable increase of on-state-resistance to effectively protect each gate trench from being broken down by an excessive electric field.

When configuration is made so that gate trenches intersect intersection trenches, particularly the structure of each intersection portion is apt to be problematic. This respect will be described particularly in detail. A first problem is in that gate electrodes embedded in gate trenches must be conductively connected to one another by some form between all cells without separation by intersection trenches. Most simply, gate electrodes are continuously embedded in gate trenches inclusive of intersection portions between the gate trenches and the intersection trenches.

A second problem is in that if the intersection portions are considerably deeper than other portions of the gate trenches, there is a risk that insulating films of the intersection portions will be broken down by an excessive electric field in the same manner as in the case where the intersection trenches are not provided, because the insulating films are not protected by the intersection trenches. Accordingly, the depths of the gate electrodes are not changed and the intersection trenches must be configured so that the intersection portions between the intersection trenches and the gate trenches are as deep as the gate trenches but at least part of other portions than the intersection portions are selectively deeper than the gate trenches.

A third problem is in that a Schottky electrode provided in each intersection trench must be conductively connected to a source electrode (first main electrode) in MOSFET and electrically insulated from a gate electrode appropriately. It is apparently easy but actually difficult to solve the third problem. Although the insulator which can electrically insulate the gate electrode and the Schottky electrode from each other in each trench is limited to an insulator such as an SiO$_2$ film, a CVD-deposited SiO$_2$ film is used because a thermally oxidized SiO$_2$ film cannot be formed from the viewpoint of temperature. Because the CVD-deposited SiO$_2$ film is considerably interior in insulation performance withstanding a high electric field to the thermally oxidized SiO$_2$ film, SiO$_2$, for example, with a thickness of the order of hundreds of nanometers is generally used. However, in the gate trench structure described in Embodiments 4 to 5, the inner distance between adjacent ones of the gate trenches is, for example, no more than about 2 μm. If SiO$_2$ with a thickness of the order of hundreds of nanometers is provided on an inner surface of each gate trench, the gate electrode and the Schottky electrode per se become ultrathin. In this case, internal resistance of each gate electrode increases undesirably.

Even if the gate electrode and the Schottky electrode can be electrically insulated from each other by the CVD-deposited SiO$_2$ film in each trench, there is a problem that current drive ability per unit length of the gate trench (accordingly, current drive ability per unit area of the device) is lowered because there is no MOS channel formed in a portion where the gate electrode and the Schottky electrode face each other.

Therefore, a structure for effectively electrically insulating the gate trench and the intersection trench from each other by self-alignment and a method of producing the same are disclosed in Embodiment 8. In brief, the producing method is as follows. Each gate trench is provided as a two-stage trench structure in the same manner as in Embodiment 4 shown in FIG. 18. After the two-stage trench is formed, the two-stage trench is backfilled with a mask material such as an SiO$_2$ film. The mask material is patterned and used as a mask for forming intersection trenches. Each intersection trench is backfilled again with a mask material such as a silicon nitride film so that the mask material is used as a mask for forming gate trenches. When such a producing method is used, each inner gate trench and the corresponding intersection trench are electrically insulated from each other by self-alignment. Although the intersection trench in this case actually does not intersect the inner gate trench because the intersection trench is fragmented into pieces by the gate trench, the intersection trench is hereinafter called "intersection trench" for the sake of convenience of description. Incidentally, the intersection trench may be provided as a two-stage trench while the gate trench may be provided as a single trench. To improve the degree of freedom of process, it is however preferable that the gate trench is formed as a two-stage trench by heat treatment at a high temperature to improve the inner surface shape of the gate trench.

Figure 58:
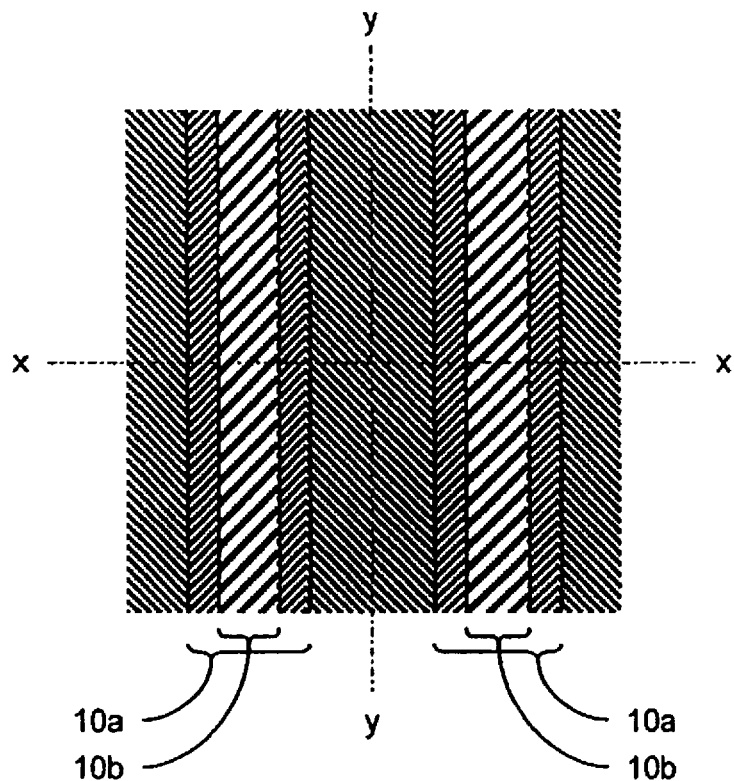
FIG. 58 is a plain view (No. 1) showing a method of producing an intersection portion between a gate trench and an intersection trench in an SiC trench gate type MOSFET according to Embodiment 8 of the invention.
Figure 59:
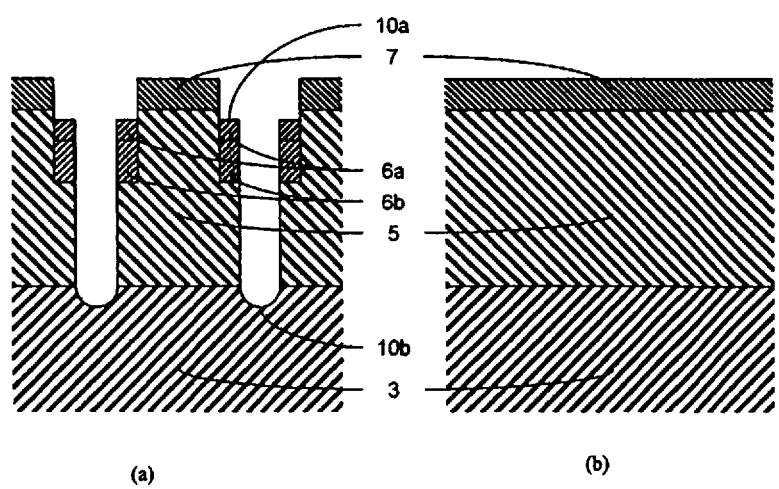
FIGS. 59A and 59B are enlarged sectional views (No. 2) showing a method of producing an intersection portion between a gate trench and an intersection trench in an SiC trench gate type MOSFET according to Embodiment 8 of the invention.

A specific producing method for forming intersection trenches by self-alignment according to Embodiment 8 will be described below. FIG. 58 is an enlarged plan view showing first trenches and third trenches. FIG. 59A is a sectional view taken along the line x-x in FIG. 58. FIG. 59B is a sectional view taken along the line y-y in FIG. 58.

First, a first trench 10*a* and a third trench 10*b* are formed as each gate trench. The third trench 10*b* is formed in the inside of each first trench 10*a* while self-aligned with the first trench 10*a*. The mask used on this occasion may be removed. If heat treatment at a high temperature in a hydrogen atmosphere has to be performed to improve the inner surface shape of each gate trench 10*b* (third trench) for example, the heat treatment at a high temperature may be performed in this stage.

Figure 60:
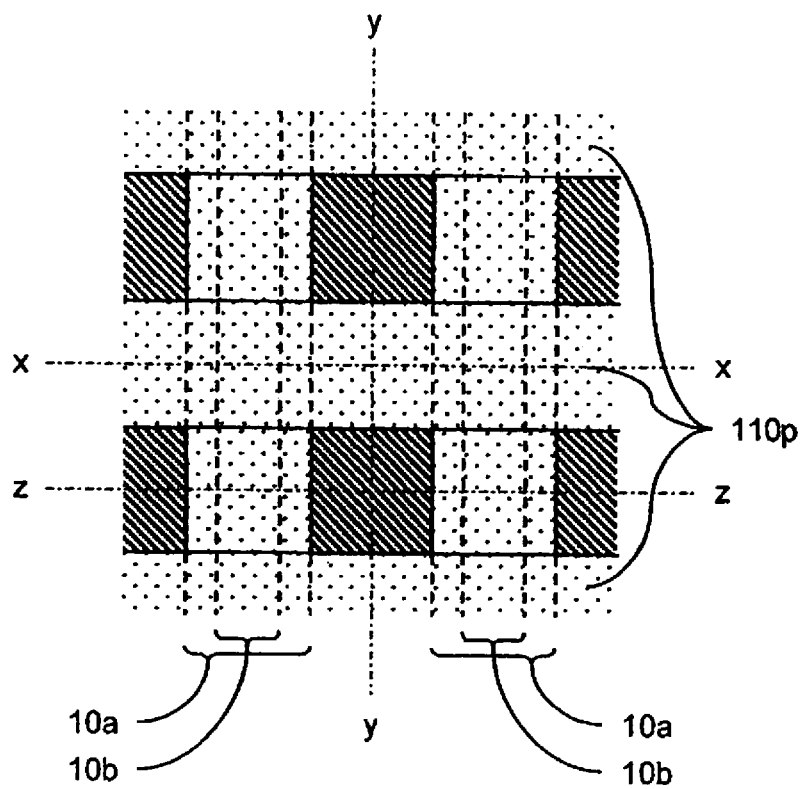
FIG. 60 is a plain view (No. 3) showing a method of producing an intersection portion between a gate trench and an intersection trench in an SiC trench gate type MOSFET according to Embodiment 8 of the invention.
Figure 61:
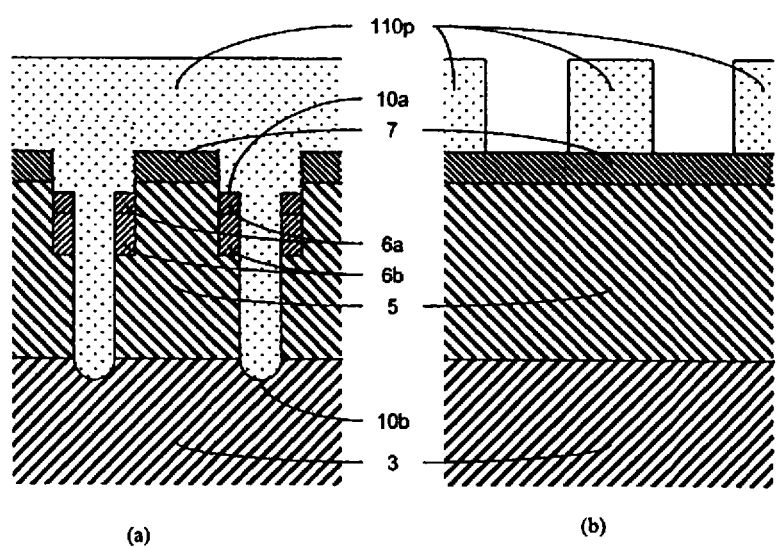
FIGS. 61A and 61B are enlarged sectional views (No. 4) showing a method of producing an intersection portion between a gate trench and an intersection trench in an SiC trench gate type MOSFET according to Embodiment 8 of the invention.
Figure 62:
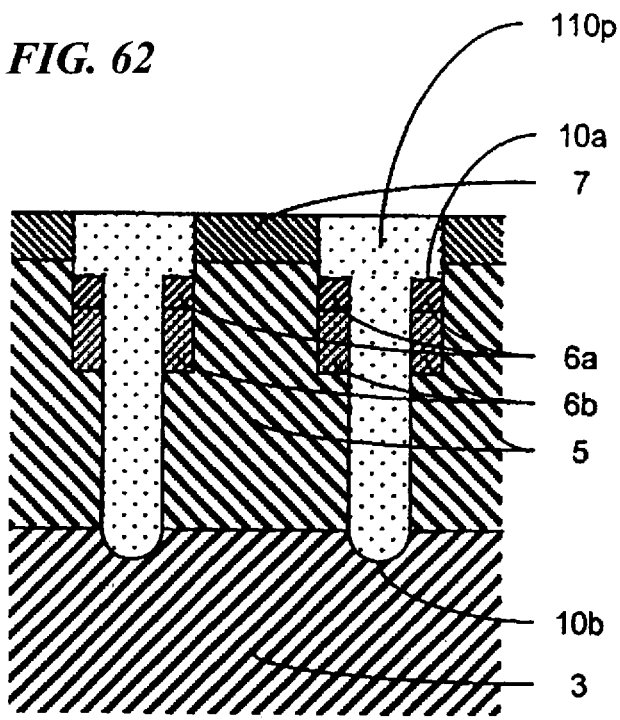
FIG. 62 is an enlarged sectional view (No. 5) showing a method of producing an intersection portion between a gate trench and an intersection trench in an SiC trench gate type MOSFET according to Embodiment 8 of the invention.

Then, an appropriate mask material such as an SiO$_2$ film is formed on the whole surface of the wafer as shown in FIGS. 60, 61A, 61B and 62. FIG. 60 is an enlarged plan view of the wafer. FIG. 61A is a sectional view taken along the line x-x in FIG. 60. FIG. 61B is a sectional view taken along the line y-y in FIG. 60. FIG. 62 is a sectional view taken along the line z-z in FIG. 60. If the SiO$_2$ film is sufficiently thick, the third trench 10b and the first trench 10a can be embedded with the SiO$_2$ film easily. Successively, a resist mask having opening portions perpendicular to a direction of extension of the first and third trenches 10a and 10b (the opening portions of the resist mask may not be necessarily perpendicular to but cross the direction of extension of the first and second trenches 10a and 10b. Description will be continued on the assumption that the opening portions of the resist mask are perpendicular thereto) is formed by photolithography. The resist mask is used for patterning the SiO$_2$ film so that surfaces of the body contact regions 7 are exposed. Thus, a first mask 110p is formed.

The following point is deserving special mention. Because the SiO$_2$ film is embedded in each first trench 10a, the SiO$_2$ film, not SiC, is exposed in portions where the opening portions of the first mask 110p intersect the first trenches 10a as shown in FIG. 62 (however, the body contact regions 7 are not always on the same level with the first mask 110p as shown in FIG. 62 because over-etching is generally performed for patterning the SiO$_2$ film).

Figure 63:
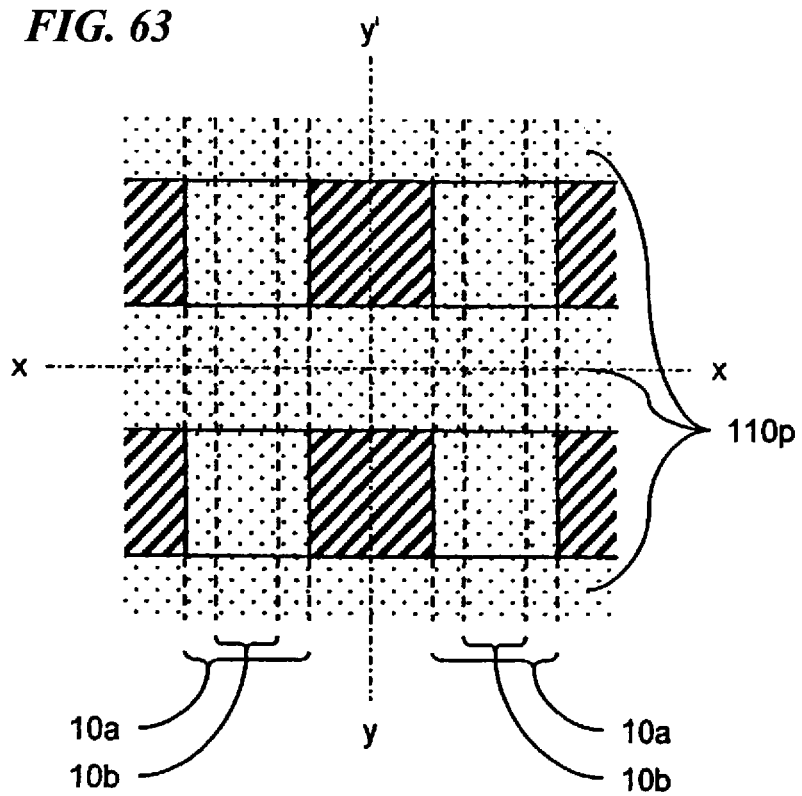
FIG. 63 is a plain view (No. 6) showing a method of producing an intersection portion between a gate trench and an intersection trench in an SiC trench gate type MOSFET according to Embodiment 8 of the invention.
Figure 64:
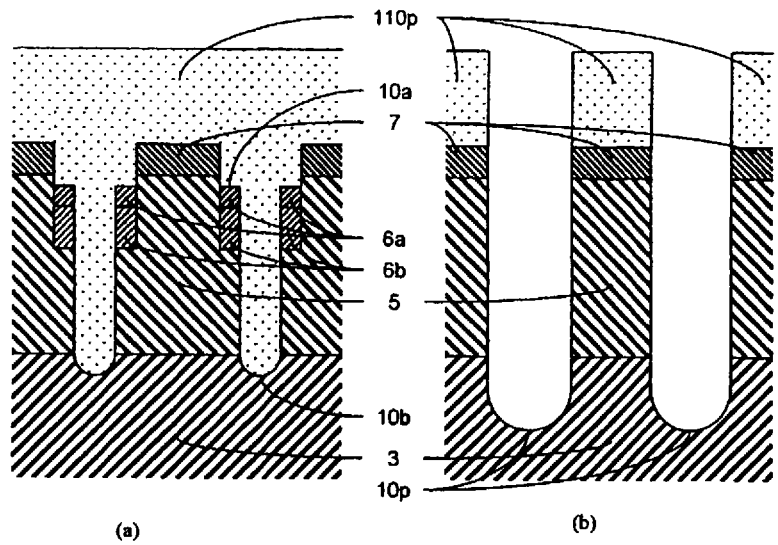
FIGS. 64A and 64B are enlarged sectional views (No. 7) showing a method of producing an intersection portion between a gate trench and an intersection trench in an SiC trench gate type MOSFET according to Embodiment 8 of the invention.

Successively, the SiC surface is etched anisotropically with use of the first mask 110p to form intersection trenches 10p as shown in FIGS. 63, 64A and 64B. FIG. 63 is a plan view of the wafer. FIG. 64A is a sectional view taken along the line x-x in FIG. 63. FIG. 64B is a sectional view taken along the line y-y in FIG. 63. Because the SiO$_2$ film is exposed in portions where the opening portions of the first mask 110p intersect the first trenches 10a, only portions where the body contact regions 7 are exposed are etched but the intersection portions are little etched so that the SiO$_2$ film remains in the intersection portions. In this manner, intersection trenches 10p are formed. Consequently, the intersection trenches 10p are connected to the first trenches 10a. Because each third trench 10b is perfectly in the inside of the corresponding first trench 10a in plan view, the third trenches 10b are physically separated from the intersection trenches 10p.

Figure 65:
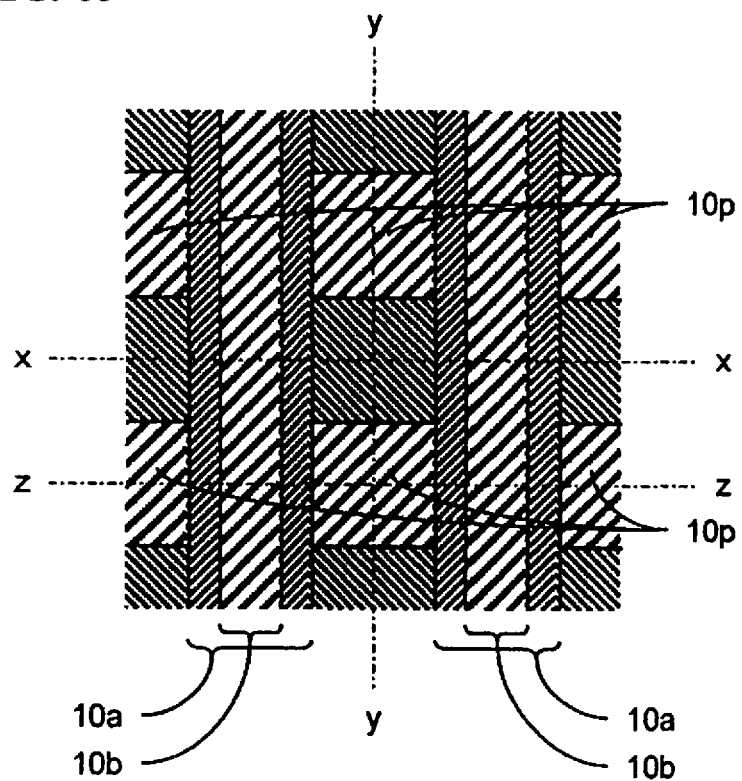
FIG. 65 is a plain view (No. 8) showing a method of producing an intersection portion between a gate trench and an intersection trench in an SiC trench gate type MOSFET according to Embodiment 8 of the invention.
Figure 66:
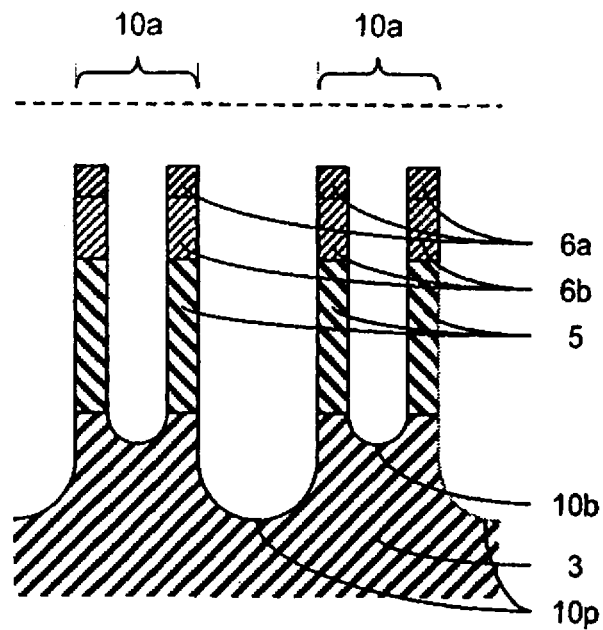
FIG. 66 is an enlarged sectional view (No. 9) showing a method of producing an intersection portion between a gate trench and an intersection trench in an SiC trench gate type MOSFET according to Embodiment 8 of the invention.
Figure 67:
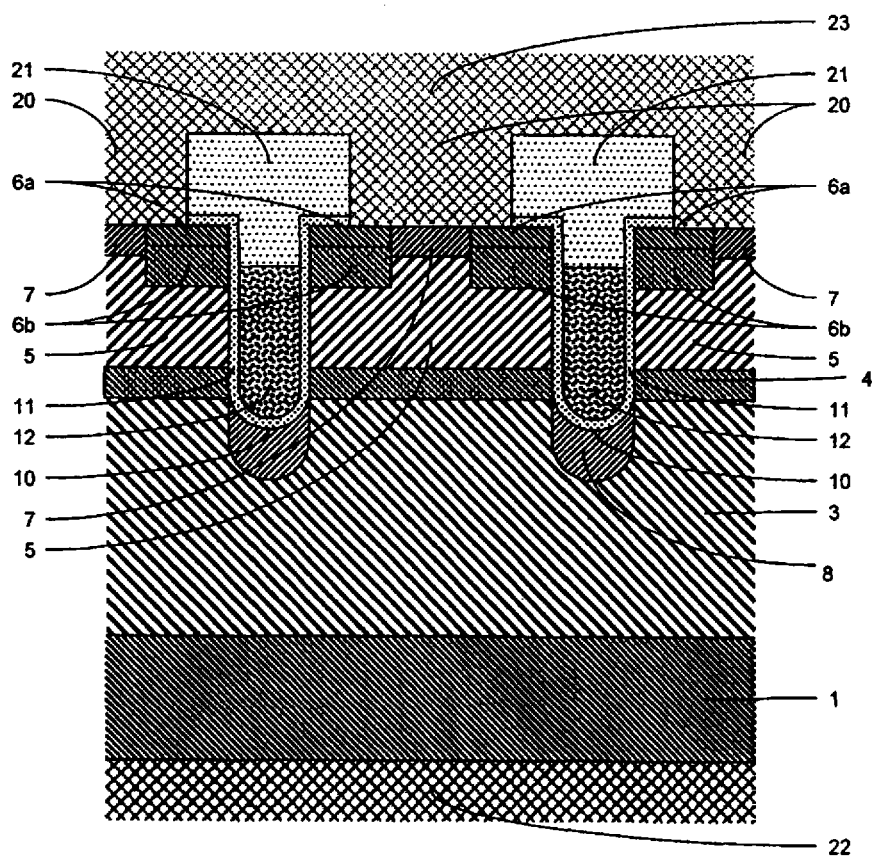
FIG. 67 is a sectional view of important part of a unit cell portion in the case where a p-type embedded region is applied to a structure of the SiC trench gate type MOSFET according to the related art shown in FIG. 37.
Figure 68:
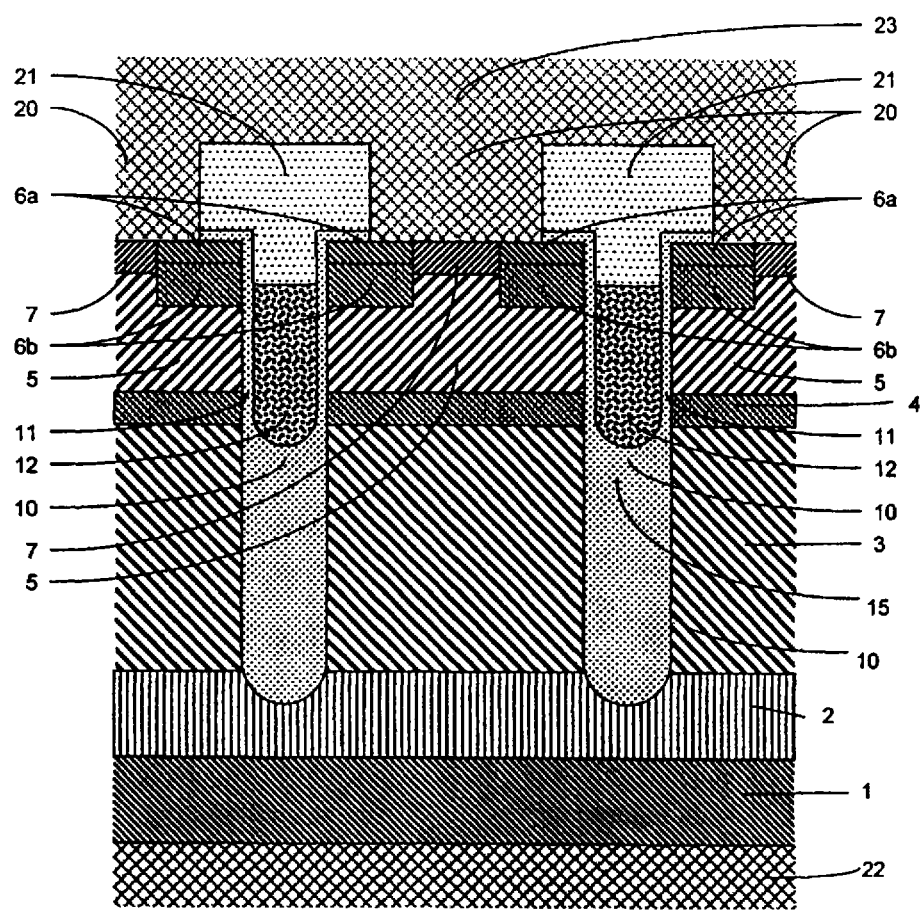
FIG. 68 is a sectional view of important part of a unit cell portion in the case where a trench deep enough to reach a drain side highly doped layer is applied to s structure of the SiC trench gate type MOSFET according to the related art shown in FIG. 37.

Because the presence of the first mask 110p may make it difficult to understand FIG. 63 by institution, a state where the first mask 110p is temporarily removed is shown in FIGS. 65 and 66. FIG. 65 is a plan view of the wafer after removal of the first mask 110p. FIG. 66 is a sectional view taken along the line z-z in FIG. 65. As is obvious from FIGS. 65 and 66, the intersection trenches 10p are formed after formation of the first and third trenches 10a and 10b but the intersection trenches 10p are fragmented by the first and third trenches 10a and 10b and at least physically separated from the third trenches 10b.

As described above, the intersection trenches 10p at least physically separated from the third trenches 10b are formed. Although a new mask is required for forming the intersection trenches 10p, it is unnecessary to align the intersection trenches 10p with the first and third trenches 10a and 10b. In this sense, the intersection trenches 10p are formed while self-aligned with the first and third trenches 10a and 10b.

Incidentally, when the SiO$_2$ film is formed so that the third trenches 10b and the first trenches 10a are embedded with the SiO$_2$ film, voids (unfilled voids included in the embedding substance) may remain in the first trenches 10a and/or the third trenches 10b. However, even when the voids are exposed by etching of the SiO$_2$ film, there is no particular problem if the SiO$_2$ film can function sufficiently as a mask for etching the intersection trenches 10p.

If the width (vertical length in FIG. 65) of each intersection trench 10p is too large, the width of each intersection trench 10p can be reduced in such a manner that an SiO$_2$ film is deposited again after patterning of the first mask 110p and before etching of SiC and etching is performed on the whole surface to form a mask having opening portions narrower than the opening portions of the first mask 110p.

Although FIGS. 60 to 66 show the case where the pitch of center lines of the third trenches 10b and the pitch of the intersection trenches 10p are equal to each other, the two pitches need not be equal and may be designed independently to achieve required performance.

However, to electrically insulate gate electrodes from source electrodes in the condition that the gate electrodes are embedded in the third trenches 10b and Schottky electrodes conductively connected to the source electrodes are embedded in the intersection trenches 10p, further measures are required as described in the following embodiments.

The case where the method of forming the intersection trenches by self-alignment according to the invention is applied to a trench gate type semiconductor device having Schottky contacts will be described below as Embodiment 8. Incidentally, in Embodiment 8, a trench gate type MOSFET is taken as a specific example of the semiconductor device. However, application to another semiconductor device having a trench gate structure such as a trench IGBT is not excluded and those skilled in the art will easily make changes for application to these semiconductor devices.

Embodiment 8 shows an example of application to the trench gate type MOSFET according to Embodiment 4 shown in FIG. 18. A lot of constituent members are the same as in FIG. 18. The same constituent members are referred to by the same numerals for the sake of omission of duplicate description. The intersection trenches 10p intersect the first trenches 10a and the third trenches 10b perpendicularly (but it does not mean to exclude oblique intersection), for example, shown in FIG. 18 and extend laterally in FIG. 18. A section (corresponding to the x-x section of FIG. 65) without any intersection trench 10p is shown in FIG. 50A. FIG. 50A is the same as a left half of FIG. 18.

A section (corresponding to the z-z section of FIG. 65) taken along the center line of an intersection trench 10p in a lateral direction in FIG. 50A is shown in FIG. 50B. Each intersection trench 10p is in contact with first trenches 10a but is perfectly separated from third trenches 10b. The intersection trenches 10p are deeper than the third trenches 10b. A Schottky electrode 24 is embedded in the inside of each intersection trench 10p. The Schottky electrode 24 is in conductive contact with the source electrode 23 in each intersection trench 10p or in each first trench 10a. Incidentally, FIGS. 51A to 57A are sectional views taken along the same line as FIG. 50A, and FIGS. 51B to 57B are sectional views taken along the same line as FIG. 50B.

Although FIG. 50B draws the Schottky electrode 24 as an electrode made of one kind of material, the Schottky electrode 24 is not limited thereto but may be made of a plurality of materials. In the Schottky electrode 24, a portion (Schottky contact portion 24a not shown in FIG. 50B) which forms a Schottky contact with the voltage withstanding layer 3 in the bottom of the intersection trench 10p is preferably made of a material such as platinum or platinum group elements exhibiting a large Schottky barrier height for n-type SiC. The minimum of the Schottky barrier height is decided by the maximum electric field caused by the structure, the maximum temperature used (in this case, the maximum temperature should be selected as an operation guarantee temperature even in an abnormal situation such as short-circuiting) and the allowable leakage current. For example, when the leakage current density of not larger than $10^{-5}$ A/cm$^2$ is required at the maximum electric field of 3 MV/cm and the maximum temperature of 225° C. (even when the maximum temperature is 175° C., almost the same result is obtained) for 4H—SiC, a height of not smaller than about 1.85 eV is required as the Schottky barrier height. In most cases, nickel (Schottky barrier height 1.6-1.9 eV) heretofore often used is slightly short of the Schottky barrier height. Moreover, when heat treatment is performed while a metal such as nickel is brought into direct contact with SiC, silicide is produced so that the Schottky barrier height is often smaller than that of the original metal. It is therefore preferable that, for example, platinum (Schottky barrier height 1.9-2.1 eV) is used. In the case of platinum, the Schottky barrier height is little reduced even when silicide is produced.

Obviously, metal materials exhibiting preferred Schottky barrier heights for SiC are limited. Use of a (000-1) C-face rather than a (0001) Si-face as a principal surface is effective in increasing the Schottky barrier height even if only slightly. However, in the existing situation, an off-angle of 4-8 degrees is required for obtaining a good epitaxially grown layer on these faces. Therefore, substrates having such an off-angle are available on the market. In this sense, the (000-1) C-face is generally used.

Incidentally, when, for example, 3 MV/cm is selected as the maximum electric field as described above, the withstand voltage is not reduced remarkably by use of a Schottky barrier compared with use of only a pn junction because the maximum electric field is higher than the dielectric breakdown electric field of 4H—SiC.

When the Schottky electrode 24 is provided as described above, a Schottky diode having a lower on-voltage than that of a pn diode formed from the voltage withstanding layer 3 and the body region 5 is produced. Accordingly, there is obtained an effect in suppressing increase of loss caused by reverse recovery in an unnecessary on-state of the pn junction at switching of inductive load or in reducing loss at regenerative braking. However, the Schottky diode thus produced is substantially high in on-voltage and large in loss because a metal having a high Schottky barrier is used. Therefore, the Schottky diode thus produced may be connected in parallel with a Schottky diode having a low on-voltage to obtain the aforementioned effect in reducing loss at regenerative braking.

Besides the Schottky contact portion 24a, a portion being in contact with the voltage withstanding layer 3 needs to form a low-leakage Schottky contact more or less. The Schottky barrier height of the portion need not be as high as that of the Schottky contact portion 24a because the portion receives a benefit of relaxation of the electric field from the Schottky contact portion 24a in the same manner as in the bottom of each third trench 10b. Although the Schottky barrier height of the portion varies according to the design, for example, a Schottky barrier height of about 1.2 eV (e.g. achieved by heat-treated titanium) is sufficient. A portion being in contact with the body region 5 need not be provided as a low-leakage Schottky contact. Incidentally, in Embodiment 8, Schottky contacts are provided both for the voltage withstanding layer 3 and for the body region 5 because the side wall surface of each intersection trench 10p except the vicinity of its upper end is covered with platinum silicide.

The doping concentration and thickness of the voltage withstanding layer 3 have to be decided by characteristics such as a desired withstand voltage. When, for example, the withstand voltage is 1.2 kV, the doping concentration and thickness of the voltage withstanding layer 3 are $1 \times 10^{16}$ cm$^{-3}$ and 15 μm respectively in consideration of production error. The actual withstand voltage is substantially decided by the distance from the interface between the substrate 1 and the voltage withstanding layer 3 to the bottom of each intersection trench 10p. The distance is 12 μm.

The width of each intersection trench 10p and the pitch of the intersection trenches 10p need to be decided appropriately by the Schottky barrier height of the Schottky electrode 24 and the doping concentration of the voltage withstanding layer 3. The width is, for example, 1 μm and the pitch (the distance between center lines of adjacent ones of the intersection trenches 10p) is, for example, 4 μm. Incidentally, when the margin for etching back the gate electrode 12 and the interlayer insulating film 21 is short, a trench having three or more stages may be used like Embodiment 5 shown in FIG. 25.

The method of producing the trench gate type MOSFET according to Embodiment 8 shown in FIGS. 50A and 50B as described above will be described in due order. Description of portions the same as those in the method of producing the trench gate type MOSFET according to Embodiment 4 shown in FIG. 18 will be omitted or made in brief. First, for example, a voltage withstanding layer 3, a body layer and a body contact layer are formed successively on the whole area of one principal surface (referred to as front surface) of a substrate 1 of 4H—SiC by epitaxial growth. Then, etching, ion implantation, activation annealing, etc. are performed to form body regions 5, body contact regions 7, first trenches 10a, source contact regions 6a, source contact regions 6b and third trenches 10b. If heat treatment e.g. in a hydrogen atmosphere at a high temperature is required for improving the inner surface shape of each third trench 10b, the heat treatment is performed.

Then, a first mask material, for example, of an SiO$_2$ film is deposited as a film, for example, by plasma CVD (which may be replaced by thermal CVD or the like. The same rule will apply hereinafter unless there is special mention). If the thickness of the first mask material is sufficient, the third trenches 10b and the first trenches 10a are embedded with the first mask material. When, for example, the width of each first trench 10a is 1 μm, the first trenches 10a can be embedded easily with the first mask material if the first mask material, for example, with a thickness of 1 μm or more is deposited. In such a method, voids (not shown) often remain in each trench but there is no particular problem if the voids more or less remaining do not interfere with the following processes. Successively, the first mask material is patterned to form a first mask 110p having predetermined opening portions which extend in a direction perpendicular to the first trenches 10a.

FIGS. 51A and 51B are sectional structure showing important part of the wafer in this state. It should be noted that the SiO$_2$ film, not SiC, is exposed in portions which intersect the first trenches 10a in plan view in the opening portions of the first mask 110p. Even when voids remain in each trench as described above, there is no influence on the post processes if the SiO$_2$ film thicker than the outside of each first trench 10a is present in the inside of each first trench 10a.

Then, SiC is etched anisotropically with use of the first mask 110p as a mask in the same manner as in the first trenches 10a and the third trenches 10b to thereby form intersection trenches 10p. On this occasion, because the portions intersecting the first trenches 10a are filled with the SiO$_2$ film, SiC on the portions is hardly etched and, accordingly, the shape of each third trench 10b and the shape of each first trench 10a (if a secondary effect such as side etching is ignored) are unchanged. In addition, because each third trench 10b is perfectly included in the corresponding first trench 10a in plan view, the third trenches 10b are physically separated from the intersection trenches 10p. FIGS. 52A and 52B are a sectional structure showing important part of the wafer in this state.

Successively, while the first mask 110p is left, a material such as silicon nitride to make it possible to selectively etch or leave the first mask 110p and to selectively remove the interlayer insulating film 21 is deposited on the whole surface of the wafer and etched back appropriately to thereby embed an intersection trench protective substance 111p in the inside of each intersection trench 10p. Although the upper end position of the intersection trench protective substance 111p need not be decided strictly, differently from the positions of the gate electrode 12 and the interlayer insulating film 21, for example, it is safe that the upper end position of the intersection trench protective substance 111p is aligned with the vicinity of the bottom of the first trench 10a. Incidentally, voids are allowed to remain more or less in the intersection trench protective substance 111p like the first mask 110p.

Then, the intersection trench protective substance 111p is used as a mask to selectively remove the first mask 110p. Although dry etching may be used on this occasion, it is necessary to pay attention to the possibility that dry etching will have a bad influence on the side wall surface of each third trench 10b to form an MOS channel when dry etching is used. At least in the process in which contact with the side wall surface of each third trench 10b occurs, it is safe that treatment such as soaking in dilute hydrofluoric acid is used.

Then, a gate insulating film 11 is formed and a gate electrode 12 and an interlayer insulating film 21 are embedded in each third trench 10b. When the intersection trench protective substance 111p is silicon nitride, the intersection trench protective substance 111p can endure heat treatment at a high temperature, for example, of 1300° C. for forming the gate insulating film 11. FIGS. 53A and 53B are a section structure showing important part of the wafer in this state.

Then, the intersection trench protective substance 111p is removed. Although the intersection trench protective substance 111p can be soaked in hot phosphoric acid when the intersection trench protective substance 111p is silicon nitride, the intersection trench protective substance 111p may be dry-etched with fluoro-chloro mixed plasma or the like. When dry etching is performed, it is safe that cleaning is performed with oxygen plasma or the like because unnecessary deposits may be produced.

Successively, a film of platinum (it does not mean to exclude another metal) is formed on the whole surface of the wafer and etched back, for example, with chloro plasma to embed platinum in each intersection trench 10p. On this occasion, it is safe that the top position where platinum remains (not shown) is located below the bottom of each first trench 10a. Then, heat treatment (at 830° C. or lower in the case of platinum) is performed to make platinum react with the side wall surface of each intersection trench 10p to thereby form silicide (PtSi) of platinum and silicon in the interface. Then, the wafer is soaked in hot aqua regia so that all untreated platinum is removed while silicide is left. In the case of platinum, it is safe that this process is used because a eutectic mixture reducing a melting point to about 830° C. is present between Pt and PtSi.

Then, for example, a film of tungsten (it does not mean to exclude another metal) is formed on the whole surface of the wafer and etched back appropriately to embed tungsten again as a barrier metal in each empty intersection trench 10p. Because platinum and nickel form a complete solid solution, the barrier metal is required so that nickel laminated in a post process is not in direct contact with platinum. Although the barrier metal does not form a Schottky electrode in combination with SiC, metals (including the barrier metal) embedded in each intersection trench 10p are generically named "Schottky electrode 24" in FIG. 50B.

Then, for example, nickel and titanium are deposited on the front surface of the wafer and patterned to form a first main electrode and an upper metal film on the Schottky electrodes. Then, deposits on the rear surface are removed and, for example, nickel and titanium are deposited as a second main electrode on the whole area of the rear surface. In a MOSFET, the first main electrode serves as a source electrode and the second electrode serves as a drain electrode. Then, heat treatment is performed to obtain ohmic contacts with the front surfaces of the source contact regions 6a, the front surfaces of the body contact regions 7 and the rear surface of the semiconductor substrate 1. Although it is preferable that the temperature for the heat treatment is set at 970° C. or lower because a eutectic mixture reducing a melting point to about 970° C. is present between PtSi and Si, the temperature for the heat treatment is set, for example, at 950° C. because it is necessary to increase the temperature for the heat treatment to some degree in order to obtain good ohmic contacts.

Then, contact holes to be connected to gate pads not shown are provided in the interlayer insulating films 21 respectively. For example, aluminum is deposited on the front surface and patterned to thereby lead out the source electrode and the gate electrode to the upper portion of the device.

In the aforementioned manner, the trench gate type MOSFET shown in FIGS. 50A and 50B is finished. The produced device achieved a design withstand voltage of 1.2 kV without dielectric breakdown of the gate and without remarkable increase of the leakage current in the Schottky contact portion.

As described above, in accordance with this invention, trenches embedded with gate electrodes and trenches embedded with Schottky electrodes can be formed so as to be separated while self-aligned. Moreover, the pitch of the trenches embedded with the gate electrodes and the pitch of the trenches embedded with the Schottky electrodes can be controlled independently. Accordingly, remarkable increase of on-state-resistance is suppressed, so that an excessive electric field can be prevented from being applied to the bottom of each trench embedded with the gate electrode.

Embodiment 9

In the producing method according to Embodiment 8, it is necessary to etch back a platinum group element such as platinum, etc. and a barrier metal individually as the Schottky electrode 24, and it is necessary to deposit the expensive platinum group element relatively thick so that the expensive platinum group element can be embedded in each intersection trench 10p. Therefore, a producing method for avoiding the necessity of depositing electrode metals of the Schottky electrode 24 thick will be described as Embodiment 9.

FIGS. 54A and 54B show a sectional structure of important part of the wafer according to Embodiment 9. FIGS. 54A and 54B are roughly the same as FIGS. 50A and 50B for Embodiment 8. Although Embodiment 9 is different from Embodiment 8 in the detailed structure of the Schottky electrode 24 caused by the difference in the method of producing the Schottky electrode 24, the difference is not obvious because the detailed structure of the Schottky electrode 24 is neither shown in FIGS. 54A and 54B for Embodiment 9 nor shown in FIGS. 50A and 50B for Embodiment 8.

The producing method according to Embodiment 9 will be described below in due order. First, the process up to formation of third trenches 10b and execution of heat treatment e.g.

in a hydrogen atmosphere at a high temperature for improvement in the inner surface shape of each third trench 10b in accordance with necessity is performed in the same manner as in Embodiment 8. Then, a gate insulating film 11 is formed and a gate electrode 12 and an interlayer insulating film 21 are embedded in each third trench 10b. Successively, an etch stop film 110q made of a material such as silicon nitride capable of selectively removing and leaving both the interlayer insulating film 21 and a first mask 110p which will be formed in a post process is formed on the whole area of the front surface.

Then, a first mask material, for example, of an $SiO_2$ film is formed and patterned to form a first mask 110p in the same manner as in Embodiment 8. The etch stop film 110q exposed in each of the opening portions of the first mask 110p is removed with use of the first mask 110p as a mask. FIGS. 55A and 55B show a sectional structure of important part of the wafer in this state (part of the etch stop film 110p formed on the side wall surface of each first trench 10a is omitted). FIGS. 55A and 55B are the same as FIGS. 51A and 51B for Embodiment 8 except that the etch stop film 110q is formed under the first mask 110p and the gate insulating film 11, the gate electrode 12 and the interlayer insulating film 21 are embedded in each third trench 10b.

Then, SiC is etched anisotropically with use of the first mask 110p as a mask to form intersection trenches 10p in the same manner as in Embodiment 8. FIGS. 56A and 56B show a sectional structure of important part of the wafer in this state. FIGS. 56A and 56B are the same as FIGS. 52A and 52B for Embodiment 8 except that the etch stop film 110q is formed under the first mask 110p and the gate insulating film 11, the gate electrode 12 and the interlayer insulating film 21 are embedded in each third trench 10b.

Successively, for example, platinum and titanium are continuously deposited by sputtering. Because it is necessary to form a sufficiently thick platinum film on at least a side wall of each intersection trench 10p where the voltage withstanding layer 3 is exposed, the platinum film is formed thicker on the bottom of each intersection trench 10p. The thickness of the platinum film on the side wall is, for example, about 20-100 nm. Although a titanium film is formed so that the ratio of the number of titanium atoms to the number of platinum atoms is substantially 1:1, a design ratio is selected so that the number of titanium atoms is not smaller than the number of platinum atoms if production error cannot be avoided.

Then, heat treatment (at 830° C. or lower when platinum is used) is performed to produce mainly PtSi and TiC by alloying SiC and platinum/titanium. Therefore, unreacted titanium remaining on the first mask 110p and the side surface of each intersection trench 10p is removed with an ammonia-hydrogen peroxide mixture solution, and unreacted platinum is removed with hot aqua regia. Although reaction products of titanium may be dissolved according to the treating condition and the composition (the composition of reaction products of titanium) when unreacted platinum is treated with hot aqua regia, there is no particular problem. Incidentally, titanium may be replaced by another metal (e.g. group 4-6 metal such as tungsten in a periodical table) capable of producing carbide easily.

Then, tungsten (it does not mean to exclude another metal) is deposited on the whole surface of the wafer and etched back appropriately to thereby embed tungsten in each intersection trench 10p. If platinum (or another platinum group element) comes into contact with nickel which will be deposited in a post process, there is a risk that platinum and nickel will be mixed to reduce the Schottky barrier height. It is therefore safe that at least platinum (or reaction product of SiC and platinum) as well as tungsten is etched back to some degree, for example, to a lower position than the bottom of each first trench 10a when tungsten is etched back (it does not mean to exclude separate etching back).

Then, an intersection trench protective substrate 111p made of a material such as silicon nitride capable of selectively removing and leaving the first mask 110p is embedded in an upper portion of each intersection trench 10p (the intersection trench protective substrate 111p may protrude above the bottom of each first trench 10a). FIGS. 57A and 57B show a sectional structure of important part of the wafer in this state.

Successively, the first mask 110p is removed. The first mask 110p may be soaked in dilute hydrofluoric acid or may be dry-etched. Then, while the intersection trench protective substance 111p is left, the etch stop film 110q is removed. Even when the etch stop film 110q and the intersection trench protective substance 111p are made of the same material, there is no problem if both platinum and tungsten are etched back so that the intersection trench protective substance 111p is sufficiently thicker than the etch stop film 110q.

Then, for example, nickel and titanium are deposited on the front and rear surfaces of the wafer and heat-treated to thereby obtain ohmic contacts with the source contact regions 6a, the body contact regions 7 and the substrate 1 in the same manner as in Embodiment 8. Then, unreacted titanium and nickel are removed. For example, titanium can be removed with an ammonia-hydrogen peroxide mixture solution, and nickel can be removed with a phosphoric acid-nitric acid-acetic acid mixture solution or a sulfuric acid-hydrogen peroxide mixture solution. Although part of the intersection trench protective substance 111p may be dissolved when phosphoric acid is used for removing nickel in the case where the intersection trench protective substance 111p is silicon nitride, there is no problem. After the intersection trench protective substance 111p is removed, contact holes to be connected to gate pads not shown are provided in the interlayer insulating films 21 respectively and, for example, aluminum is deposited on the front surface and patterned to thereby lead out the source electrodes and the gate electrodes to the upper portion of the device.

In the aforementioned manner, the trench gate type MOSFET shown in FIGS. 54A and 54B is finished. The produced device achieved a design withstand voltage of 1.2 kV without dielectric breakdown of the gate and without remarkable increase of the leakage current in the Schottky contact portion.

As described above, in accordance with Embodiment 9, there is an advantage that the expensive platinum group element need not be deposited as thick as in Embodiment 8, in addition to the advantage of Embodiment 8.

Embodiment 10

Because an electric field is applied to a Schottky electrode 24 which is formed on the bottom and side wall surface of each intersection trench 10p, there may occur a reliability problem that a leakage current flows due to concentration of the electric field when there is a slight roughness in the Schottky electrode 24. Embodiment 10 provides measures against such a case.

The sectional structure of important part of the wafer according to Embodiment 10 is the same as in Embodiment 8 shown in FIGS. 50A and 50B. To apply the producing method according to Embodiment 10, it is however necessary that the width of each intersection trench 10p is sufficiently larger than the width of each third trench 10b.

The producing method according to Embodiment 10 will be described below in due order. First, the process up to formation of third trenches 10b and intersection trenches 10p is the same as in Embodiment 8. The sectional structure of important part of the wafer in this state is the same as in Embodiment 8 shown in FIGS. 52A and 52B.

Then, the first mask 110p is removed. When heat treatment is then performed in a hydrogen atmosphere at a high temperature to improve the inner surface shape of each gate trench (third trench) 10b, the inner surfaces of both the third trench 10b and the intersection trench 10p are smoothened.

After a screen oxide film with a thickness of about 100 nm is then formed (as a thermal oxide film or as a deposited film), polysilicon doped with a high concentration of phosphorus (which may further contain boron) is deposited so that each third trench 10b is filled with the polysilicon. Incidentally, the thickness of the deposited polysilicon is decided so that the first trench 10a and the intersection trench 10p are not fully filled with the polysilicon. If possible, a deposition condition is selected so that the grain size of polysilicon increases in reverse to that of general gate polysilicon (generally, the temperature is set at a low temperature). When isotropic etching back is then performed, polysilicon in the first trench 10a and the intersection trench 10p is entirely etched but polysilicon remains substantially in a lower half of the third trench 10b. When the grain size of polysilicon is large, the vicinity of the center line is excessively etched so that a linear cavity is formed.

Thereafter, when polysilicon is thermally oxidized at about 1000° C., the polysilicon is changed to PSG (Phospho Silicate Glass) or BPSG (Boro Phospho Silicate Glass) so that volume increases while PSG or BPSG reflows. Thus, each third trench 10b is filled with PSG or BPSG. Incidentally, all polysilicon need not be oxidized. There is no problem if the embedding substance can remain in each third trench 10b when the intersection trench protective substance 111p will be embedded in each intersection trench in a post process. If the linear cavity is present as described above, the oxidizing time is shortened. On the other hand, thermal oxidation of SiC little advances because of the presence of the screen oxide film.

Wet etching is performed so slightly that the screen oxide film in the intersection trench 10p (and PSG overflowing from the third trench 10b) can be removed. Then, for example, a film of silicon nitride is formed on the whole surface and etched back to thereby embed the intersection trench protective substance 111p in each intersection trench 10p. On this occasion, PSG (and polysilicon not oxidized) are still embedded in each third trench 10b.

Successively, PSG (and polysilicon not oxidized) remaining in each third trench 10b are removed. Then, a gate insulating film 11 is formed and a gate electrode 12 and an interlayer insulating film 21 are embedded in each third trench 10b in the same manner as in Embodiment 8. The sectional structure of important part of the wafer in this state is the same as in Embodiment 8 shown in FIGS. 53A and 53B. Processes after this state are the same as in Embodiment 8.

The produced trench gate type MOSFET achieved a design withstand voltage of 1.2 kV without dielectric breakdown of the gate and without remarkable increase of the leakage current in the Schottky contact portion. Occurrence of withstand voltage failure due to the leakage was reduced compared with Embodiment 8.

As described above, in accordance with Embodiment 10, there is an advantage that the inner surface shape of each intersection trench 10p can be improved by high-temperature heat treatment applied to the intersection trench 10p to thereby improve reliability of the Schottky electrode 24, in addition to the advantage of Embodiment 8.

The invention has been described with reference to certain preferred embodiments thereof. It will be understood that the modifications and variations may be made to the disclosed embodiments and still fall within the scope of the appended claims.

This application is based on and claims priority to Japanese Patent Applications JP 2008-051521 filed on Mar. 3, 2008 and JP 2008-127907 filed on May 15, 2008. The disclosure of the priority applications in their entirety, including the drawings, claims, and the specification thereof, is incorporated herein by reference.

What is claimed is:

1. A method of producing a trench gate type semiconductor device, comprising the steps of:
   (I) laminating a voltage withstanding layer of a wide band gap semiconductor of a first conductivity type, a body layer of a wide band gap semiconductor of a second conductivity type and a body contact layer of a wide band gap semiconductor of the second conductivity type having a surface with an impurity concentration sufficient to provide ohmic contact successively on a wide band gap semiconductor substrate with an impurity by epitaxially growing the voltage withstanding layer, the body layer and the body contact layer respectively on the whole area of a surface of the semiconductor substrate;
   (II) forming a first mask having first opening portions on a surface of the body contact layer;
   (IIIa) performing anisotropic etching from the first opening portions to form first trenches each of which passes through the body contact layer and has a bottom in the body layer;
   (IIIb) performing ion implantation in the respective bottoms of first trenches or epitaxial growth on the respective bottoms of the first trenches to form source ion-implanted regions of the first conductivity type in a position at least deeper than the body contact layer;
   (IV) depositing a second mask having a thickness less than one half as large as the width of each first trench, on the whole area of the surface of the semiconductor substrate after the step (IIIb) and performing anisotropic etching to provide second opening portions in the second mask on the respective bottoms of the first trenches;
   (V) performing anisotropic etching from the second opening portions to form second trenches each of which reaches the voltage withstanding layer; and
   (VI) forming an insulating film on an inner wall surface of each second trench and embedding a gate electrode in the second trench so as to be located opposite to the corresponding source ion-implanted region, the body layer and the voltage withstanding layer respectively through the insulating film.

2. A method of producing a trench gate type semiconductor device according to claim 1, additionally comprising, after step IIIb and before step IV, the steps of:
   performing anisotropic etching from the second opening portions to form third trenches each of which has a bottom in the corresponding source ion-implanted region;
   performing ion implantation in the respective bottoms of the third trenches or epitaxial growth on the respective bottoms of the third trenches to form source elongation ion-implanted regions at least deeper than the source ion-implanted regions; and
   depositing a third mask having a thickness less than one half as large as the width of each third trench, on the whole area of the surface of the semiconductor substrate after the step (IVc) and performing anisotropic etching to provide third opening portions in the third mask on the respective bottoms of the third trenches; and wherein the gate electrode is embedded in the second trench so as to be located opposite to the corresponding source elongation ion-implanted region, the body layer and the voltage withstanding layer respectively through the insulating film.

3. A method of producing a trench gate type semiconductor device, comprising the steps of:
(I) laminating a voltage withstanding layer of a wide band gap semiconductor of a first conductivity type, a body layer of a wide band gap semiconductor of a second conductivity type and a body contact layer of a wide band gap semiconductor of the second conductivity type having a surface with an impurity concentration sufficient to provide ohmic contact successively on a wide band gap semiconductor substrate with an impurity by epitaxially growing the voltage withstanding layer, the body layer and the body contact layer respectively on the whole area of a surface of the semiconductor substrate;
(II) forming a first mask having first opening portions on a surface of the body contact layer;
(IIIa) performing anisotropic etching from the first opening portions to form first trenches each of which passes through the body contact layer and has a bottom in the body layer;
(IIIb) performing ion implantation in the respective bottoms of the first trenches or epitaxial growth on the respective bottoms of the first trenches to form source contact ion-implanted regions of the first conductivity type on a surface side having a high impurity concentration surface capable of obtaining ohmic contact and source extension ion-implanted regions of the first conductivity type on a lower layer side so as to be located at least deeper than the body contact layer;
(IV) depositing a second mask having a thickness less than one half as large as the width of each first trench, on the whole area of the surface of the semiconductor substrate after the step (IIIb) and performing anisotropic etching to provide second opening portions in the second mask on the respective bottoms of the first trenches;
(V) performing anisotropic etching from the second opening portions to form second trenches each of which reaches the voltage withstanding layer; and
(VI) forming an insulating film on an inner wall surface of each second trench and embedding a gate electrode in the second trench so as to be located opposite to the corresponding source extension ion-implanted region, the corresponding body region and the voltage withstanding layer respectively through the insulating film.

4. A method of producing a trench gate type semiconductor device, comprising the steps of:
(I) laminating a voltage withstanding layer of a wide band gap semiconductor of a first conductivity type, a body layer of a wide band gap semiconductor of a second conductivity type and a body contact layer of a wide band gap semiconductor of the second conductivity type having with an impurity concentration sufficient to provide ohmic contact successively on a wide band gap semiconductor substrate with an impurity by epitaxially growing the voltage withstanding layer, the body layer and the body contact layer respectively on the whole area of a surface of the semiconductor substrate;
(II) forming a first mask having first opening portions on a surface of the body contact layer;
(IIIa) performing anisotropic etching from the first opening portions to form first trenches each of which passes through the body contact layer and has a bottom in the body layer;
(IIIb) performing ion implantation in the respective bottoms of the first trenches or epitaxial growth on the respective bottoms of the first trenches to form source contact ion-implanted regions of the first conductivity type on a surface side having a high impurity concentration surface capable of obtaining ohmic contact and source extension ion-implanted regions of the first conductivity type on a lower layer side so as to be located at least deeper than the body contact layer;
(IIIc) performing anisotropic etching from the second opening portions to form third trenches each of which has a bottom in the corresponding source ion-implanted region;
(IIId) performing ion implantation in the respective bottoms of the third trenches or epitaxial growth on the respective bottoms of the third trenches to form source elongation ion-implanted regions at least deeper than the source ion-implanted regions;
(IIIe) depositing a third mask having a thickness less than one half as large as the width of each third trench, on the whole area of the surface of the semiconductor substrate after the step (IVc) and performing anisotropic etching to provide third opening portions in the third mask on the respective bottoms of the third trenches, wherein the gate electrode is embedded in the second trench so as to be located opposite to the corresponding source elongation ion-implanted region, the body layer and the voltage withstanding layer respectively through the insulating film;
(IVa) depositing a second mask having a thickness smaller than one second as large as the width of each first trench, on the whole area of the surface of the semiconductor substrate after the step (IIIb) and performing anisotropic etching to provide second opening portions in the second mask on the respective bottoms of the first trenches;
(IVb) performing anisotropic etching from the second opening portions to form third trenches each of which has a bottom in the corresponding source ion-implanted region;
(IVc) performing ion implantation in the respective bottoms of the third trenches or epitaxial growth on the respective bottoms of the third trenches to form source elongation ion-implanted regions of the first conductivity type which are at least in contact with the source extension ion-implanted regions respectively;
(IVd) depositing a third mask having a thickness smaller than one second as large as the width of each third trench, on the whole area of the surface of the semiconductor substrate after the step (IVc) and performing anisotropic etching to provide third opening portions in the third mask on the respective bottoms of the third trenches;
(V) performing anisotropic etching from the second opening portions to form second trenches each of which reaches the voltage withstanding layer; and
(VI) forming an insulating film on an inner wall surface of each second trench and embedding a gate electrode in the second trench so as to be located opposite to the corresponding source ion-implanted region, the body layer and the voltage withstanding layer respectively through the insulating film.

5. A method of producing a trench gate type semiconductor device according to claim 1, wherein a step (Va) of performing heat treatment where ions implanted in the source contact regions cannot be activated perfectly but the source contact regions can be prevented from being degenerated by the following steps is inserted between the steps (V) and (VI).

6. A method of producing a trench gate type semiconductor device according to claim 2, wherein a step (Va) of performing heat treatment where ions implanted in the source extension ion-implanted regions cannot be activated perfectly but the source extension ion-implanted regions can be prevented from being degenerated by the following steps is inserted between the steps (V) and (VI).

7. A method of producing a trench gate type semiconductor device according to claim 5, wherein:
each of the first to third masks contains silicon dioxide as a main component; and
the temperature for heat treatment in the step (Va) is not higher than 1350° C.

8. A method of producing a trench gate type semiconductor device according to claim 5, wherein:
the semiconductor substrate contains hexagonal silicon carbide as a main semiconductor material; and
the temperature for heat treatment in the step (Va) is not lower than 1250° C.

9. A method of producing a trench gate type semiconductor device according to claim 5, wherein a step of forming a selectively releasable cap material containing carbon or silicon nitride at least on any one of the semiconductor substrate, the first mask and the third mask is provided before the heat treatment in the step (Va).

10. A method of producing a trench gate type semiconductor device according to claim 9, wherein the semiconductor substrate contains silicon carbide as a main semiconductor material.

11. A method of producing a trench gate type semiconductor device according to claim 3, wherein a step (Va) of performing heat treatment where ions implanted in the source contact regions cannot be activated perfectly but the source contact regions can be prevented from being degenerated by the following steps is inserted between the steps (V) and (VI).

12. A method of producing a trench gate type semiconductor device according to claim 4, wherein a step (Va) of performing heat treatment where ions implanted in the source extension ion-implanted regions cannot be activated perfectly but the source extension ion-implanted regions can be prevented from being degenerated by the following steps is inserted between the steps (V) and (VI).

13. A method of producing a trench gate type semiconductor device according to claim 11, wherein:
each of the first to third masks contains silicon dioxide as a main component; and
the temperature for heat treatment in the step (Va) is not higher than 1350° C.

14. A method of producing a trench gate type semiconductor device according to claim 11, wherein:
the semiconductor substrate contains hexagonal silicon carbide as a main semiconductor material; and
the temperature for heat treatment in the step (Va) is not lower than 1250° C.

15. A method of producing a trench gate type semiconductor device according to claim 11, wherein a step of forming a selectively releasable cap material containing carbon or silicon nitride at least on any one of the semiconductor substrate, the first mask and the third mask is provided before the heat treatment in the step (Va).

16. A method of producing a trench gate type semiconductor device according to claim 1, wherein the semiconductor substrate contains silicon carbide as a main semiconductor material.

17. A method of producing a trench gate type semiconductor device according to claim 1, wherein step (IV) comprises depositing a single second mask layer on the whole area of the surface of the semiconductor substrate after the step (III) and performing anisotropic etching as a next step to provide second opening portions in the second mask on the respective bottoms of the first opening portions.

* * * * *